United States Patent
Kamikawa et al.

(10) Patent No.: US 11,316,061 B2
(45) Date of Patent: Apr. 26, 2022

(54) PHOTOVOLTAIC DEVICES, PHOTOVOLTAIC MODULES PROVIDED THEREWITH, AND SOLAR POWER GENERATION SYSTEMS

(71) Applicant: SHARP KABUSHIKI KAISHA, Sakai (JP)

(72) Inventors: Takeshi Kamikawa, Sakai (JP); Masatomi Harada, Sakai (JP); Toshihiko Sakai, Sakai (JP); Tokuaki Kuniyoshi, Sakai (JP); Liumin Zou, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/071,647

(22) Filed: Oct. 15, 2020

(65) Prior Publication Data

US 2021/0050467 A1 Feb. 18, 2021

Related U.S. Application Data

(63) Continuation of application No. 15/522,117, filed as application No. PCT/JP2015/080030 on Oct. 23, 2015, now abandoned.

(51) Int. Cl.
*H01L 31/0224* (2006.01)
*H01L 31/0376* (2006.01)
(Continued)

(52) U.S. Cl.
CPC .... *H01L 31/0747* (2013.01); *H01L 31/02167* (2013.01); *H01L 31/022425* (2013.01);
(Continued)

(58) Field of Classification Search
CPC ..... H01L 31/022425; H01L 31/022433; H01L 31/022441
See application file for complete search history.

(56) References Cited

U.S. PATENT DOCUMENTS

| 5,320,684 A | 6/1994 | Amick et al. |
| 2004/0187916 A1 | 9/2004 | Hezel |

(Continued)

FOREIGN PATENT DOCUMENTS

| JP | S62-274677 A | 11/1987 |
| JP | H07-501184 A | 2/1995 |

(Continued)

OTHER PUBLICATIONS

Definition of "reduction" retrieved from https://www.merriam-webster.com/dictionary/reduction on Jun. 30, 2021.*

(Continued)

*Primary Examiner* — Christina Chern
(74) *Attorney, Agent, or Firm* — ScienBiziP, P.C.

(57) ABSTRACT n-type amorphous semiconductor layers (4) and p-type amorphous semiconductor layers (5) are alternately disposed on the back surface of a semiconductor substrate (1) so as to be separated from each other at a desired interval paralleled with the direction of the surface of the semiconductor substrate (1). An electrode (6) is disposed on the n-type amorphous semiconductor layer (4), and an electrode (7) is disposed on the p-type amorphous semiconductor layer (5). A protective film (8) includes an insulating film, and is disposed on a passivation film (3), the n-type amorphous semiconductor layer (4), the p-type amorphous semiconductor layer (5), and the electrodes (6, 7), so as to be in contact with the passivation film (3), the n-type amorphous semiconductor layer (4), the p-type amorphous semiconductor layer (5), and the electrodes (6, 7).

6 Claims, 34 Drawing Sheets

(51) Int. Cl.
  *H01L 31/0747*   (2012.01)
  *H01L 31/0216*   (2014.01)
  *H02S 40/34*    (2014.01)
  *H02S 40/38*    (2014.01)
  *H01L 31/048*   (2014.01)
  *H02S 50/00*    (2014.01)

(52) U.S. Cl.
  CPC ............... *H01L 31/022441* (2013.01); *H01L 31/03762* (2013.01); *H01L 31/048* (2013.01); *H02S 40/34* (2014.12); *H02S 40/38* (2014.12); *H02S 50/00* (2013.01); *Y02E 10/50* (2013.01)

(56) References Cited

U.S. PATENT DOCUMENTS

| | | | |
|---|---|---|---|
| 2007/0169808 A1 | 7/2007 | Kherani et al. | |
| 2010/0029039 A1 | 2/2010 | Shan et al. | |
| 2012/0174975 A1* | 7/2012 | Shin | H01L 31/022433 |
| | | | 136/256 |
| 2013/0284232 A1 | 10/2013 | Fukumochi et al. | |
| 2014/0370651 A1 | 12/2014 | Tochihara et al. | |
| 2015/0249427 A1 | 9/2015 | Masuko | |
| 2017/0301805 A1* | 10/2017 | Yamarin | H01L 31/035281 |

FOREIGN PATENT DOCUMENTS

| | | |
|---|---|---|
| JP | 2005-502206 A | 1/2005 |
| JP | 2005-101240 A | 4/2005 |
| JP | 2009-524916 A | 7/2009 |
| KR | 2013-0068962 A | 6/2013 |
| KR | 2014-0095658 A | 8/2014 |
| WO | 2012-090694 A1 | 7/2012 |
| WO | 2013/133005 A1 | 9/2013 |
| WO | 2014/076972 A | 5/2014 |

OTHER PUBLICATIONS

Restriction Requirement dated Sep. 25, 2018 for U.S. Appl. No. 15/522,117.
Non-Final Rejection dated Feb. 28, 2019 for U.S. Appl. No. 15/522,117.
Final Rejection dated Jul. 1, 2019 for U.S. Appl. No. 15/522,117.
Non-Final Rejection dated Jan. 22, 2020 for U.S. Appl. No. 15/522,117.
Final Rejection dated Jun. 15, 2020 for U.S. Appl. No. 15/522,117.

* cited by examiner

Fig. 3
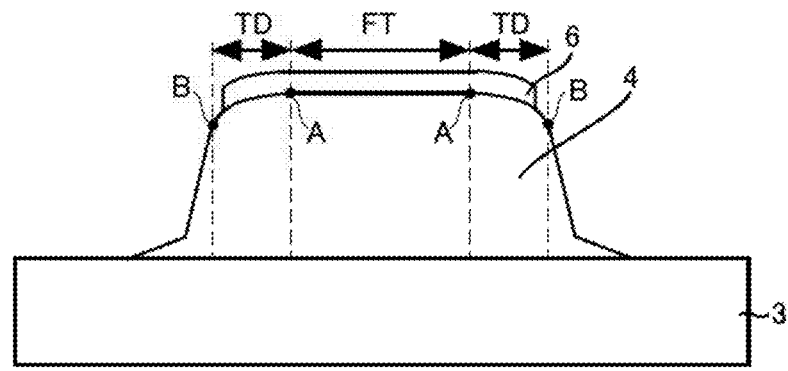
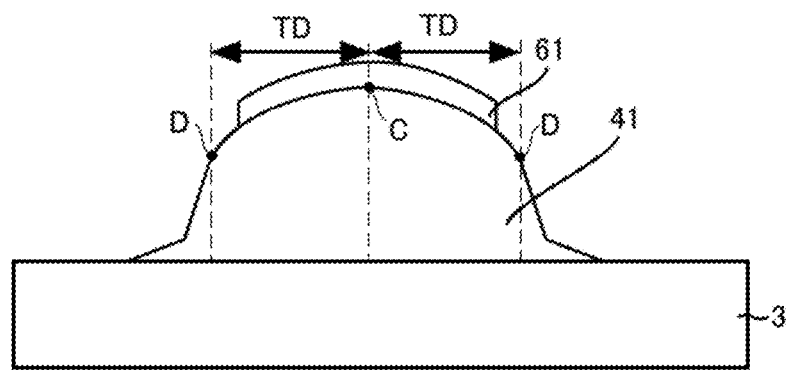
Fig. 4A
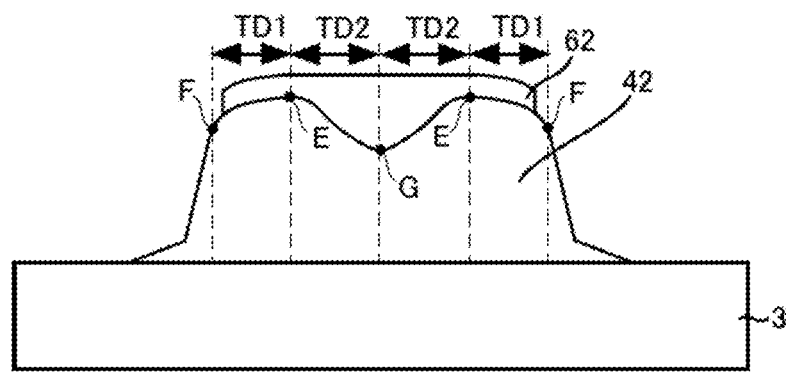
Fig. 4B

Fig. 12

| | WIDTH OF GAP REGION (μm) | PITCH X OF OPENING PORTION (μm) | OPENING WIDTH (μm) | YIELD (%) |
|---|---|---|---|---|
| COMPARATIVE EXAMPLE1 | 100 | 1000 | ----- | 72 |
| COMPARATIVE EXAMPLE2 | 200 | 1000 | ----- | 78 |
| HAVING PROTECTIVE LAYER1 | 100 | 1000 | 100 | 95 |
| HAVING PROTECTIVE LAYER2 | 100 | 1000 | 200 | 98 |
| HAVING PROTECTIVE LAYER3 | 100 | 1000 | 300 | 97 |
| HAVING PROTECTIVE LAYER4 | 100 | 700 | 100 | 98 |
| HAVING PROTECTIVE LAYER5 | 100 | 900 | 200 | 94 |
| HAVING PROTECTIVE LAYER6 | 200 | 1000 | 100 | 98 |
| HAVING PROTECTIVE LAYER7 | 300 | 1000 | 100 | 97 |
| HAVING PROTECTIVE LAYER8 | 50 | 1000 | 100 | 92 |

Fig. 13

| | | IMMEDIATELY AFTER FILM FORMATION | AFTER THREE DAYS | AFTER EIGHT DAYS |
|---|---|---|---|---|
| SAMPLE1 | i=3nm | 1 | ----- | 0.35 |
| SAMPLE2 | i=6nm | 1 | ----- | 0.5 |
| SAMPLE3 | i=10nm | 1 | ----- | 0.82 |
| SAMPLE4 | i/n=4nm/20nm | 1 | 0.5 | 0.35 |
| SAMPLE5 | i/SiN=10nm/60nm | 1 | 1 | 1 |
| SAMPLE6 | i/n/SiN=4nm/10nm/80nm | 1 | 1 | 1 |
| SAMPLE7 | i/SiON=10nm/40nm | 1 | 1 | 1 |
| SAMPLE8 | i/SiO$_2$=10nm/50nm | 1 | 1 | 1 |
| SAMPLE9 | i/TiO$_2$=10nm/60nm | 1 | 0.9 | 0.92 |
| SAMPLE10 | THERMAL OXIDE FILM (2nm) | 1 | ----- | 0.62 |

PHOTOVOLTAIC DEVICES, PHOTOVOLTAIC MODULES PROVIDED THEREWITH, AND SOLAR POWER GENERATION SYSTEMS

TECHNICAL FIELD

The present invention relates to a photovoltaic device, a photovoltaic module provided therewith, and a solar power generation system.

BACKGROUND ART

In the related art, a photovoltaic device is known in which intrinsic (i-type) amorphous silicon is interposed between an n-type crystalline silicon substrate and a p-type amorphous silicon layer, and thus an occurrence of defects at an interface is reduced, and characteristics at the heterojunction interface is improved. This photovoltaic device is referred to as a heterojunction solar cell.

FIG. 37 illustrates a heterojunction solar cell described in the pamphlet of PCT international Publication No. WO2013/133005. An n-electrode 1506 and a p-electrode 1507 are respectively formed on an n-type amorphous semiconductor layer 1503 and a p-type amorphous semiconductor layer 1505. In the heterojunction solar cell, electrons which are majority carriers generated in a silicon substrate are diffused toward the n-type amorphous semiconductor layer 1503, and are collected at the n-electrode 1506. Holes which are the minority carriers are diffused toward the p-type amorphous semiconductor layer 1505, and are collected at the p-electrode 1507.

SUMMARY OF INVENTION

However, in the conventional heterojunction solar cell, there are many uncertain factors such as reliability.

According to an embodiment of the invention, there is provided a photovoltaic device having improved reliability.

Further, according to an embodiment of the invention, there is provided a photovoltaic module including a photovoltaic device having improved reliability.

Moreover, according to an embodiment of the invention, there is provided a solar power generation system including a photovoltaic device having improved reliability.

According to an embodiment of the invention, a photovoltaic device includes a semiconductor substrate, a first amorphous semiconductor layer, a second amorphous semiconductor layer, a first electrode, a second electrode, and a protective film. The first amorphous semiconductor layer is formed on one surface of the semiconductor substrate, and has a first conductivity type. The second amorphous semiconductor layer is formed on the one surface of the semiconductor substrate, and is formed to be adjacent to the first amorphous semiconductor layer paralleled with the direction of the surface of the semiconductor substrate. The second amorphous semiconductor layer has a second conductivity type which is opposite to the first conductivity type. The first electrode is formed on the first amorphous semiconductor layer. The second electrode is formed on the second amorphous semiconductor layer so as to be separated from the first electrode with a gap region in between. The protective film is formed on the first electrode, the second electrode, and the gap region. The protective film includes an insulating film.

According to an embodiment of the invention, in a photovoltaic device, the second electrode is disposed to be separated from the first electrode with the gap region paralleled with the direction of the surface of the semiconductor substrate, and the protective film is formed on the first electrode, the second electrode, and the gap region. As a result, an occurrence of a short circuit between the first electrode and the second electrode is prevented. Inflow of moisture and the like into the first and second amorphous semiconductor layers is suppressed.

Thus, it is possible to improve reliability of the photovoltaic device.

Preferably, the protective film has opening portions on the first and second electrodes.

The first and second amorphous semiconductor layers are covered by the first and second electrodes, respectively, even in a region in which the opening portions are formed. The first and second electrodes except the opening portions are covered by the protective film. A region (gap region) in the first and second amorphous semiconductor layers, which is not covered by the first and second electrodes is covered by the protective film. As a result, even when the protective film has the opening portion, the occurrence of a short circuit between the first electrode and the second electrode is prevented, and inflow of moisture and the like into the first and second amorphous semiconductor layers is suppressed.

Thus, even when the protective film has the opening portion, it is possible to improve reliability of a photovoltaic device.

Preferably, the protective film is continuously formed on the first electrode, the second electrode, and the gap region.

The protective film is formed on the first electrode, the second electrode, and the gap region, by performing film formation once.

Thus, it is possible to reduce the number of processes in a manufacturing process of a photovoltaic device.

Preferably, the protective film is further formed on a peripheral region of the semiconductor substrate.

Electrical insulating properties and moisture resistance are further improved.

Thus, it is possible to further improve reliability of the photovoltaic device.

Preferably, the protective film includes an inorganic insulating film.

The inorganic insulating film suppresses inflow and mixing of moisture and the like from the outside into the first and second amorphous semiconductor layers.

Thus, it is possible to achieve both of electrical insulating properties and moisture resistance.

Preferably, the protective film includes an inorganic insulating layer and an amorphous semiconductor layer.

Thus, moisture resistance is secured and a change of passivation characteristics according to time is suppressed.

Thus, it is possible to achieve both of electrical insulating properties and moisture resistance.

According to the embodiment of the invention, a photovoltaic module corresponds to a photovoltaic module including a photovoltaic device described in any one of claims 1 to 5.

Thus, it is possible to improve reliability of a photovoltaic module.

Further, according to the embodiment of the invention, a solar power generation system corresponds to a solar power generation system including a photovoltaic device described in any one of claims 1 to 5.

Thus, it is possible to improve reliability of a solar power generation system.

In the photovoltaic device according to the embodiment of the invention, the occurrence of a short circuit between the first electrode and the second electrode is prevented, and inflow of moisture and the like into the first and second amorphous semiconductor layers is suppressed.

Accordingly, it is possible to improve reliability of a photovoltaic device, a photovoltaic module and a solar power generation system which use the photovoltaic device.

BRIEF DESCRIPTION OF DRAWINGS

FIG. 3 is a sectional view illustrating a detailed structure of an n-type amorphous semiconductor layer illustrated in FIG. 1.

FIGS. 4A to 4B indicate a sectional view illustrating another detailed structure of the n-type amorphous semiconductor layer illustrated in FIG. 1.

FIG. 12 is a diagram illustrating yield of a photovoltaic module when the width of a gap region, a pitch between adjacent opening portions, and an opening width of the opening portion are changed.

FIG. 13 is a diagram illustrating a result of a moisture-resistance test.

DESCRIPTION OF EMBODIMENTS

Figure 1:
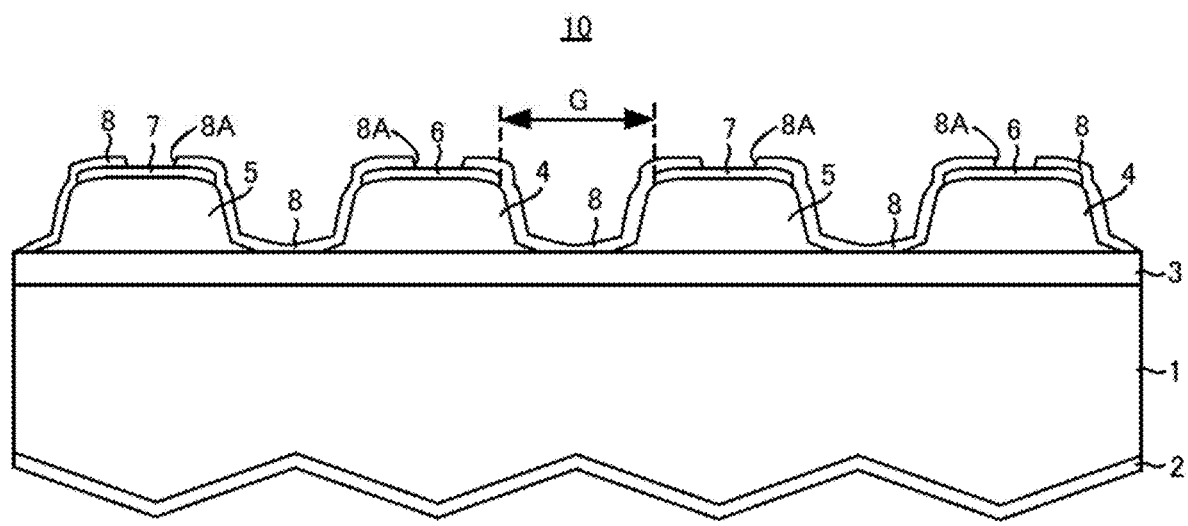
FIG. 1 is a sectional view illustrating a configuration of a photovoltaic device according to Embodiment 1 of the invention.

Embodiments of the present invention will be described in detail with reference to the drawings. In the drawings, the same or equivalent parts are denoted by the same reference signs, and descriptions thereof will not be repeated.

In this specification, an amorphous semiconductor layer may include a fine crystalline phase. The fine crystalline phase includes crystals having an average grain diameter of 1 to 50 nm.

Embodiment 1

FIG. 1 is a sectional view illustrating a configuration of a photovoltaic device according to Embodiment 1 of the invention. With reference to FIG. 1, a photovoltaic device 10 according to Embodiment 1 of the invention includes a semiconductor substrate 1, an antireflection coat 2, a passivation film 3, an n-type amorphous semiconductor layer 4, a p-type amorphous semiconductor layer 5, electrodes 6 and 7, and a protective film 8.

The semiconductor substrate 1 is formed from an n-type monocrystalline silicon substrate, for example. The semiconductor substrate 1 has a thickness of 100 to 150 µm, for example. In the semiconductor substrate 1, a textured structure is formed on one surface. The surface on which the textured structure is formed is referred to as "a light-receiving surface".

The antireflection coat 2 is disposed to be in contact with the one surface (light-receiving surface) of the semiconductor substrate 1.

The passivation film 3 is disposed to be in contact with a surface on a side opposite to the light-receiving surface of the semiconductor substrate 1.

The n-type amorphous semiconductor layer 4 is disposed to be in contact with the passivation film 3.

The p-type amorphous semiconductor layer 5 is disposed to be adjacent to the n-type amorphous semiconductor layer 4 paralleled with the direction of the surface of the semiconductor substrate 1. More detailed, the p-type amorphous semiconductor layer 5 is disposed to be separated from the n-type amorphous semiconductor layer 4 at a desired interval, and to be paralleled with the direction of the surface of the semiconductor substrate 1.

The n-type amorphous semiconductor layer 4 and the p-type amorphous semiconductor layer 5 are alternately disposed to be paralleled with the direction of the surface of the semiconductor substrate 1.

The electrode 6 is disposed on the n-type amorphous semiconductor layer 4, so as to be in contact with the n-type amorphous semiconductor layer 4.

The electrode 7 is disposed on the p-type amorphous semiconductor layer 5, so as to be in contact with the p-type amorphous semiconductor layer 5.

The protective film 8 is disposed to be in contact with the passivation film 3, the n-type amorphous semiconductor layer 4, the p-type amorphous semiconductor layer 5, and the electrodes 6 and 7. More detailed, the protective film 8 is disposed between the n-type amorphous semiconductor layer 4 and the p-type amorphous semiconductor layer 5 which are adjacent to each other, so as to be in contact with a portion of the n-type amorphous semiconductor layer 4, the p-type amorphous semiconductor layer 5, and the electrodes 6 and 7, and the protective film 8 is disposed to be in contact with a portion of the passivation film 3 which is disposed between the n-type amorphous semiconductor layer 4 and the p-type amorphous semiconductor layer 5. The protective film 8 has opening portions 8A on the electrodes 6 and 7, and is formed in a region of 5 µm or more from ends of the electrodes 6 and 7 toward inner sides of the electrodes 6 and 7.

The antireflection coat 2 is formed from, for example, a silicon nitride film, and has a film thickness of, for example, 60 nm.

The passivation film 3 is formed from any of amorphous silicon, oxide of amorphous silicon, nitride of amorphous silicon, oxynitride of amorphous silicon, and polycrystalline silicon, for example.

In a case where the passivation film 3 is formed from oxide of amorphous silicon, the passivation film 3 may be formed from a thermal oxide film of silicon, or may be formed from oxide of silicon, which has been formed by a vapor phase film deposition method such as a plasma chemical vapour deposition (CVD) method.

The passivation film 3 has a film thickness of, for example, 1 to 20 nm, and preferably, has a film thickness of 1 to 3 nm. In a case where the passivation film 3 is formed form a silicon insulating film, the passivation film 3 has a film thickness which allows carriers (electrons and holes) to perform tunneling. In Embodiment 1, the passivation film 3 is formed from a thermal oxide film of silicon, and the film thickness of the passivation film 3 is set to 2 nm.

The n-type amorphous semiconductor layer 4 has an n-type conductivity type, and is an amorphous semiconductor layer which contains hydrogen. The n-type amorphous semiconductor layer 4 is formed from, for example, n-type amorphous silicon, n-type amorphous silicon germanium, n-type amorphous germanium, n-type amorphous silicon carbide, n-type amorphous silicon nitride, n-type amorphous silicon oxide, n-type amorphous silicon oxynitride, n-type amorphous silicon carbon oxide, or the like.

The n-type amorphous semiconductor layer 4 contains, for example, phosphorus (P) as an n-type dopant. The n-type amorphous semiconductor layer 4 has a film thickness of, for example, 3 to 50 nm.

The p-type amorphous semiconductor layer 5 has a p-type conductivity type, is an amorphous semiconductor layer which contains hydrogen. The p-type amorphous semiconductor layer 5 is formed from, for example, p-type amorphous silicon, p-type amorphous silicon germanium, p-type amorphous germanium, p-type amorphous silicon carbide, p-type amorphous silicon nitride, p-type amorphous silicon oxide, p-type amorphous silicon oxynitride, p-type amorphous silicon carbon oxide, or the like.

The p-type amorphous semiconductor layer 5 contains, for example, boron (B) as a p-type dopant. The p-type amorphous semiconductor layer 5 has a film thickness of, for example, 5 to 50 nm.

Figure 2A:
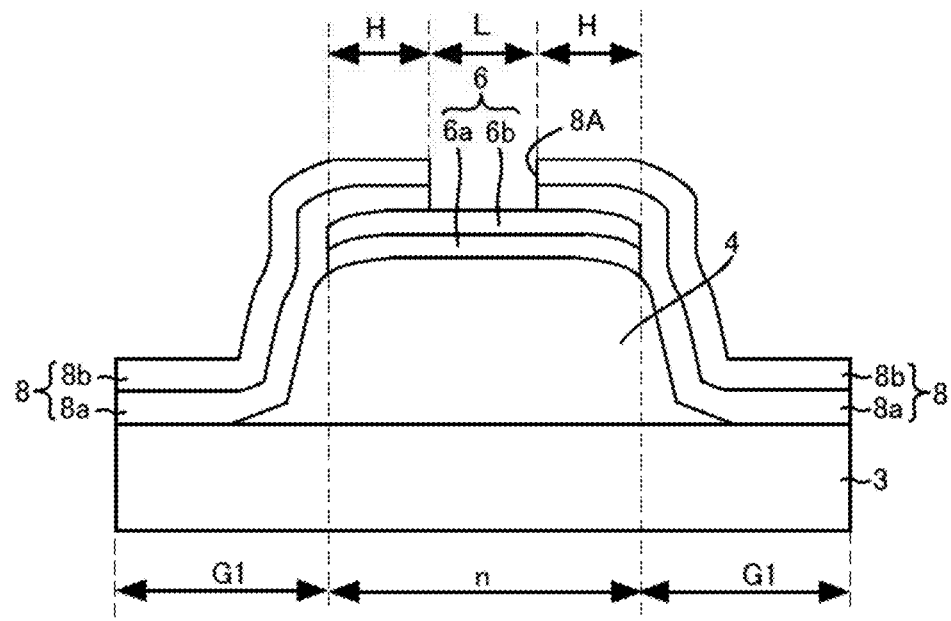
FIGS. 2A to 2B indicate an enlarged view illustrating an electrode and a protective film illustrated in FIG. 1.
Figure 2B:
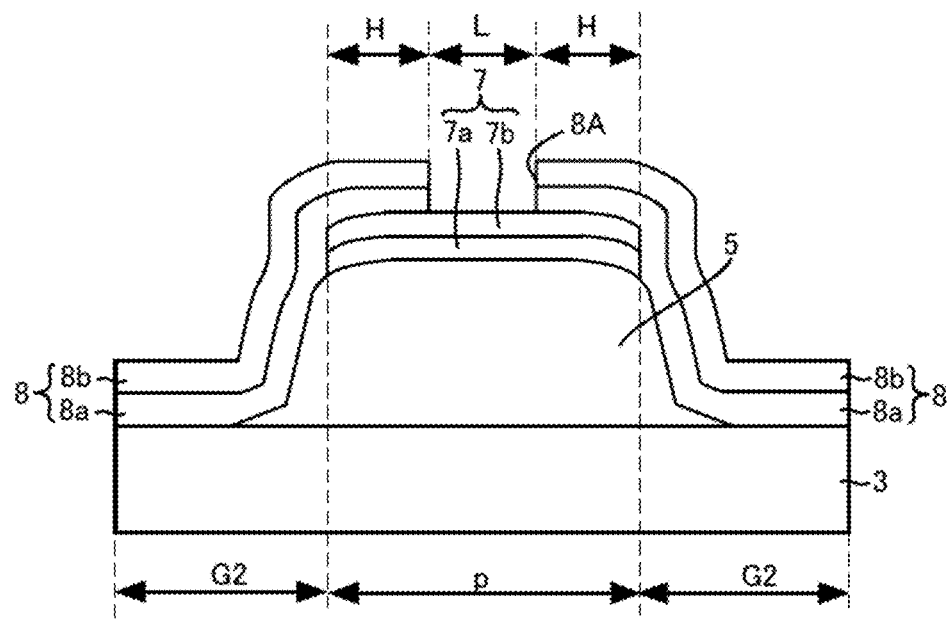

FIG. 2 is an enlarged view illustrating the electrodes 6 and 7 and the protective film 8 illustrated in FIG. 1. With reference to FIG. 2, the electrode 6 is formed from conductive layers 6a and 6b.

The conductive layer 6a is disposed to be in contact with the n-type amorphous semiconductor layer 4. The conductive layer 6b is disposed to be in contact with the conductive layer 6a. In a case where the width of the opening portion 8A in the protective film 8 is set as L, and a distance from the ends of the electrodes 6 and 7 to the opening portion 8A is set as H, the conductive layers 6a and 6b are formed in a region of H+L/2 on the both sides from the center of the n-type amorphous semiconductor layer 4 paralleled with the direction of the surface of the n-type amorphous semiconductor layer 4. The width L is, for example, equal to or more than 20 µm, and preferably equal to or more than 100 µm. The width L is set to be such a value, and thus it is possible to ensure adhesion between an external wiring and the electrodes 6 and 7, and to reduce contact resistance. Considering the adhesion between the electrodes 6 and 7 and the protective film 8, the distance H is equal to or more than 5 µm, for example.

The electrode 7 is formed from conductive layers 7a and 7b. The conductive layer 7a is disposed to be in contact with the p-type amorphous semiconductor layer 5. The conductive layer 7b is disposed to be in contact with the conductive layer 7a. The conductive layers 7a and 7b are formed in a region of H+L/2 on the both sides from the center of the p-type amorphous semiconductor layer 5 paralleled with the direction of the surface of the p-type amorphous semiconductor layer 5.

As a result, each of the electrodes 6 and 7 has a length of 2H+L paralleled with the direction of the surface of the n-type amorphous semiconductor layer 4 and the p-type amorphous semiconductor layer 5.

The protective film 8 has a double-layer structure of protective layers 8a and 8b, for example. In a case where the protective film 8 is formed on the n-type amorphous semiconductor layer 4, the protective layer 8*a* is disposed to be in contact with the passivation film 3, the n-type amorphous semiconductor layer 4, and the electrode 6. The protective layer 8*b* is disposed to be in contact with the protective layer 8*a*. In a case where the protective film 8 is formed on the p-type amorphous semiconductor layer 5, the protective layer 8*a* is disposed to be in contact with the passivation film 3, the p-type amorphous semiconductor layer 5, and the electrode 7. The protective layer 8*b* is disposed to be in contact with the protective layer 8*a*.

A region of the n-type amorphous semiconductor layer 4 on an outer side of the end of the electrode 6 paralleled with the direction of the surface of the n-type amorphous semiconductor layer 4 is referred to as a gap region G1. A region of the p-type amorphous semiconductor layer 5 on an outer side of the end of the electrode 7 paralleled with the direction of the surface of the p-type amorphous semiconductor layer 5 is referred to as a gap region G2. As a result, the gap region G1 is provided on the both sides of the n-type amorphous semiconductor layer 4 paralleled with the direction of the surface of the n-type amorphous semiconductor layer 4. The gap region G2 is provided on the both sides of the p-type amorphous semiconductor layer 5 paralleled with the direction of the surface of the p-type amorphous semiconductor layer 5.

The protective film 8 is disposed to be in contact with the passivation film 3, the n-type amorphous semiconductor layer 4, and the electrode 6, and is disposed to be in contact with the passivation film 3, the p-type amorphous semiconductor layer 5, and the electrode 7. As a result, a gap region G (=G1+G2) is provided in a region of an n-type amorphous semiconductor layer 4 and a p-type amorphous semiconductor layer 5 which are adjacent to each other paralleled with the direction of the surface of the semiconductor substrate 1, and the protective film 8 is formed on the electrodes 6 and 7, and the gap region G, as illustrated in FIG. 1.

The gap region G is a region in which the passivation film 3, the n-type amorphous semiconductor layer 4, and the p-type amorphous semiconductor layer 5 are exposed. For example, the gap region G has a width of 20 μm to 300 μm.

Each of the conductive layers 6*a* and 7*a* is formed from a transparent conductive film. The transparent conductive film is formed from indium tin oxide (ITO), ZnO, or indium tungsten oxide (IWO), for example.

Each of the conductive layers 6*b* and 7*b* is formed from metal. The metal is, for example, any of silver (Ag), nickel (Ni), aluminum (Al), copper (Cu), tin (Sn), platinum (Pt), gold (Au), chromium (Cr), tungsten (W), cobalt (Co) and titanium (Ti), alloys thereof, or a laminated film thereof.

As the conductive layers 6*a* and 7*a*, respectively, a transparent conductive film which has good adhesion to the n-type amorphous semiconductor layer 4 and the p-type amorphous semiconductor layer 5 is preferably used. As the conductive layers 6*b* and 7*b*, metal having high conductivity is preferably used.

The film thickness of the conductive layers 6*a* and 7*a* is, for example, 3 to 100 nm. The film thickness of each of the conductive layers 6*b* and 7*b* is preferably equal to or more than 50 nm. In Embodiment 1, the film thickness thereof is, for example, 0.8 μm.

In Embodiment 1, the electrode 6 may be formed from only the conductive layer 6*b*, and the electrode 7 may be formed from only the conductive layer 7*b*. In this case, the conductive layers 6*b* and 7*b* are in contact with the n-type amorphous semiconductor layer 4 and the p-type amorphous semiconductor layer 5, respectively, without the conductive layers 6*a* and 7*a*.

In a case where the conductive layers 6*a* and 7*a* are not provided, preferably, the conductive layers 6*b* and 7*b* are configured by a metal film, and the metal has high adhesion to the n-type amorphous semiconductor layer 4 and the p-type amorphous semiconductor layer 5 which are respectively underlying layers. For example, the conductive layers 6*b* and 7*b* have a laminated structure of an adhesive layer and a light-reflective metal. The adhesive layer is formed from Ti, Ni, Al, Cr, or the like, and has a film thickness of about 1 to 10 nm. The light-reflective metal has Al, Ag, or the like as the main component.

The conductive layers 6*b* and 7*b* are in contact with the protective film 8, and thus it is necessary to take adhesion to the protective film 8 into consideration. In a case where oxide of silicon, aluminum, titanium, zirconium, or the like, a silicon nitride film or aluminum, an oxynitride film of silicon or aluminum, or the like is used as the protective film 8, it is preferable that the surface of the conductive layers 6*b* and 7*b* on the protective film 8 side is formed from metal such as Al, indium (In), Ti, Ni, Cu, Cr, W, Co, palladium (Pd), and Sn.

Further, each of the electrodes 6 and 7 may be formed from a single film of a transparent conductive film. In this case, the transparent conductive film is formed from ITO or the like, as described above.

Each of the protective layers 8*a* and 8*b* is formed from an inorganic insulating film. The inorganic insulating film is formed from an oxide film, a nitride film, an oxynitride film, or the like.

The oxide film is formed from an oxide film of silicon, aluminum, titanium, zirconia, hafnium, zinc, tantalum, yttrium, or the like.

The nitride film is formed from a silicon nitride film, aluminum, or the like.

The oxynitride film is formed from an oxynitride film of silicon, aluminum, or the like.

The protective layer 8*b* is formed from an inorganic insulating film which is different from the protective layer 8*a*. That is, two types of films are selected from the above-described inorganic insulating films, and the protective layer 8*a* and 8*b* are formed by the selected films.

The protective layer 8*a* may be formed from a semiconductor layer, and the protective layer 8*b* may be formed from the above-described inorganic insulating film.

In this case, the semiconductor layer is formed from an amorphous semiconductor layer. The amorphous semiconductor layer is formed from amorphous silicon, amorphous silicon germanium, amorphous germanium, amorphous silicon carbide, amorphous silicon nitride, amorphous silicon oxide, amorphous silicon oxynitride, amorphous silicon carbon oxide, or the like. Because a layer having high insulating properties can suppress an occurrence of leakage between the electrodes 6 and 7, the protective layer 8*a* is preferably formed from an intrinsic amorphous semiconductor layer. For example, the protective layer 8*a* is formed from intrinsic amorphous silicon, and the protective layer 8*b* is formed from a silicon nitride film.

In a case where the protective layer 8*b* is formed from an insulating film, the protective layer 8*a* may be formed from an n-type amorphous semiconductor layer or a p-type amorphous semiconductor layer.

The protective layer 8*b* is preferably formed from a dielectric film having positive fixed charges. The dielectric film having positive fixed charges is, for example, a silicon nitride film or an oxynitride film of silicon.

The semiconductor substrate 1 is formed from n-type monocrystalline silicon. Thus, in a case where the protective layer 8b is formed from a dielectric film having positive fixed charges, the protective layer 8b can apply an electric field to holes which are minority carriers, and thus it is possible to maintain a long lifetime of minority carriers (holes) in the gap region G.

The protective film 8 is not limited to the double-layer structure, and may have a single layer structure or a multi-layer structure having two or more layers.

In a case where the protective film 8 is formed from a single layer, the protective film 8 is formed from one film selected from the above-described inorganic insulating films.

In a case where the protective film 8 has a multilayer structure, the protective film 8 includes the above-described protective layers 8a and 8b in the multilayer structure.

As described above, in a case where the protective film 8 has a double-layer structure, the protective layer 8a is formed by an amorphous semiconductor layer and the protective layer 8b is formed by an insulating film, and thus it is possible to achieve both of passivation characteristics for the n-type amorphous semiconductor layer 4 and the p-type amorphous semiconductor layer 5, and insulating properties between the electrodes 6 and 7. Accordingly, the case is preferable.

In a case where the semiconductor substrate 1 is formed from an n-type silicon substrate and when the protective layer 8b is formed by a dielectric film having positive fixed charges, it is possible to apply an electric field to the gap region and to extend the lifetime of minority carriers (holes) in the gap region. Accordingly, the case is further preferable.

Further, in a case where the above-described inorganic insulating film is included in the multilayer structure of the protective film 8, it is possible to obtain a moisture-resistance effect of blocking moisture and the like which are diffused to the amorphous semiconductor layers (n-type amorphous semiconductor layer 4 and p-type amorphous semiconductor layer 5). Thus, the case is preferable. Among the above-described inorganic insulating films, a silicon nitride film and an oxynitride film of silicon have particularly high moisture resistance in comparison to other inorganic insulating films, and thus are particularly preferable. In a case using an n-type silicon substrate, it is possible to obtain the moisture resistance and an electric field effect by positive fixed charges. Thus, it is possible to achieve both of long-term reliability and high efficiency of the photovoltaic device 10.

For example, in a case where the protective film 8 is formed from a multilayer film having a structure of two layers or more, for example, a three-layer structure, one protective layer (protective layer in contact with the n-type amorphous semiconductor layer 4 or the p-type amorphous semiconductor layer 5) is formed from an amorphous semiconductor layer, and the other two protective layers are formed from two types of films selected from inorganic insulating films.

In a case where the protective film 8 is formed from a single layer or a multilayer, the protective film 8 may have a structure in which an organic insulating film and the like are formed on the above-described inorganic insulating film.

The organic matter is formed from, for example, imide resin, epoxy resin, fluororesin, polycarbonate, liquid crystal polymer, or the like.

The imide resin is, for example, polyimide. The fluororesin is, for example, polytetrafluoroethylene (PTFE). The organic matter may be a resist formed by screen printing.

FIG. 3 is a sectional view illustrating a detailed structure of the n-type amorphous semiconductor layer 4 illustrated in FIG. 1. With reference to FIG. 3, the n-type amorphous semiconductor layer 4 has a flat region FT and a thickness reduction region TD paralleled with the direction of the surface of the n-type amorphous semiconductor layer 4. The flat region FT is a portion of the n-type amorphous semiconductor layer 4, which has the thickest film thickness, and has a substantially uniform film thickness.

When points at both ends of the flat region FT are set as A points, and points at which a decrease rate of the film thickness is changed from a first decrease rate to a second decrease rate which is larger than the first decrease rate are set as B points, the thickness reduction region TD is a region from the A point to the B point paralleled with the direction of the surface of the n-type amorphous semiconductor layer 4.

The thickness reduction region TD is disposed on the both sides of the flat region FT paralleled with the direction of the surface of the n-type amorphous semiconductor layer 4.

The n-type amorphous semiconductor layer 4 has the thickness reduction region TD because the n-type amorphous semiconductor layer 4 is formed by a plasma CVD method using a mask, as will be described later. The thickness reduction region TD has a film thickness which is thinner than that of the flat region FT. Thus, dopant concentration of the thickness reduction region TD is higher than dopant concentration of the flat region FT.

The electrode 6 is disposed to be in contact with the entirety of the flat region FT of the n-type amorphous semiconductor layer 4 and a portion of the thickness reduction region TD.

The p-type amorphous semiconductor layer 5 also has the same structure as that of the n-type amorphous semiconductor layer 4 illustrated in FIG. 3. The electrode 7 is disposed to be in contact with the entirety of the flat region FT of the p-type amorphous semiconductor layer 5 and a portion of the thickness reduction region TD.

As a result, resistance when carriers (electrons) reach the electrode 6 through the n-type amorphous semiconductor layer 4 is smaller than resistance in a case where an n-type amorphous semiconductor layer having a uniform film thickness paralleled with the direction of the surface of the passivation film 3 is formed. Resistance when carriers (holes) reach the electrode 7 through the p-type amorphous semiconductor layer 5 is smaller than resistance in a case where a p-type amorphous semiconductor layer having a uniform film thickness paralleled with the direction of the surface of the passivation film 3 is formed. Thus, it is possible to improve conversion efficiency of the photovoltaic device 10.

The electrode 6 may be in contact with the entirety of the thickness reduction region TD of the n-type amorphous semiconductor layer 4. The electrode 7 may be in contact with the entirety of the thickness reduction region TD of the p-type amorphous semiconductor layer 5.

FIG. 4 is a sectional view illustrating another detailed structure of the n-type amorphous semiconductor layer 4 illustrated in FIG. 1. With reference to FIG. 4A, the photovoltaic device 10 may include an n-type amorphous semiconductor layer 41 instead of the n-type amorphous semiconductor layer 4, and include an electrode 61 instead of the electrode 6.

In the n-type amorphous semiconductor layer 41, a point at which the film thickness is thickest is set as a C point, and points at which a decrease rate of the film thickness is changed from a first decrease rate to a second decrease rate which is larger than the first decrease rate are set as D points. As a result, the thickness reduction region TD is a region from the C point to the D point paralleled with the direction of the surface of the n-type amorphous semiconductor layer 41.

The n-type amorphous semiconductor layer 41 has two thickness reduction regions TD paralleled with the direction of the surface of the n-type amorphous semiconductor layer 41. The two thickness reduction regions TD are disposed to be in contact with each other paralleled with the direction of the surface of the n-type amorphous semiconductor layer 41.

The electrode 61 is disposed to be in contact with a portion of one thickness reduction region TD and a portion of another thickness reduction region TD among the two thickness reduction regions TD.

The photovoltaic device 10 may include a p-type amorphous semiconductor layer having the same structure as that of the n-type amorphous semiconductor layer 41 illustrated in FIG. 4A, instead of the p-type amorphous semiconductor layer 5.

As a result, resistance when carriers (electrons) reach the electrode 61 through the n-type amorphous semiconductor layer 41 is smaller than resistance in a case where an n-type amorphous semiconductor layer having a uniform film thickness paralleled with the direction of the surface of the passivation film 3 is formed. Resistance when carriers (holes) reach the electrode through the p-type amorphous semiconductor layer having the same structure as that of the n-type amorphous semiconductor layer 41 is smaller than resistance in a case where a p-type amorphous semiconductor layer having a uniform film thickness paralleled with the direction of the surface of the passivation film 3 is formed. Thus, it is possible to improve conversion efficiency of the photovoltaic device 10.

The electrode 61 may be disposed on the n-type amorphous semiconductor layer 41 and the p-type amorphous semiconductor layer having the same structure as that of the n-type amorphous semiconductor layer 41, so as to be in contact with the entirety of the two thickness reduction regions TD.

With reference to FIG. 4(b), the photovoltaic device 10 may include an n-type amorphous semiconductor layer 42 instead of the n-type amorphous semiconductor layer 4, and include an electrode 62 instead of the electrode 6.

In the n-type amorphous semiconductor layer 42, a point at which the film thickness is thickest is set as an E point, and points at which a decrease rate of the film thickness is changed from a first decrease rate to a second decrease rate which is larger than the first decrease rate are set as F points. A point at which the sign of a change rate of the film thickness is changed from a negative sign to a positive sign is set as a G point.

As a result, a thickness reduction region TD1 is a region from the E point to the F point paralleled with the direction of the surface of the n-type amorphous semiconductor layer 42. A thickness reduction region TD2 is a region from the E point to the G point paralleled with the direction of the surface of the n-type amorphous semiconductor layer 42.

The n-type amorphous semiconductor layer 42 has two thickness reduction regions TD1 and two thickness reduction regions TD2 paralleled with the direction of the surface of the n-type amorphous semiconductor layer 42.

The two thickness reduction regions TD2 are disposed so that film thickness distribution paralleled with the direction of the surface of the n-type amorphous semiconductor layer 42 is symmetric with respect to a line passing through the G point. The two thickness reduction regions TD1 are disposed on both sides of the two thickness reduction regions TD2 paralleled with the direction of the surface of the n-type amorphous semiconductor layer 42.

The electrode 62 is disposed to be in contact with the entirety of the two thickness reduction regions TD2, a portion of one thickness reduction region TD1, and a portion of another thickness reduction region TD1.

The photovoltaic device 10 may include a p-type amorphous semiconductor layer having the same structure as that of the n-type amorphous semiconductor layer 42 illustrated in FIG. 4(b), instead of the p-type amorphous semiconductor layer 5.

As a result, resistance when carriers (electrons) reach the electrode 62 through the n-type amorphous semiconductor layer 42 is smaller than resistance in a case where an n-type amorphous semiconductor layer having a uniform film thickness paralleled with the direction of the surface of the passivation film 3 is formed. Resistance when carriers (holes) reach the electrode through the p-type amorphous semiconductor layer having the same structure as that of the n-type amorphous semiconductor layer 42 is smaller than resistance in a case where a p-type amorphous semiconductor layer having a uniform film thickness paralleled with the direction of the surface of the passivation film 3 is formed. Thus, it is possible to improve conversion efficiency of the photovoltaic device 10.

The electrode 62 may be disposed in the n-type amorphous semiconductor layer 42 and the p-type amorphous semiconductor layer having the same structure as that of the n-type amorphous semiconductor layer 42, so as to be in contact with the entirety of the two thickness reduction regions TD1 and the entirety of the two thickness reduction regions TD2.

As described above, the photovoltaic device 10 includes an n-type amorphous semiconductor layer and a p-type amorphous semiconductor layer which have the thickness reduction region TD (TD1 and TD2). In the embodiments of the invention, the thickness reduction region is formed from any of the thickness reduction regions TD, TD1, and TD2.

Thus, when a point at which the film thickness of the n-type amorphous semiconductor layer or the p-type amorphous semiconductor layer is thickest is set as a first point, a point at which the decrease rate of the film thickness paralleled with the direction of the surface of the n-type amorphous semiconductor layer or the p-type amorphous semiconductor layer is changed from a first decrease rate to a second decrease rate which is larger than the first decrease rate, or a point at which the sign of a change rate of the film thickness is changed from a negative sign to a positive sign is set as a second point, the thickness reduction region is a region from the first point to the second point paralleled with the direction of the surface of the n-type amorphous semiconductor layer or the p-type amorphous semiconductor layer.

In the embodiments of the invention, at least one of the n-type amorphous semiconductor layer 4 and the p-type amorphous semiconductor layer may have a thickness reduction region.

FIGS. 5 to 9 are first to fifth process diagrams illustrating a method of manufacturing the photovoltaic device 10 illustrated in FIG. 1, respectively.

With reference to FIG. 5, when manufacturing of the photovoltaic device 10 is started, a wafer having a thickness of 100 to 300 µm is cut out from a silicon bulk by a wire saw. Etching for removing a damaged layer on the surface of a wafer, and etching for adjusting the thickness is performed, and a semiconductor substrate 1' is prepared (see the process of FIG. 5A).

Figure 5A:
FIGS. 5A to 5D indicate a first process diagram illustrating a method of manufacturing the photovoltaic device illustrated in FIG. 1.
Figure 5B:
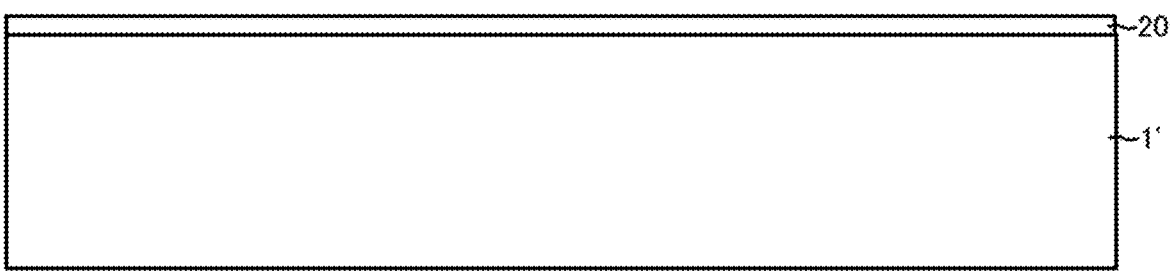

A protective film 20 is formed on one surface of the semiconductor substrate 1' (see the process of FIG. 5B). The protective film 20 is formed from, for example, silicon oxide or silicon nitride.

Then, the semiconductor substrate 1' on which the protective film 20 is formed is etched by using an alkaline solution such as NaOH and KOH (for example, KOH: 1 to 5 wt %, isopropyl alcohol: aqueous solution of 1 to 10 wt %). Thus, the surface on a side opposite to the surface of the semiconductor substrate 1' on which the protective film 20 is formed is subjected to anisotropic etching, and a textured structure having a pyramid shape is formed. The protective film 20 is removed, and thus a semiconductor substrate 1 is obtained (see the process of FIG. 5C).

Figure 5C:
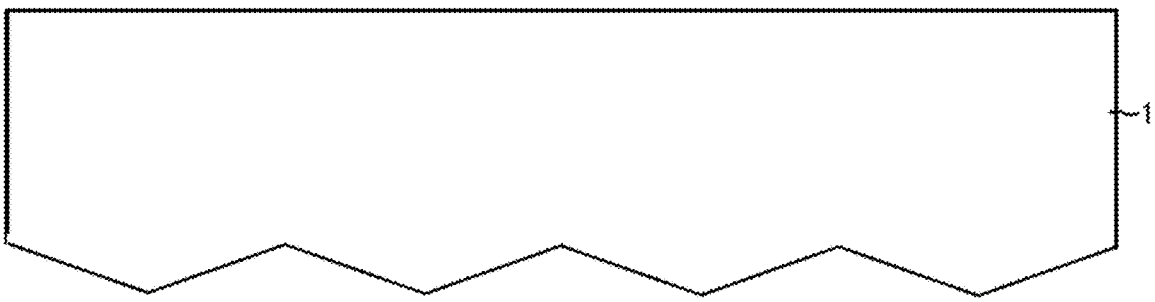
Figure 5D:
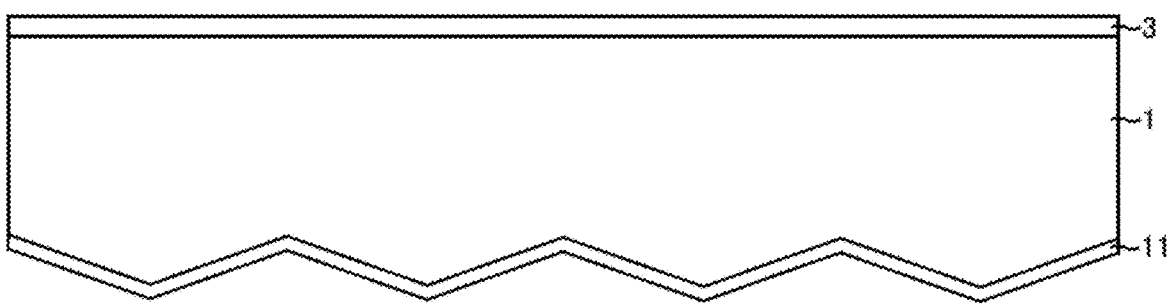

The front surface of the semiconductor substrate 1 is thermally oxidized so as to form an oxide film 11 on a light-receiving surface of the semiconductor substrate 1, and to form a passivation film 3 on the back surface (surface on a side opposite to the light-receiving surface) of the semiconductor substrate 1 (see the process of FIG. 5D).

The oxidation of the semiconductor substrate 1 may be performed by a wet process or thermal oxidation. In a case of wet oxidation, for example, the semiconductor substrate 1 is immersed in hydrogen peroxide, nitric acid, ozone water, or the like. Then, the semiconductor substrate 1 is heated at 800° C. to 1000° C. in a dry atmosphere. In a case of thermal oxidation, for example, the semiconductor substrate 1 is heated at 900° C. to 1000° C. in an atmosphere of oxygen or water vapor.

After the process of FIG. 5D, a silicon nitride film 12 is formed by a sputtering method, electron beam (EB) vapor deposition, a TEOS method, or the like, so as to be in contact with the oxide film 11. Thus, an antireflection coat 2 is formed on the light-receiving surface of the semiconductor substrate 1 (see the process of FIG. 6E).

Figure 6E:
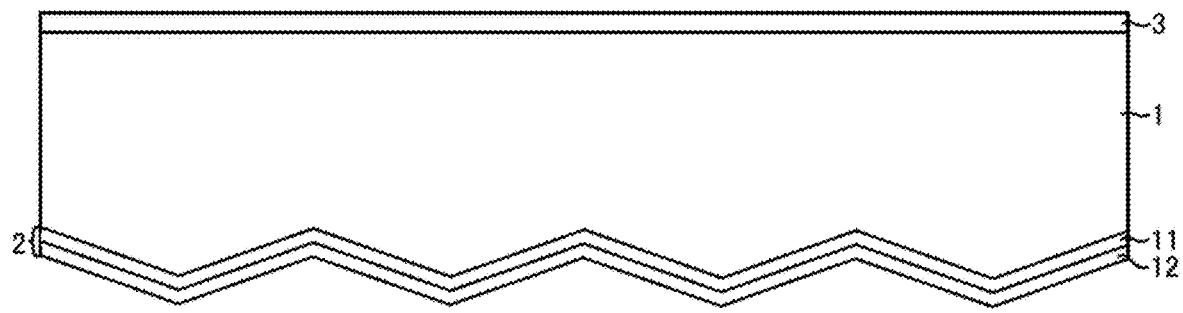
FIGS. 6E to 6G indicate a second process diagram illustrating the method of manufacturing the photovoltaic device illustrated in FIG. 1.
Figure 6F:
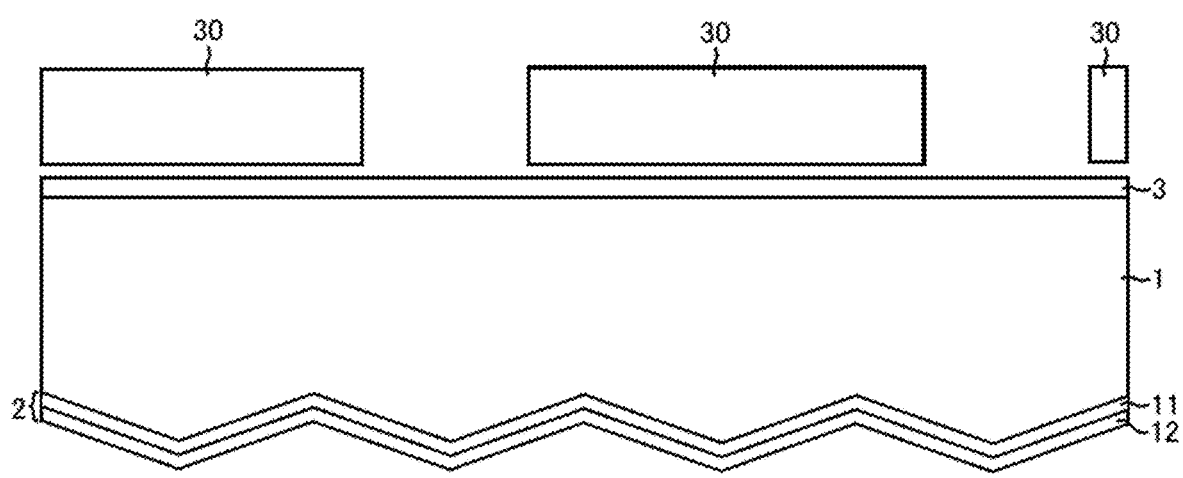

After the process of FIG. 6E, the semiconductor substrate 1 is put into a reaction chamber of a plasma device, and a mask 30 is disposed on a passivation film 3 of the semiconductor substrate 1 (see the process of FIG. 6F).

The mask 30 is formed from a metal mask. The metal mask is formed from, for example, stainless steel. The thickness of the metal mask is 200 µm, and an opening width thereof is 400 µm.

The temperature of the semiconductor substrate 1 is set to be 130° C. to 180° C. A hydrogen ($H_2$) gas of 0 to 100 sccm, a $SiH_4$ gas of 40 sccm, and a phosphine ($PH_3$) gas of 40 sccm flow into the reaction chamber, and the pressure of the reaction chamber is set to be 40 to 120 Pa. Then, high-frequency power (13.56 MHz) in which RF power density is 5 to 15 mW/cm$^2$ is applied to the parallel plate electrode. The $PH_3$ gas is diluted by hydrogen, and the concentration of the $PH_3$ gas is, for example, 1%.

Figure 6G:
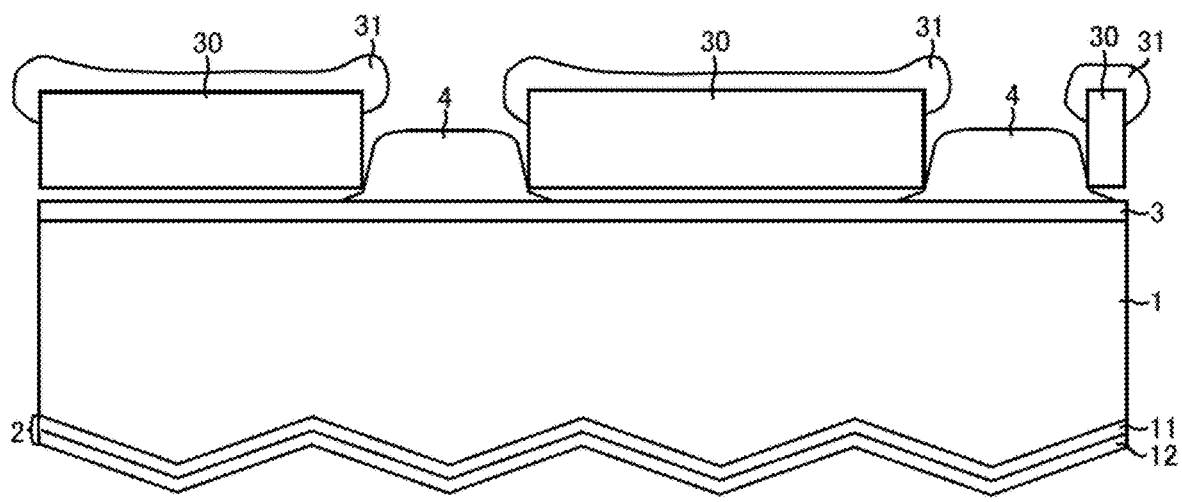

Thus, n-type amorphous silicon is deposited in a region of the passivation film 3, which is not covered by the mask 30, and thus the n-type amorphous semiconductor layer 4 is formed on the passivation film 3 (see the process of FIG. 6G).

In a case where the mask 30 is disposed on the passivation film 3, a gap is provided between the mask 30 and the passivation film 3. As a result, active species such as SiH and $SiH_2$, which are decomposed by plasma wrap around the gap between the mask 30 and the passivation film 3, and thus the n-type amorphous semiconductor layer 4 may also be formed in a part of the region which is covered by the mask 30. Thus, the n-type amorphous semiconductor layer 4 having the thickness reduction region TD is formed on the passivation film 3. n-type amorphous silicon 31 is also deposited on the mask 30.

The width and the film-thickness decrease rate of the thickness reduction region TD in the n-type amorphous semiconductor layer 4 are controlled by changing film formation pressure when the n-type amorphous semiconductor layer 4 is formed, the thickness of the mask 30, and an opening width of the mask 30. For example, if the thickness of the mask 30 is increased, the width of the thickness reduction region TD is increased.

Figure 7H:
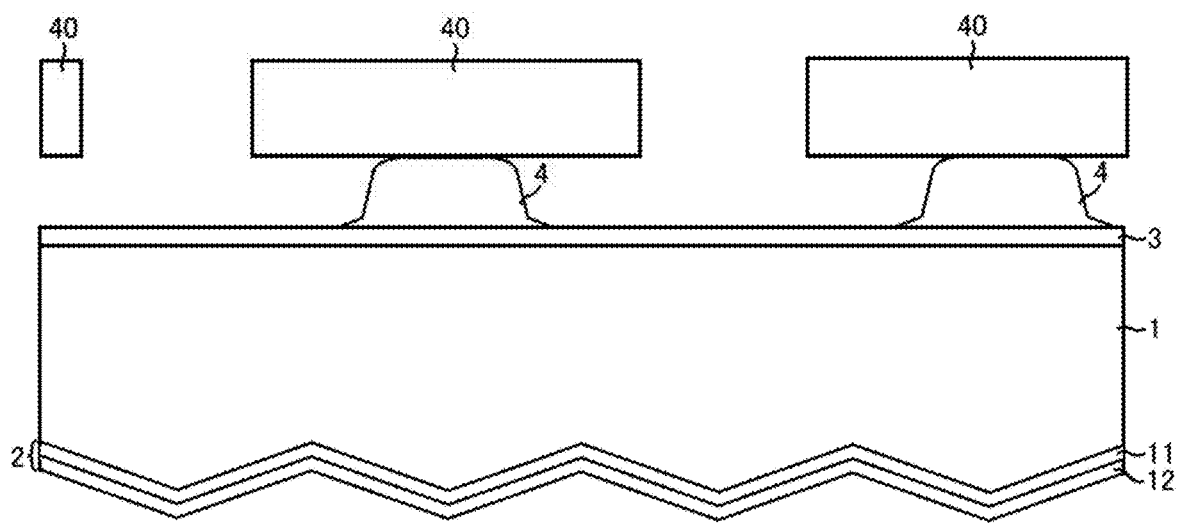
FIGS. 7H to 7J indicate a third process diagram illustrating the method of manufacturing the photovoltaic device illustrated in FIG. 1.

After the process of FIG. 6G, instead of the mask 30, a mask 40 is disposed on the passivation film 3 and the n-type amorphous semiconductor layer 4 (see the process of FIG. 7H). The mask 40 has a material, a thickness, and an opening width which are the same as those of the mask 30.

In the process of FIG. 7H, the mask 40 is illustrated so as to be separated from the passivation film 3. However, since the film thickness of the n-type amorphous semiconductor layer 4 is 3 to 50 nm (as described above), that is, significantly thin, the mask 40 is actually disposed to be close to the passivation film 3.

The temperature of the semiconductor substrate 1 is set to be 130° C. to 180° C. A $H_2$ gas of 0 to 100 sccm, a $SiH_4$ gas of 40 sccm, and a diborane ($B_2H_6$) gas of 40 sccm flow into the reaction chamber, and the pressure of the reaction chamber is set to be 40 to 200 Pa. Then, high-frequency power (13.56 MHz) in which RF power density is 5 to 15 mW/cm$^2$ is applied to the parallel plate electrode. The $B_2H_6$ gas is diluted by hydrogen, and the concentration of the $B_2H_6$ gas is, for example, 2%.

Figure 7I:
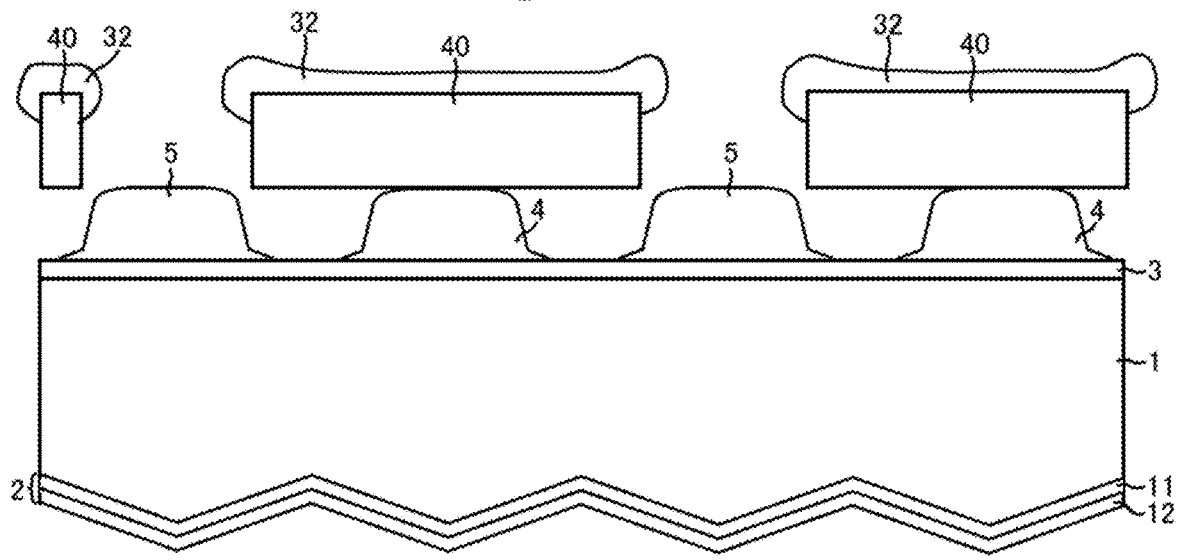

Thus, p-type amorphous silicon is deposited in a region of the passivation film 3, which is not covered by the mask 40, and thus the p-type amorphous semiconductor layer 5 is formed on the passivation film 3 (see the process of FIG. 7I).

In a case where the mask 40 is disposed on the passivation film 3 and the n-type amorphous semiconductor layer 4, a gap is provided between the mask 40 and the passivation film 3. As a result, active species such as SiH and $SiH_2$, which are decomposed by plasma wrap around the gap between the mask 40 and the passivation film 3, and thus the p-type amorphous semiconductor layer 5 is also formed in a part of the region which is covered by the mask 40. Thus, the p-type amorphous semiconductor layer 5 having the thickness reduction region TD is formed on the passivation film 3. p-type amorphous silicon 32 is also deposited on the mask 40.

The width and the film-thickness decrease rate of the thickness reduction region TD in the p-type amorphous semiconductor layer 5 are controlled by changing film formation pressure when the p-type amorphous semiconductor layer 5 is formed, the thickness of the mask 40, and an opening width of the mask 40. For example, if the thickness of the mask 40 is increased, the width of the thickness reduction region TD is increased.

Figure 7J:
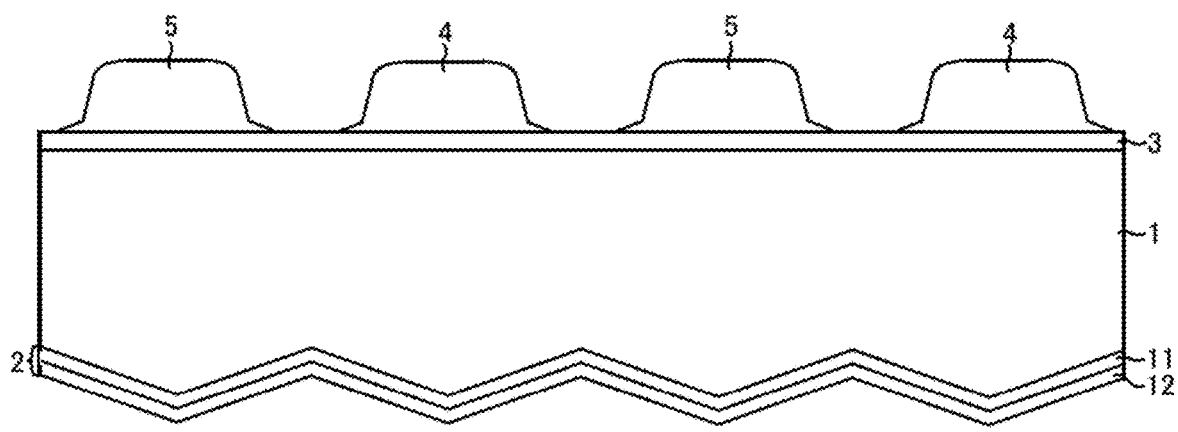

If the p-type amorphous semiconductor layer 5 is deposited, and then the mask 40 is removed, a state occurs where the n-type amorphous semiconductor layer 4 and the p-type amorphous semiconductor layer 5 alternately disposed to be paralleled with the direction of the surface of the semiconductor substrate 1 are formed on the passivation film 3 (see the process of FIG. 7J).

Figure 8K:
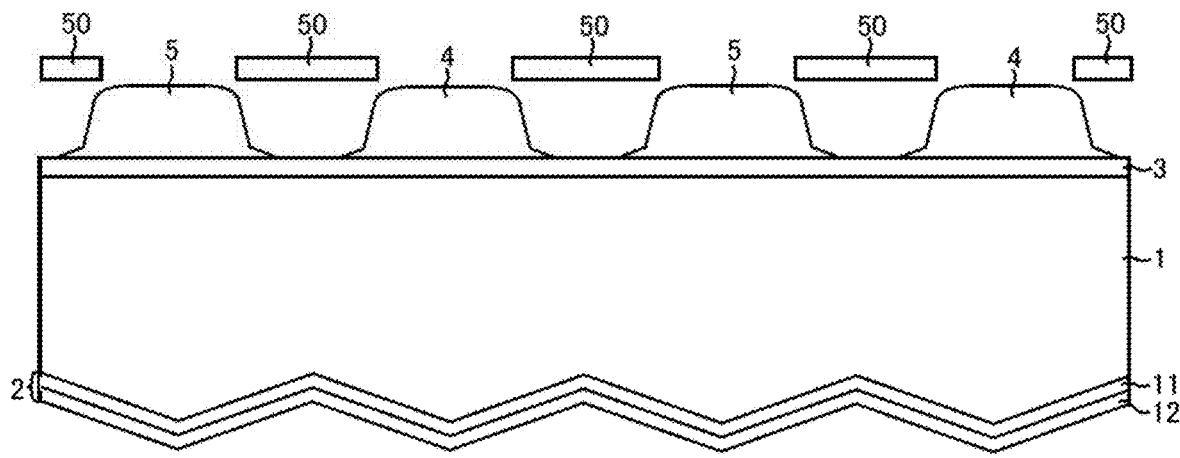
FIGS. 8K to 8M indicate a fourth process diagram illustrating the method of manufacturing the photovoltaic device illustrated in FIG. 1.

After the process of FIG. 7J, a mask 50 is disposed so that opening portions are positioned on the n-type amorphous semiconductor layer 4 and the p-type amorphous semiconductor layer 5 (see the process of FIG. 8K). The mask 50 has a material and a thickness which are the same as those of the mask 30. The opening width is set to be the summation of the width of the flat region FT in the n-type amorphous semiconductor layer 4 or the p-type amorphous semiconductor layer 5, and the width of two thickness reduction regions TD.

After the process of FIG. 8K, conductive layers 6a and 7a, and conductive layers 6b and 7b are sequentially deposited through the mask 50. Thus, electrodes 6 and 7 are deposited on the n-type amorphous semiconductor layer 4 and the p-type amorphous semiconductor layer 5, respectively (see the process of FIG. 8L.)

The conductive layers 6a and 7a, and the conductive layers 6b and 7b are formed by using a sputtering method, a vapor deposition method, an ion plating method, a thermal CVD method, a metal organic chemical vapour deposition (MOCVD) method, a sol-gel method, a method of spraying and heating a raw material which has a liquid phase, an ink jet method, or the like.

The conductive layers 6a and 7a are formed from, for example, ITO, IWO, or ZnO. The conductive layers 6b and 7b have a double-layer structure of Ti (3 nm)/Al (500 nm).

ITO is formed, for example, such that an argon gas or a gas mixture of an argon gas and an oxygen gas flows toward an ITO target doped with 0.5 to 4 wt % of $SnO_2$, and sputtering treatment is performed at a substrate temperature of 25° C. to 250° C., pressure of 0.1 to 1.5 Pa, and power of 0.01 to 2 kW.

ZnO is formed such that sputtering treatment is performed under similar conditions by using a ZnO target doped with 0.5 to 4 wt % of Al, instead of the ITO target.

The double-layer structure of Ti/Al is formed by EB vapor deposition.

Regarding the electrodes 6 and 7, the conductive layers 6a and 7a are used as seed electrodes, so as to form the conductive layers 6b and 7b by a plating film formation method, respectively. In this case, the conductive layers 6b and 7b are formed from, for example, any of Ni, W, Co, Ti, and Cr, alloys thereof, and alloys including P, B and the alloys of Ni, W, Co, Ti, and Cr. Cu, Al, Sn, and the like may be formed on the conductive layers 6b and 7b by a plating method.

Figure 8L:
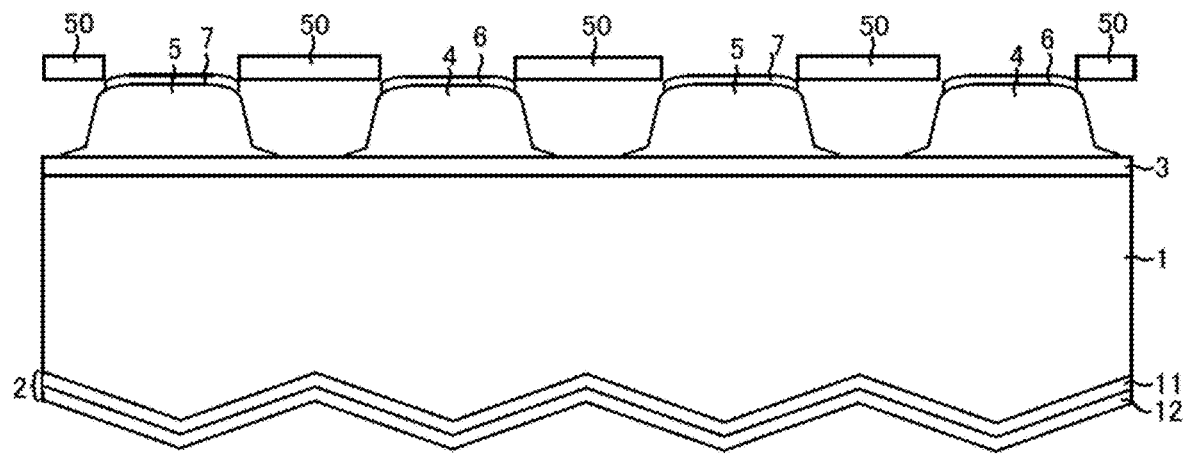
Figure 8M:
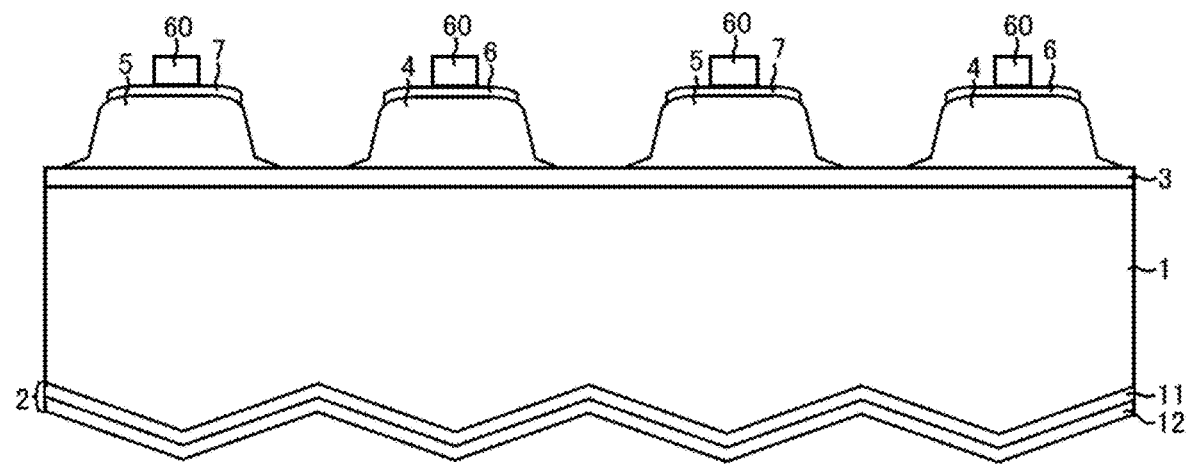
Figure 9N:
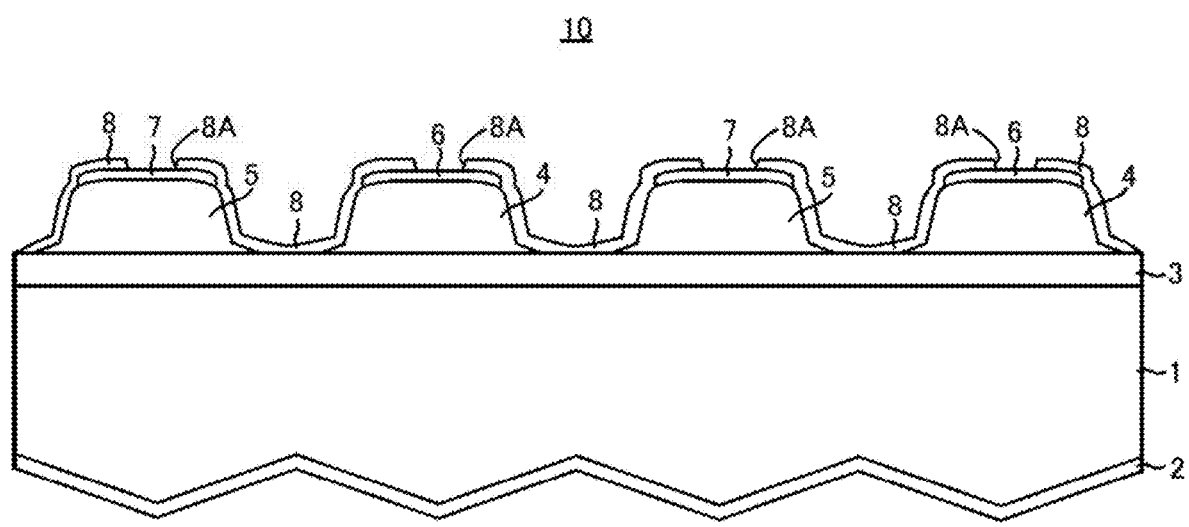
FIG. 9N indicates a fifth process diagram illustrating the method of manufacturing the photovoltaic device illustrated in FIG. 1.

After the process of FIG. 8L, a mask 60 is disposed on the electrodes 6 and 7 (see the process of FIG. 8M). The mask 60 has a material and a thickness which are the same as those of the mask 30.

A protective film 8 is formed on the passivation film 3, the n-type amorphous semiconductor layer 4, the p-type amorphous semiconductor layer 5, and the electrodes 6 and 7.

More specifically, an intrinsic amorphous semiconductor film and a silicon nitride film are sequentially deposited on the passivation film 3, the n-type amorphous semiconductor layer 4, the p-type amorphous semiconductor layer 5, and the electrodes 6 and 7 by using a plasma CVD method. In this case, the intrinsic amorphous semiconductor film is formed by using, for example, a $SiH_4$ gas as a material gas. The film thickness of the intrinsic amorphous semiconductor film is 10 nm, for example. The silicon nitride film is formed by using, for example, a $SiH_4$ gas and a NH3 gas as a material gas. The film thickness of the silicon nitride film is 120 nm, for example. Thus, a photovoltaic device 10 is completed (see the process of FIG. 9N).

In the above-described manufacturing method, it has been described that the masks 30, 40, 50, and 60 are formed from stainless steel. However, in the embodiments of the invention, it is not limited thereto. The masks 30, 40, 50, and 60 may be formed from copper, nickel, nickel alloys (42 alloy, invar material, and the like), molybdenum, or the like. The masks 30, 40, 50, and 60 may be formed from a glass mask, a ceramic mask, an organic film mask, or the like. Considering a relationship with the thermal expansion coefficient of the silicon substrate, and raw material cost, it is preferable that the material of the masks 30, 40, 50, and 60 is 42 alloy. Relating to the thermal expansion coefficient with the silicon substrate, in a case where the composition of nickel is about 36% and the composition of iron is 64%, the thermal expansion coefficient has the closest value, and thus it is possible to minimize an alignment error due to a thermal expansion coefficient difference. Accordingly, such a mask material may be used.

Relating to the thickness of the masks 30, 40, 50, and 60, from a viewpoint of suppressing an increase of running cost in production, a material which allows reproduction and multiple uses is preferable. In this case, film formation substances adhered to the masks 30, 40, 50, and 60 may be removed by using hydrofluoric acid or NaOH. Considering the number of times of reproducing the mask, the thickness of the masks 30, 40, 50, and 60 is preferably 30 µm to 300 µm.

In the above-described manufacturing method, it has been described that the intrinsic amorphous semiconductor film/ silicon nitride film constituting the protective film 8 is continuously formed in one reaction chamber. However, in the embodiments of the invention, it is not limited thereto, and a sample may be exposed once to the air such that after the intrinsic amorphous semiconductor layer is formed, the silicon nitride film is formed by a sputtering device or another CVD device.

In a case where the intrinsic amorphous semiconductor film/silicon nitride film constituting the protective film 8 is formed without being exposed to the air, it is possible to suppress contamination with an organic matter or moisture in the air. Thus, this case is preferable.

The protective film 8 may be formed by using EB vapor deposition, a sputtering method, a laser ablation method, a CVD method, or an ion plating method.

In the embodiments of the invention, after the passivation film 3 is formed, the formed passivation film 3 may be nitrided by a plasma CVD method using a nitrogen ($N_2$) gas, and thus a passivation film formed from SiON may be formed. As a result, it is possible to suppress diffusion of the dopants (B) in the p-type amorphous semiconductor layer 5 formed on the passivation film, into the semiconductor substrate 1. Even in a case where a passivation film having a film thickness which allows a tunneling current to flow therein is formed, it is possible to effectively suppress diffusion of boron (B). Thus, this case is preferable.

As described above, the n-type amorphous semiconductor layer 4 and the p-type amorphous semiconductor layer 5 are deposited on the semiconductor substrate 1 by using the masks 30 and 40. Thus, a gap region G is formed between the n-type amorphous semiconductor layer 4 and the p-type amorphous semiconductor layer 5 which are adjacent to each other. In a region between the electrodes 6 and 7 which are adjacent to each other, the protective film 8 is formed on the electrodes 6 and 7 and the gap region G (passivation film 3, n-type amorphous semiconductor layer 4, and p-type amorphous semiconductor layer 5).

As a result, even in a case where conductive dust is adhered between the electrodes 6 and 7 which are adjacent to each other, an occurrence of a short circuit is prevented.

Thus, it is possible to improve reliability of the photovoltaic device 10.

In the electrodes 6 and 7, a region of 5 µm or more from the ends toward the inner side is covered by the protective film 8. As a result, it is possible to efficiently suppress infiltration of moisture from an opening end of the protective film 8, to suppress peeling-off of the protective film 8, and to prevent a decrease of yield occurring by misalignment in production. Even in a case where adhesion between the semiconductor layer which is in contact with the electrodes 6 and 7, and the electrodes 6 and 7 is relatively weak, the electrodes 6 and 7 are covered by the protective film 8, and thus it is possible to efficiently suppress exfoliation of the electrodes. Thus, covering the electrodes 6 and 7 by the protective film in the above region is preferable.

Further, in the gap region G, the passivation film 3, the n-type amorphous semiconductor layer 4, and the p-type amorphous semiconductor layer 5 are covered by the protective film 8. As a result, it is possible to obtain long-term stability of the photovoltaic device 10.

Figure 10A:
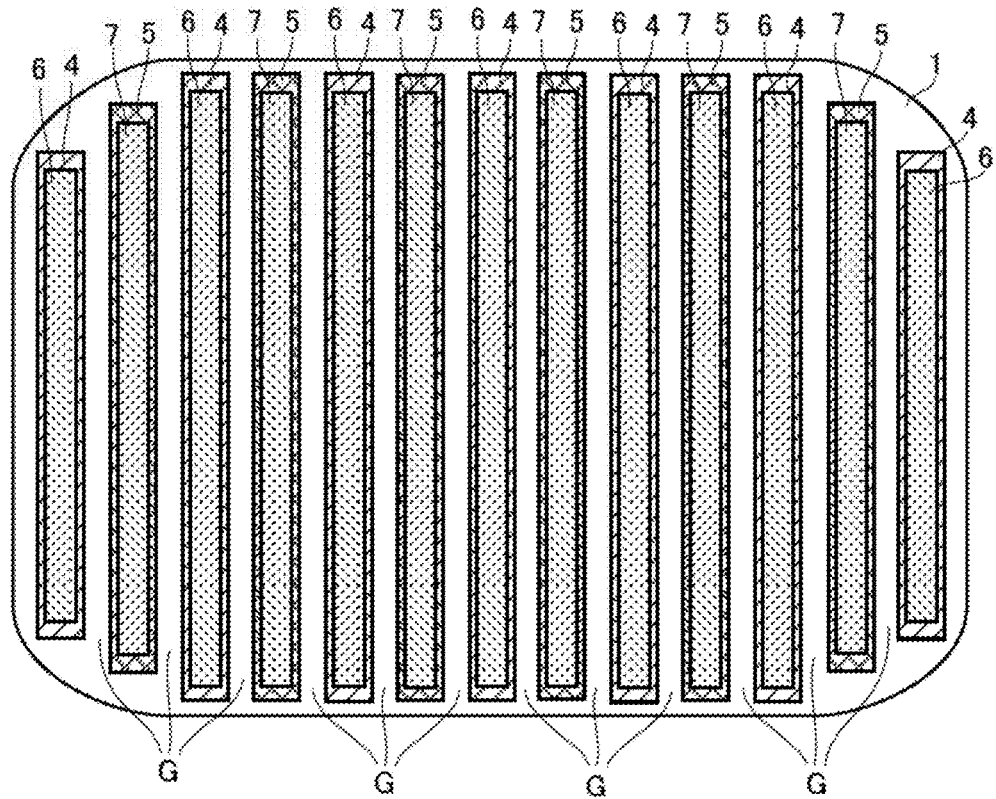
FIGS. 10A to 10B indicate a plan view when the photovoltaic device illustrated in FIG. 1 is viewed from a back surface side thereof.
Figure 10B:
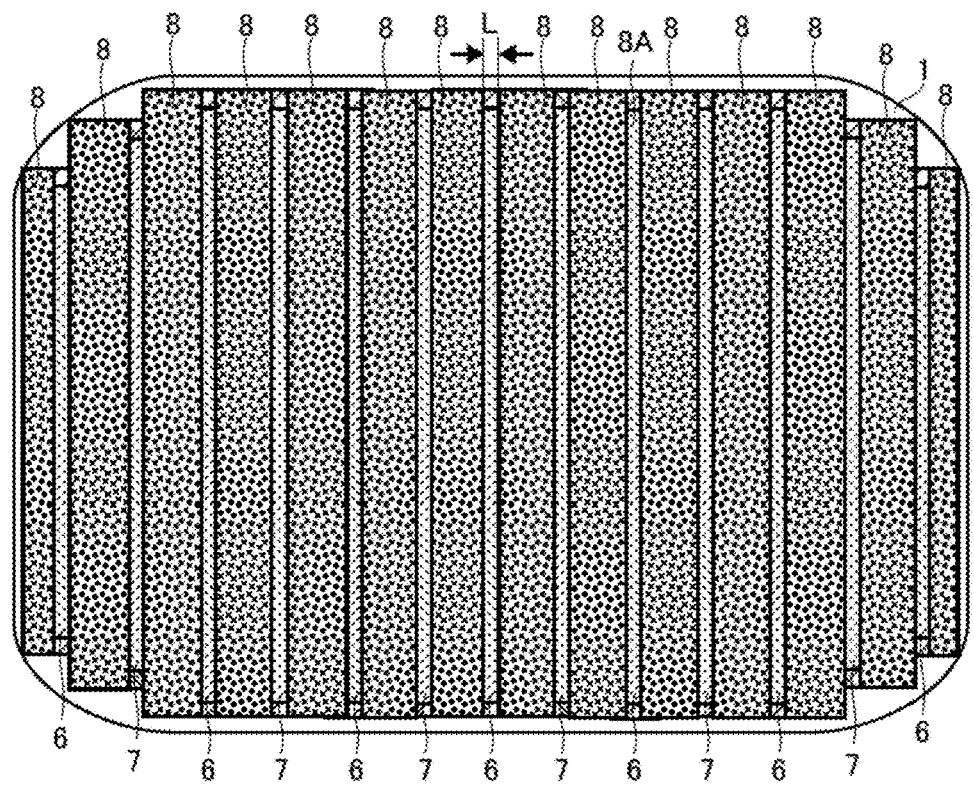

FIGS. 10A to 10B indicate a plan view when the photovoltaic device 10 illustrated in FIG. 1 is viewed from the back surface side thereof. With reference to FIG. 10A, the n-type amorphous semiconductor layer 4 and the p-type amorphous semiconductor layer 5 are alternately disposed at a desired interval paralleled with the direction of the surface of the semiconductor substrate 1. The electrodes 6 and 7 are disposed on the n-type amorphous semiconductor layer 4 and the p-type amorphous semiconductor layer 5, respectively. As a result, the gap region G is formed between the electrodes 6 and 7 which are adjacent to each other.

With reference to FIG. 10B, the protective film 8 is disposed on the gap region G and the peripheral region of the semiconductor substrate 1. The opening portions 8A having a width L are formed on the electrodes 6 and 7. The electrodes 6 and 7 are connected to a circuit sheet through the opening portions 8A.

In FIG. 10B, a region which is not covered by the protective film 8 remains in a peripheral portion of the semiconductor substrate 1. However, in the photovoltaic device 10, the state is most preferable in which the entirety of the back surface of the semiconductor substrate 1 is covered by the protective film and a portion of the electrodes 6 and 7 is exposed.

Figure 11:
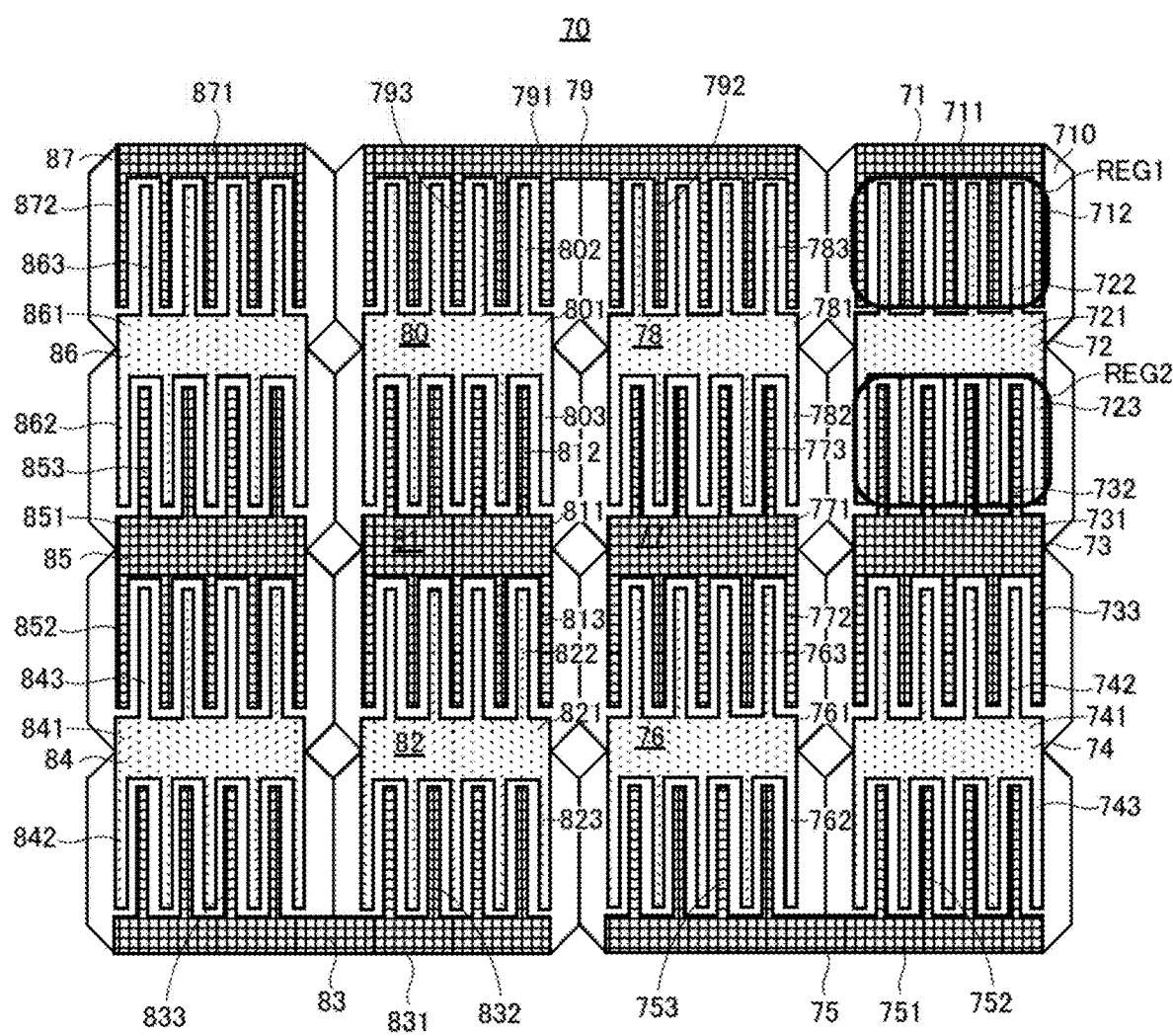
FIG. 11 is a plan view of a circuit sheet (Similar to Flexible Printed Circuits).

FIG. 11 is a plan view illustrating a circuit sheet. With reference to FIG. 11, a circuit sheet 70 includes an insulating substrate 710 and circuit materials 71 to 87.

The insulating substrate 710 may be made of electrically-insulating material, and a material to be used is not particularly limited. The insulating substrate 710 is formed from, for example, polyethylene terephthalate (PET), polyethylene naphthalate (PEN), polyphenylene sulfide (PPS), polyvinyl fluoride (PVF), polyimide, or the like.

The film thickness of the insulating substrate 710 is not particularly limited. However, the film thickness thereof is preferably 25 µm or more and 150 µm or less. The insulating substrate 710 may have a single-layer structure or a multi-layer structure of two layers or more.

The circuit material 71 has a bus bar portion 711 and a finger portion 712. The finger portion 712 has one end which is connected to the bus bar portion 711.

The circuit material 72 has a bus bar portion 721 and finger portions 722 and 723. The finger portion 722 has one end which is connected to the bus bar portion 721. The finger portion 723 has one end which is connected to the bus bar portion 721, on a side of the bus bar portion 721 opposite to a connection portion between the bus bar portion 721 and the finger portion 722.

The circuit material 73 has a bus bar portion 731 and finger portions 732 and 733. The finger portion 732 has one end which is connected to the bus bar portion 731. The finger portion 733 has one end which is connected to the bus bar portion 731, on a side of the bus bar portion 731 opposite to a connection portion between the bus bar portion 731 and the finger portion 732.

The circuit material 74 has a bus bar portion 741 and finger portions 742 and 743. The finger portion 742 has one end which is connected to the bus bar portion 741. The finger portion 743 has one end which is connected to the bus bar portion 741, on a side of the bus bar portion 741 opposite to a connection portion between the bus bar portion 741 and the finger portion 742.

The circuit material 75 has a bus bar portion 751 and finger portions 752 and 753. The finger portions 752 and 753 are disposed to be adjacent to each other in a length direction of the bus bar portion 751. One ends of the finger portions 752 and 753 are connected to the bus bar portion 751 on the same side of the bus bar portion 751.

The circuit material 76 has a bus bar portion 761 and finger portions 762 and 763. The finger portion 762 has one end which is connected to the bus bar portion 761. The finger portion 763 has one end which is connected to the bus bar portion 761, on a side of the bus bar portion 761 opposite to a connection portion between the bus bar portion 761 and the finger portion 762.

The circuit material 77 has a bus bar portion 771 and finger portions 772 and 773. The finger portion 772 has one end which is connected to the bus bar portion 771. The finger portion 773 has one end which is connected to the bus bar portion 771, on a side of the bus bar portion 771 opposite to a connection portion between the bus bar portion 771 and the finger portion 772.

The circuit material 78 has a bus bar portion 781 and finger portions 782 and 783. The finger portion 782 has one end which is connected to the bus bar portion 781. The finger portion 783 has one end which is connected to the bus bar portion 781, on a side of the bus bar portion 781 opposite to a connection portion between the bus bar portion 781 and the finger portion 782.

The circuit material 79 has a bus bar portion 791 and finger portions 792 and 793. The finger portions 792 and 793 are disposed to be adjacent to each other in a length direction of the bus bar portion 791. One ends of the finger portions 792 and 793 are connected to the bus bar portion 791 on the same side of the bus bar portion 791.

The circuit material 80 has a bus bar portion 801 and finger portions 802 and 803. The finger portion 802 has one end which is connected to the bus bar portion 801. The finger portion 803 has one end which is connected to the bus bar portion 801, on a side of the bus bar portion 801 opposite to a connection portion between the bus bar portion 801 and the finger portion 802.

The circuit material 81 has a bus bar portion 811 and finger portions 812 and 813. The finger portion 812 has one end which is connected to the bus bar portion 811. The finger portion 813 has one end which is connected to the bus bar portion 811, on a side of the bus bar portion 811 opposite to a connection portion between the bus bar portion 811 and the finger portion 812.

The circuit material 82 has a bus bar portion 821 and finger portions 822 and 823. The finger portion 822 has one end which is connected to the bus bar portion 821. The finger portion 823 has one end which is connected to the bus bar portion 821, on a side of the bus bar portion 821 opposite to a connection portion between the bus bar portion 821 and the finger portion 822.

The circuit material 83 has a bus bar portion 831 and finger portions 832 and 833. The finger portions 832 and 833 are disposed to be adjacent to each other in a length direction of the bus bar portion 831. One ends of the finger portions 832 and 833 are connected to the bus bar portion 831 on the same side of the bus bar portion 831.

The circuit material 84 has a bus bar portion 841 and finger portions 842 and 843. The finger portion 842 has one end which is connected to the bus bar portion 841. The finger portion 843 has one end which is connected to the bus bar portion 841, on a side of the bus bar portion 841 opposite to a connection portion between the bus bar portion 841 and the finger portion 842.

The circuit material 85 has a bus bar portion 851 and finger portions 852 and 853. The finger portion 852 has one end which is connected to the bus bar portion 851. The finger portion 853 has one end which is connected to the bus bar portion 851, on a side of the bus bar portion 851 opposite to a connection portion between the bus bar portion 851 and the finger portion 852.

The circuit material 86 has a bus bar portion 861 and finger portions 862 and 863. The finger portion 862 has one end which is connected to the bus bar portion 861. The finger portion 863 has one end which is connected to the bus bar portion 861, on a side of the bus bar portion 861 opposite to a connection portion between the bus bar portion 861 and the finger portion 862.

The circuit material 87 has a bus bar portion 871 and a finger portion 872. The finger portion 872 has one end which is connected to the bus bar portion 871.

The circuit material 71 is disposed on the insulating substrate 710 such that the finger portion 712 is alternated with the finger portion 722 of the circuit material 72.

The circuit material 72 is disposed on the insulating substrate 710 such that the finger portion 722 is alternated with the finger portion 712 of the circuit material 71 and such that the finger portion 723 is alternated with the finger portion 732 of the circuit material 73.

The circuit material 73 is disposed on the insulating substrate 710 such that the finger portion 732 is alternated with the finger portion 723 of the circuit material 72 and such that the finger portion 733 is alternated with the finger portion 742 of the circuit material 74.

The circuit material 74 is disposed on the insulating substrate 710 such that the finger portion 742 is alternated with the finger portion 733 of the circuit material 73 and such that the finger portion 743 is alternated with the finger portion 752 of the circuit material 75.

The circuit material 75 is disposed on the insulating substrate 710 such that the finger portion 752 is alternated with the finger portion 743 of the circuit material 74 and such that the finger portion 753 is alternated with the finger portion 762 of the circuit material 76.

The circuit material 76 is disposed on the insulating substrate 710 such that the finger portion 762 is alternated with the finger portion 753 of the circuit material 75 and such that the finger portion 763 is alternated with the finger portion 772 of the circuit material 77.

The circuit material 77 is disposed on the insulating substrate 710 such that the finger portion 772 is alternated with the finger portion 763 of the circuit material 76 and such that the finger portion 773 is alternated with the finger portion 782 of the circuit material 78.

The circuit material 78 is disposed on the insulating substrate 710 such that the finger portion 782 is alternated with the finger portion 773 of the circuit material 77 and such that the finger portion 783 is alternated with the finger portion 792 of the circuit material 79.

The circuit material 79 is disposed on the insulating substrate 710 such that the finger portion 792 is alternated with the finger portion 783 of the circuit material 78 and such that the finger portion 793 is alternated with the finger portion 802 of the circuit material 80.

The circuit material 80 is disposed on the insulating substrate 710 such that the finger portion 802 is alternated with the finger portion 793 of the circuit material 79 and such that the finger portion 803 is alternated with the finger portion 812 of the circuit material 81.

The circuit material 81 is disposed on the insulating substrate 710 such that the finger portion 812 is alternated with the finger portion 803 of the circuit material 80 and such that the finger portion 813 is alternated with the finger portion 822 of the circuit material 82.

The circuit material 82 is disposed on the insulating substrate 710 such that the finger portion 822 is alternated with the finger portion 813 of the circuit material 81 and such that the finger portion 823 is alternated with the finger portion 832 of the circuit material 83.

The circuit material 83 is disposed on the insulating substrate 710 such that the finger portion 832 is alternated with the finger portion 823 of the circuit material 82 and such that the finger portion 833 is alternated with the finger portion 842 of the circuit material 84.

The circuit material 84 is disposed on the insulating substrate 710 such that the finger portion 842 is alternated with the finger portion 833 of the circuit material 83 and such that the finger portion 843 is alternated with the finger portion 852 of the circuit material 85.

The circuit material 85 is disposed on the insulating substrate 710 such that the finger portion 852 is alternated with the finger portion 843 of the circuit material 84 and such that the finger portion 853 is alternated with the finger portion 862 of the circuit material 86.

The circuit material 86 is disposed on the insulating substrate 710 such that the finger portion 862 is alternated with the finger portion 853 of the circuit material 85 and such that the finger portion 863 is alternated with the finger portion 872 of the circuit material 87.

The circuit material 87 is disposed on the insulating substrate 710 such that the finger portion 872 is alternated with the finger portion 863 of the circuit material 86.

Each of the circuit materials 71 to 87 is not particularly limited as long as the material is electrically conductive. Each of the circuit materials 71 to 87 is formed from, for example, Cu, Al, Ag, and alloys which have Cu, Al, and Ag as the main component.

The thickness of the circuit materials 71 to 87 is not particularly limited, and, for example, a range of 10 μm or more and 80 μm or less is appropriate. In a range being less than 10 μm, circuit resistance is increased. If the thickness is more than 80 μm, warpage occurs in the silicon substrate due to a difference in a thermal expansion coefficient between the circuit material and the silicon substrate. The difference of a thermal expansion coefficient occurs by heat applied when the circuit materials 71 to 87 stick to the photovoltaic device 10.

The shape of the insulating substrate 710 is not limited to the shape illustrated in FIG. 11, and may be appropriately changed. A conductive material such as Ni, Au, Pt, Pd, Sn, In, and ITO may be formed at a portion of the surface of the circuit materials 71 to 87. In this manner, forming a conductive material such as Ni on the portion of the surface of the circuit materials 71 to 87 is performed in order to maintain good electrical connection between the circuit materials 71 to 87 and the electrodes 6 and 7 of the photovoltaic device 10 and to improve weather resistance of the circuit materials 71 to 87. Further, the circuit materials 71 to 87 may have a single-layer structure or a multilayer structure.

A photovoltaic device 10 is disposed on a region REG1 so that the electrode 6 is connected to the finger portion 712 of the circuit material 71 and the electrode 7 is connected to the finger portion 722 of the circuit material 72. A photovoltaic device 10 is disposed on a region REG2 so that the electrode 6 is connected to the finger portion 723 of the circuit material 72 and the electrode 7 is connected to the finger portion 732 of the circuit material 73. After that, a photovoltaic device 10 are disposed on the circuit materials 73 to 87 in a similar manner. Thus, 16 photovoltaic device 10 are connected in series.

The electrodes 6 and 7 of the photovoltaic device 10 are connected to the circuit materials 71 to 87 by an adhesive. The adhesive is formed from one or more of adhesive materials selected from a group consisting of, for example, soldering resin, solder, a conductive adhesive, a thermosetting Ag paste, a low-temperature curing copper paste, an anisotropic conductive film (ACF), an anisotropic conductive paste (ACP), and a non-conductive paste (NCP).

For example, as the soldering resin, TCAP-5401-27 and the like manufactured by Tamura Kaken Corp. may be used.

As a non-conductive paste, epoxy resin, acrylic resin, urethane resin, or the like may be used, and thermosetting resin or a photocuring resin may be used.

As the conductive adhesive, soldering particles or the like containing at least one of tin and bismuth may be used. More preferably, the conductive adhesive is an alloy of tin with bismuth, indium, silver, or the like. Thus, it is possible to lower a soldering melting point, and to perform an adhering process at a low temperature.

In a case using a photovoltaic device 10 in which the protective film 8 is formed on the n-type amorphous semiconductor layer 4, the p-type amorphous semiconductor layer 5, and the electrodes 6 and 7, an inorganic insulating film is provided on the electrodes 6 and 7, and an inorganic insulating film is provided on the n-type amorphous semiconductor layer 4 and the p-type amorphous semiconductor layer 5. The two inorganic insulating films have different underlying layers. In the photovoltaic device 10, inorganic insulating films having different underlying layers are continuously formed. In such a situation, if heat history is applied to the inorganic insulating films having different underlying layers, peeling-off of an inorganic insulating film may occur due to a difference in the thermal expansion coefficient between the underlying layers.

Thus, a thermal process at a low temperature, particularly, at 200° C. or lower is preferable. As a result, curing is performed at a low temperature. A thermosetting Ag paste, a low-temperature curing copper paste, an anisotropic conductive film, and an anisotropic conductive paste which allow electric bonding are particularly preferable.

As described above, the photovoltaic device 10 disposed on the circuit sheet 70 is disposed between ethylene vinyl acetate resin (EVA resin) disposed on a glass substrate, and EVA resin disposed on a PET film. The EVA resin on the glass substrate side is crimped onto the photovoltaic device 10 by vacuum crimping using a laminator device, and the EVA resin on the PET film side is heated to 155° C. in a state of being crimped onto the photovoltaic device 10, so as to perform curing. Thus, the photovoltaic device 10 having the circuit sheet 70 attached thereto is sealed in the EVA resin cured between the glass substrate and the PET film, and thus it is possible to manufacture a photovoltaic module.

[Insulating Properties]

Yield of a photovoltaic module including a photovoltaic device 10 is evaluated while the width of the gap region G, a pitch X between adjacent opening portions 8A, and the opening width L of the opening portion 8A are changed in the photovoltaic device 10.

FIG. 12 is a diagram illustrating yield of a photovoltaic module when the width of the gap region G, the pitch X between adjacent opening portions 8A, and the opening width L of the opening portion 8A are changed.

In FIG. 12, a photovoltaic module including a photovoltaic device which has been manufactured without forming a protective film is used as a comparative example. Eight photovoltaic devices 10 were disposed on the circuit sheet 70, and were modularized by the above-described method, thereby manufacturing a photovoltaic module. Current-voltage characteristics (I-V characteristics) of the photovoltaic module were measured so as to obtain yield.

With reference to FIG. 12, in Comparative Examples 1 and 2, the yield is about 70%, that is, a small value. As a result of examining the cause, the followings were understood. When the circuit sheet and the photovoltaic device were bonded to each other, fine conductive matters such as dust were attached to the gap region G, and thus an n-electrode connected to the n-type amorphous semiconductor layer and a p-electrode connected to the p-type amorphous semiconductor layer had a short circuit. This was the cause of the low yield. Dust was silicon pieces and the like generated when the periphery of the wafer was slightly cracked.

In this manner, if the width of the gap region G between the p-electrode and the n-electrode becomes narrow, the yield tends to be reduced due to the occurrence of a short circuit. The reduction of the yield after modularization occurs at the final stage of the processes. Thus, monetary loss is large, and this is a problem not to be ignored.

In a case using a photovoltaic device 10 in which the protective film 8 was formed, the yield of a photovoltaic module was more than 90%. Thus, the reduction of the yield occurring by a short circuit between electrodes, which had been a problem was not shown. It was understood that the protective film 8 was provided, and thus it was possible to suppress the occurrence of a short circuit between the electrodes.

Considering ensuring the insulating properties, the thickness of the inorganic insulating film is preferably equal to or more than 20 nm, and is more preferably equal to or more than 40 nm. If the film thickness is equal to or more than 1 μm, internal stress of the inorganic insulating film on the electrode may cause the inorganic insulating film to be peeled off. Thus, this case is not preferable.

In the opening portion 8A of the protective film 8, the electrodes 6 and 7 are exposed as the underlying layers, and the electrodes 6 and 7 are connected to the circuit material by the above-described adhesive. Thus, if the opening portion 8A is narrow, contact resistance is increased. Thus, the width L of the opening portion 8A is required to be equal to or more than 20 μm. More preferably, the width L of the opening portion 8A is equal to or more than 100 μm. Generally, the width of the electrodes 6 and 7 illustrated in FIG. 1 is equal to or more than 200 μm. The width L of the opening portion 8A is smaller than the width of the electrodes 6 and 7. If connection between the electrodes 6 and 7 and the circuit material is considered, the opening portion 8A is preferably on the electrodes 6 and 7. That is, the width L of the opening portion 8A is equal to or more than 20 μm, and it is preferable that the width L of the opening portion 8A is narrower than the width of the electrodes 6 and 7, and is on the electrodes 6 and 7.

Further, in a case where the width of the electrode 6 is compared with the width of the electrode 7, it is preferable that the width of the opening portion 8A on the electrode (any of the electrodes 6 and 7) having a narrow width is wide. Setting in this manner is performed, and thus it is possible to suppress an increase of the contact resistance.

[Moisture Resistance]

FIG. 13 is a diagram illustrating a result of a moisture-resistance test. With reference to FIG. 13, i indicates intrinsic amorphous silicon. i/n indicates a laminated film of intrinsic amorphous silicon and n-type amorphous silicon. i/SiN indicates a laminated film of intrinsic amorphous silicon and silicon nitride.

i/n/SiN indicates a laminated film of intrinsic amorphous silicon, n-type amorphous silicon, and silicon nitride. i/SiON indicates a laminated film of intrinsic amorphous silicon and silicon oxynitride. i/SiO$_2$ indicates a laminated film of intrinsic amorphous silicon and silicon dioxide. i/TiO$_2$ indicates a laminated film of intrinsic amorphous silicon and titanium dioxide.

The concentration of P in n-type amorphous silicon is $1\times10^{20}$ cm$^{-3}$.

An amorphous semiconductor film illustrated in FIG. 13 is formed on a silicon substrate. Immediately after film formation, a lifetime of the minority carriers in a sample is measured by using the μPCD (microwave Photo Conductivity Decay) method. In the μPCD method, a state where the surface of the semiconductor layer is irradiated with a laser beam, and thus carriers are induced to the semiconductor layer, and a state where irradiation with a laser beam is stopped and thus the induced carriers disappear are made so as to measure the lifetime of the carriers. In order to measure the amount of the carriers, a microwave is applied onto the surface of the semiconductor layer, and thus reflectance of the microwave is measured.

Then, the lifetime of the minority carriers are measured after three days and eight days under the same conditions.

FIG. 13 illustrates the lifetime where the lifetime immediately after film formation is used as a reference.

As illustrated in FIG. 13, in an amorphous semiconductor film of amorphous silicon and the like, moisture (H$_2$O, OH group and the like) from the atmosphere is diffused, and thus the lifetime after the three days and the eight days is significantly reduced in comparison to that immediately after film formation (see Sample 1 to Sample 4).

The reason is as follows. An amorphous film has film density lower than that of a monocrystalline film having the same composition, and contains many voids in the film. The reason of the refractive index of the amorphous film being lower than that of crystal is considered that the many voids are contained. In a case where the film thickness is thin, obtaining the effect regarding moisture resistance is difficult due to the existence of the voids. It is considered that, in the film thickness of several nm to about 30 nm, the amorphous semiconductor layer absorbs moisture from the outside, and thus passivation characteristics at a crystal-silicon interface may be degraded.

In a case where any of SiN, SiON, and SiO$_2$ is formed on the amorphous semiconductor layer, the lifetime after three days and eight days maintains the lifetime immediately after film formation. In a case where TiO$_2$ is formed on the amorphous semiconductor layer, the lifetime after three days and eight days is reduced from the lifetime immediately after film formation by about ten percent, and is maintained (see Sample 5 to Sample 9).

As described above, it is understood that an inorganic insulating film (SiN and the like) is formed on the amorphous semiconductor layer, and thus it is possible to suppress absorption of moisture and to suppress reduction of the lifetime.

In a case where a thermal oxide film (2 nm) is formed on the silicon substrate, the lifetime after eight days is reduced by about forty percent of the lifetime immediately after film formation. Thus, it is understood that covering the surface of the silicon substrate with intrinsic amorphous silicon is important for suppressing the reduction of the lifetime (see Sample 5 to Sample 10).

As described above, it is understood that an inorganic insulating film is formed on the amorphous semiconductor layer, and thus it is possible to ensure moisture resistance, and to suppress change of passivation characteristics according to time.

From such knowledge, a structure in which an inorganic insulating film is formed on the amorphous semiconductor layer is employed, and thus it is possible to realize electrical insulating properties and moisture resistance.

Thus, an inorganic insulating film is employed as the protective film 8, and thus it is possible to simultaneously realize prevention of the occurrence of a short circuit between the electrodes 6 and 7, improvement of moisture resistance in the gap region G, and improvement of the passivation characteristics by forming the protective film 8, in combination of the passivation film 3, the n-type amorphous semiconductor layer 4, and the p-type amorphous semiconductor layer 5.

The protective film 8 is constituted by a double-layer structure in which an inorganic insulating film is formed on the amorphous semiconductor layer, and thus it is possible to realize electrical insulating properties and moisture resistance. Accordingly, this is preferable.

Considering the moisture resistance, the film thickness of the inorganic insulating film is preferably equal to or more than 20 nm. If the inorganic insulating film is a silicon nitride film or a silicon oxynitride film having high moisture resistance, the film thickness is preferably equal to or more than 10 nm.

Regarding the region in which the electrodes 6 and 7 are formed, a metal electrode or/and a TCO electrode are formed. Because the metal electrode or/and the TCO electrode ensure the moisture resistance, it is possible to ensure moisture resistance relating to the opening portion 8A of the protective film 8 on the metal electrode or/and the TCO electrode.

Since the protective film 8 is formed at a part of a region on the electrodes 6 and 7 similarly to that of the gap region G, the surface of the electrodes 6 and 7 on a lower side of the protective film 8 is protected by the protective film 8, and it is possible to appropriately prevent oxidation, discoloring, and the like of the surface. As a result, it is possible to ensure long-term reliability of the electrodes 6 and 7, and thus this is preferable.

As described above, forming the protective film 8 on the electrodes 6 and 7 and on the gap region G is preferable because of improving the insulating properties and the moisture resistance. The protective film on the electrodes 6 and 7 and the protective film on the gap region G are not necessarily a continuous film. However, forming the protective film as a continuous film is more preferable because of allowing reduction of man-hours of the process, and of causing the film properties to be constant and uniform.

[Thermal Resistance]

As described above, when the photovoltaic device 10 is modularized, a process of bonding the photovoltaic device 10 and the circuit sheet 70 by using a conductive adhesive or an insulating adhesive is provided, and a heating process of about 180° C. for about 20 minutes is provided.

Regarding a case where heat history of 180° C. and twenty minutes is inserted, the lifetime of the minority carriers in the gap region G and the peripheral portion of the wafer was examined in a case where the protective film 8 is provided on the gap region G and an amorphous semiconductor layer of the peripheral portion of a wafer, and a case where the protective film 8 is not provided.

In a case where the protective film 8 was not provided on the amorphous semiconductor layer, the lifetime of the minority carriers, which was about 2000 μs in general, was reduced to 500 μs.

In a case where the protective film 8 was provided on the amorphous semiconductor layer, the lifetime of the minority carriers was reduced to 1600 μs and maintained.

As described above, it is understood that when the protective film 8 is provided in the gap region G and the peripheral portion of the wafer, it is possible to suppress reduction of the lifetime of the minority carriers in the entirety of the wafer.

Since the inorganic insulating film (protective film 8) is also provided on the electrodes 6 and 7, and the electrodes 6 and 7 assist heat dissipation of the inorganic insulating film, more preferable effect regarding thermal resistance is obtained.

Embodiment 2

Figure 14:
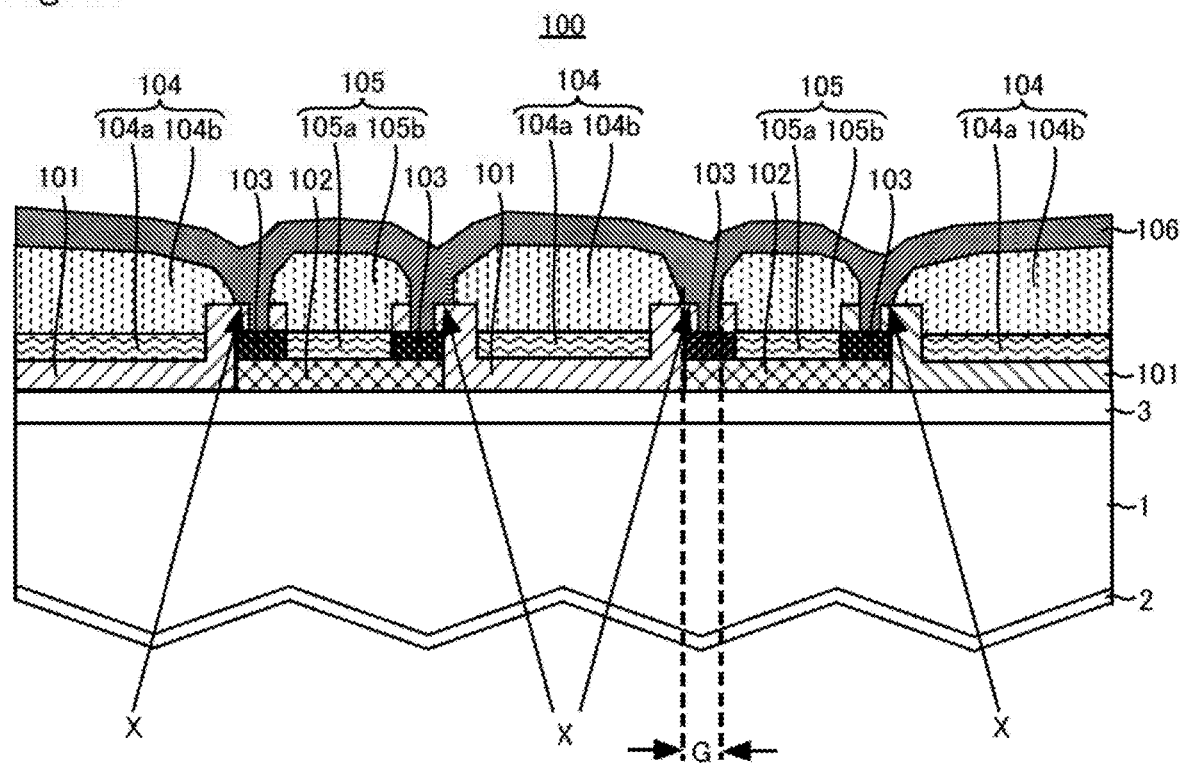
FIG. 14 is a schematic diagram illustrating a configuration of a photovoltaic device according to Embodiment 2.

FIG. 14 is a schematic diagram illustrating a configuration of a photovoltaic device according to Embodiment 2. With reference to FIG. 14, a photovoltaic device 100 according to Embodiment 2 includes a n-type amorphous semiconductor layer 101, a p-type amorphous semiconductor layer 102, an insulating film 103, electrodes 104 and 105, and a protective film 106, instead of the n-type amorphous semiconductor layer 4, the p-type amorphous semiconductor layer 5, the electrodes 6 and 7, and the protective film 8 of the photovoltaic device 10 illustrated in FIG. 1. Other components are the same as those of the photovoltaic device 10.

The n-type amorphous semiconductor layer 101 is disposed on a passivation film 3, on the back surface side of the semiconductor substrate 1 so as to be in contact with the passivation film 3.

The p-type amorphous semiconductor layer 102 is disposed on the passivation film 3 so as to be adjacent to the n-type amorphous semiconductor layer 101 paralleled with the direction of the surface of the semiconductor substrate 1, and to be in contact with the passivation film 3.

The n-type amorphous semiconductor layer 101 and the p-type amorphous semiconductor layer 102 are alternately disposed to be paralleled with the direction of the surface of the semiconductor substrate 1.

The insulating film 103 is disposed between the p-type amorphous semiconductor layer 102, and the n-type amorphous semiconductor layer 101 and the protective film 106, so as to be in contact with the n-type amorphous semiconductor layer 101, the p-type amorphous semiconductor layer 102, and the protective film 106.

The electrode 104 is disposed on the n-type amorphous semiconductor layer 101 so as to be in contact with the n-type amorphous semiconductor layer 101.

The electrode 104 includes a seed layer 104a and a plated layer 104b. The seed layer 104a is disposed on the n-type amorphous semiconductor layer 101, so as to be in contact with the n-type amorphous semiconductor layer 101. The plated layer 104b is disposed on the n-type amorphous semiconductor layer 101 and the seed layer 104a, so as to be in contact with the n-type amorphous semiconductor layer 101 and the seed layer 104a.

The electrode 105 is disposed on the p-type amorphous semiconductor layer 102, so as to be in contact with the p-type amorphous semiconductor layer 102.

The electrode 105 includes a seed layer 105a and a plated layer 105b. The seed layer 105a is disposed on the p-type amorphous semiconductor layer 102, so as to be in contact with the p-type amorphous semiconductor layer 102 and the insulating film 103. The plated layer 105b is disposed on the seed layer 105a to be in contact with the seed layer 105a.

The protective film 106 is disposed on the n-type amorphous semiconductor layer 101, the insulating film 103, and the electrodes 104 and 105, so as to be in contact with the n-type amorphous semiconductor layer 101, the insulating film 103, and the electrodes 104 and 105.

The n-type amorphous semiconductor layer 101 is formed from the same material as that of the n-type amorphous semiconductor layer 4, and has the same film thickness as that of the n-type amorphous semiconductor layer 4.

The p-type amorphous semiconductor layer 102 is formed from the same material as that of the p-type amorphous semiconductor layer 5, and has the same film thickness as that of the p-type amorphous semiconductor layer 5.

The insulating film 103 is formed from a silicon oxide film, a silicon nitride film, and a silicon oxynitride film, and the like. The film thickness of the insulating film 103 is substantially the same as the film thickness of the seed layer 5a.

Each of the seed layers 104a and 105a is formed from, for example, metal such as Cu, Al, Ag, Au, Pt, Ti, Ni, W, Co, and Cr, or alloys containing at least one of the above-described metals.

The film thickness of each of the seed layers 104a and 105a is not particularly limited. However, for example, the film thickness thereof is about 20 nm to 500 nm.

Each of the plated layers 104b and 105b is formed from, for example, metal such as Cu, Al, Ag, Au, Pt, Sn, and Ni, or alloys containing at least one of the above-described metals.

The film thickness of each of the plated layers 104b and 105b is not particularly limited. However, for example, the film thickness thereof is about 2 μm to 50 μm.

The protective film 106 is formed from the same material as that of the protective film 8. The film thickness of the protective film 106 is, for example, 100 nm.

In Embodiment 2, the protective film 106 has a double-layer structure of an oxide film of titanium and a silicon nitride film, considering adhesion to the plated layers 104b and 105b.

In the photovoltaic device 100, an X region of the n-type amorphous semiconductor layer 101 is not covered by the electrode 104, but is covered by the protective film 106. Thus, it is possible to suppress inflow and mixing of moisture and the like into the n-type amorphous semiconductor layer 101, and to realize moisture resistance.

Figure 15A:
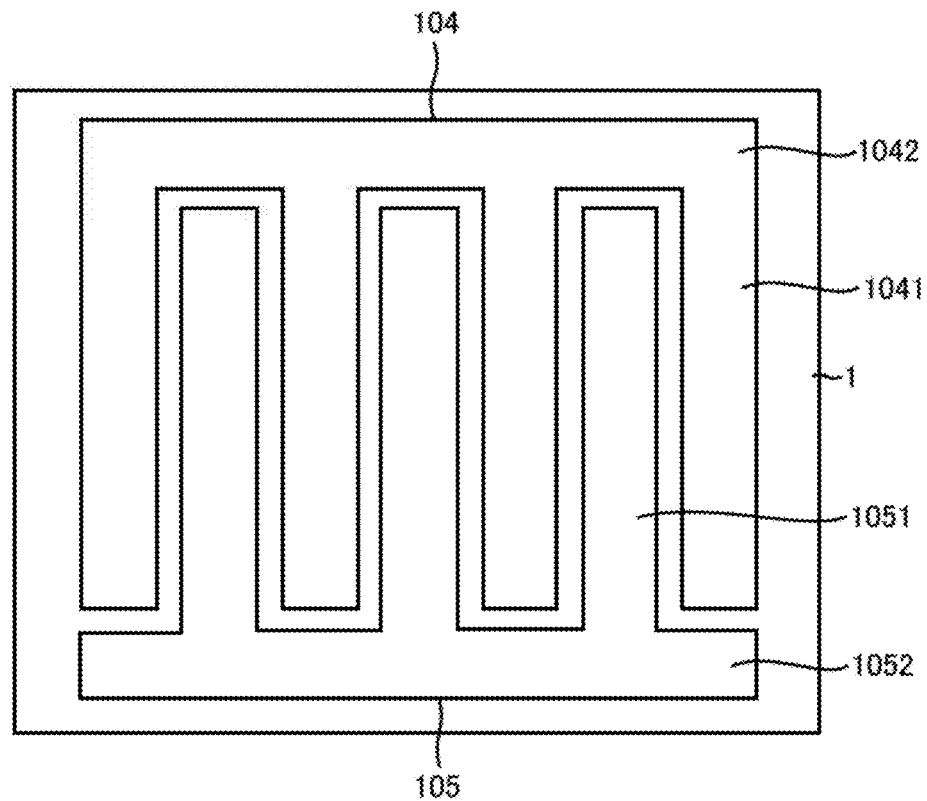
FIGS. 15A to 15B indicate a plan view when the photovoltaic device illustrated in FIG. 14 is viewed from a back surface side thereof.

FIG. 15 is a plan view when the photovoltaic device 100 illustrated in FIG. 14 is viewed from the back surface side thereof. With reference to FIG. 15A, each of the electrodes 104 and 105 has a comb-type planar shape. The electrode 104 includes a finger portion 1041 and a bus bar portion 1042. The finger portion 1041 has one end which is connected to the bus bar portion 1042. The electrode 105 includes a finger portion 1051 and a bus bar portion 1052. The finger portion 1051 has one end which is connected to the bus bar portion 1052.

The finger portion 1041 of the electrode 104 is alternated with the finger portion 1051 of the electrode 105.

In a case where the plated layers 104b and 105b of the electrodes 104 and 105 are formed, a current is applied to the bus bar portions 1042 and 1052, and thus the plated layers 104b and 105b are formed on the seed layers 104a and 105a by an electric-field plating method.

Figure 15B:
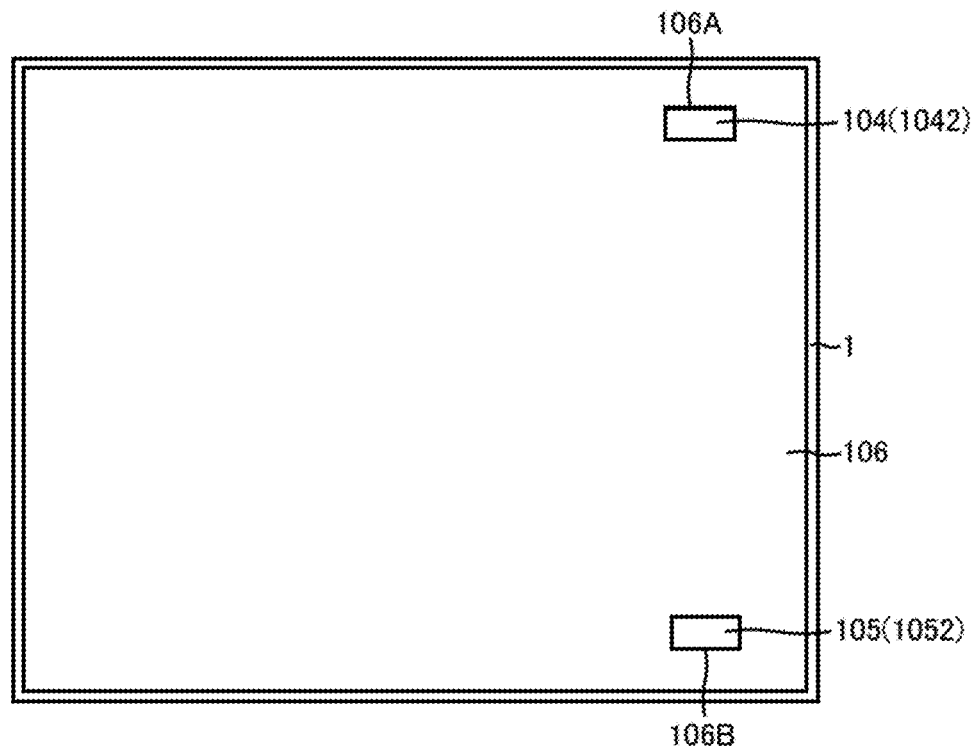

With reference to FIG. 15(b), the protective film 106 is also disposed at a peripheral portion of the semiconductor substrate 1 in addition to a region in which the electrodes 104 and 105 are formed.

The protective film 106 has opening portions 106A and 106B. The opening portion 106A is disposed to oppose a portion of the bus bar portion 1042 of the electrode 104. The opening portion 106B is disposed to oppose a portion of the bus bar portion 1052 of the electrode 105.

In the photovoltaic device 100, a current flows in the finger portion 1041 of the electrode 104 and the finger portion 1051 of the electrode 105, paralleled with the direction of the surface of the semiconductor substrate 1. Then, the current reaches the bus bar portion 1042 of the electrode 104 and the bus bar portion 1052 of the electrode 105.

Thus, in the photovoltaic device 100, forming opening portions of the protective film 106 in a region in which the finger portions 1041 and 1051 is not required, and the opening portions 106A and 106B of the protective film 106 may be formed at a portion of the bus bar portions 1042 and 1052.

In a case where a photovoltaic module using the photovoltaic device 100 is manufactured, the photovoltaic module is manufactured in a manner that interconnectors are respectively connected to the electrodes 104 and 105 through the opening portions 106A and 106B of the protective film 106, without using the above-described circuit sheet 70, and an adjacent P photovoltaic devices 100 is connected in series.

As described above, in the photovoltaic device 100, portions other than a portion of the bus bar portions 1042 and 1052 of the electrodes 104 and 105 are covered by the protective film 106. Thus, the protective film 106 is provided between the electrodes 104 and 105 in the gap region G illustrated in FIG. 14. In a case where the electrodes 104 and 105 are formed by a plating method, the width of the gap region G is about 100 μm, that is, narrow.

Thus, it is possible to prevent the occurrence of a short circuit between the electrodes 104 and 105, even though the width of the gap region G is about 100 μm and narrow.

FIGS. 16A to 20O are first to fifth process diagrams illustrating a method of manufacturing the photovoltaic device 100 illustrated in FIG. 14, respectively.

With reference to FIGS. 16A to 16D, if manufacturing of the photovoltaic device 100 is started, the same processes as the processes illustrated in FIGS. 5A to 5D are sequentially performed (see the processes of FIGS. 16A to 16D).

Figure 16A:
FIGS. 16A to 16D indicate a first process diagram illustrating a method of manufacturing the photovoltaic device illustrated in FIG. 14.
Figure 16B:
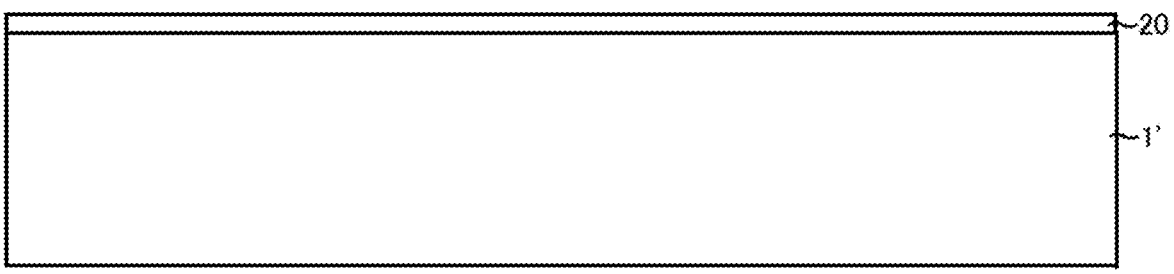
Figure 16C:
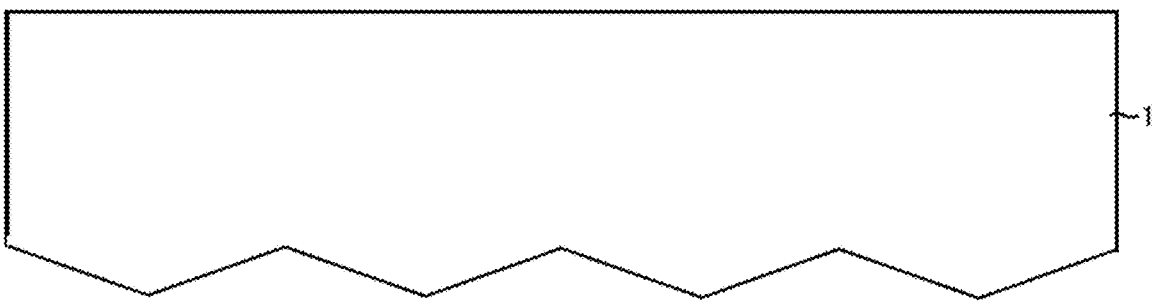
Figure 16D:
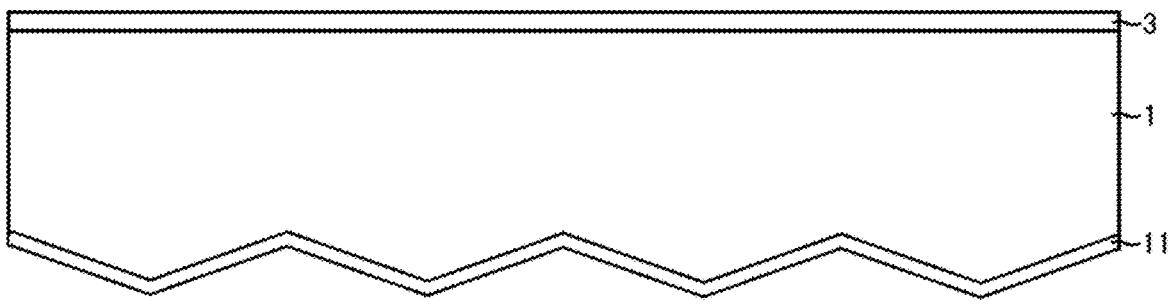
Figure 17E:
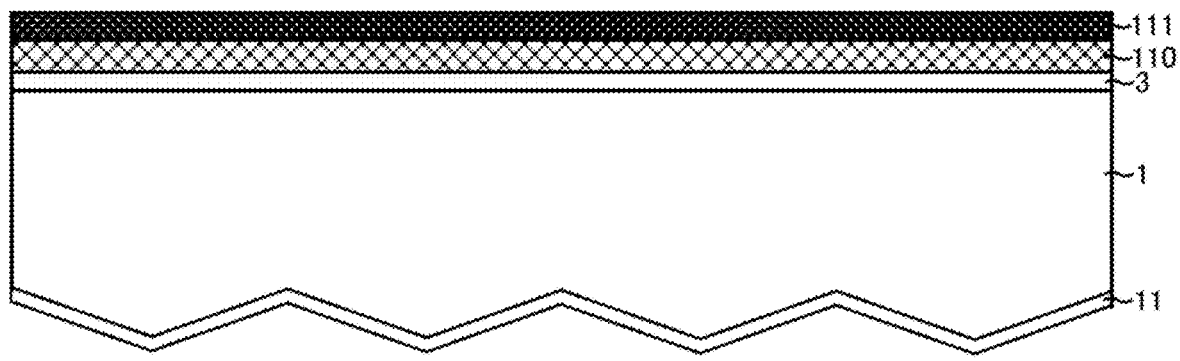
FIGS. 17E to 17G indicate a second process diagram illustrating the method of manufacturing the photovoltaic device illustrated in FIG. 14.

After the process of FIG. 16D, the p-type amorphous semiconductor layer 110 and the insulating film 111 are sequentially deposited on the passivation film 3 by a plasma CVD method (see of FIG. 17E). In this case, conditions of forming the p-type amorphous semiconductor layer 110 are the same as the above-described conditions of forming the p-type amorphous semiconductor layer 5.

In a case where the insulating film 111 is formed from a silicon oxide film, in a case where the insulating film 111 is formed from a silicon oxynitride film by using a $SiH_4$ gas and a $N_2O$ gas as the material gas, and in a case where the insulating film 111 is formed from a silicon nitride film by using a $SiH_4$ gas and a $NH_3$ gas as the material gas, a $SiH_4$ gas, a $NH_3$ gas, and a $N_2O$ gas are used as the material gas. Pressure, a substrate temperature, and RF power density in film formation are the same as the pressure, the substrate temperature, and the RF power density when the n-type amorphous semiconductor layer 4 and the p-type amorphous semiconductor layer 5 which are described above.

Figure 17F:
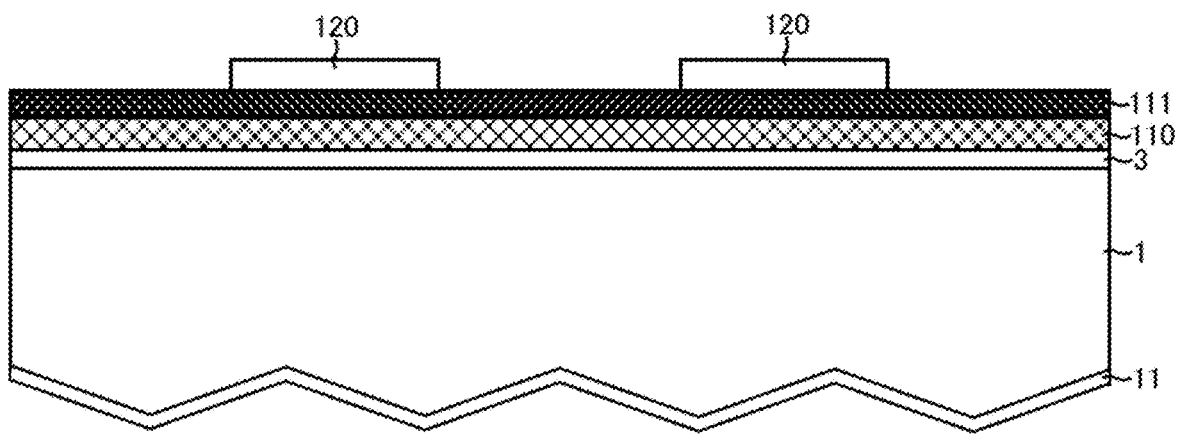
Figure 17G:
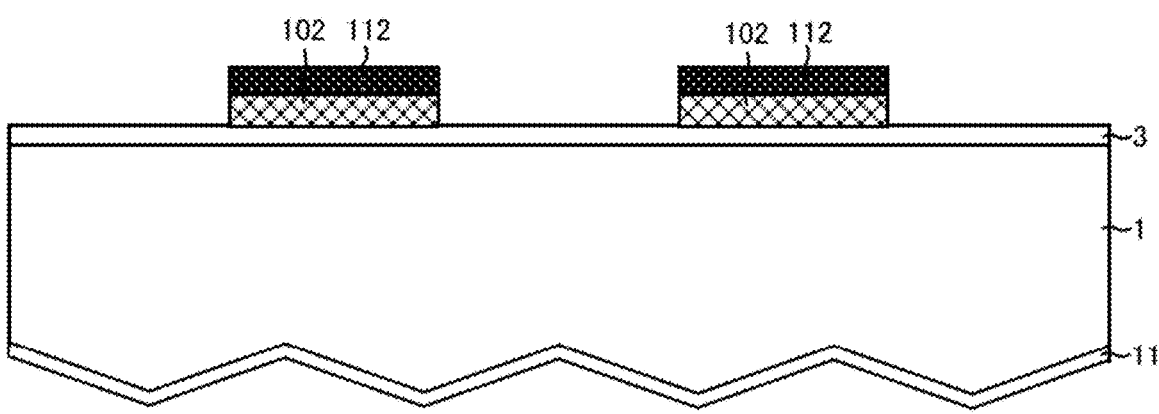

Then, a resist is applied onto the insulating film 111, and sputtering is performed on the applied resist by photolithography, and thus a resist pattern 120 is formed (see the process of FIG. 17F).

The p-type amorphous semiconductor layer 110 and the insulating film 111 are etched by using the resist pattern 120 as a mask. As a result, the p-type amorphous semiconductor layer 102 and the insulating film 112 are formed (see the process of FIG. 17G).

Figure 18H:
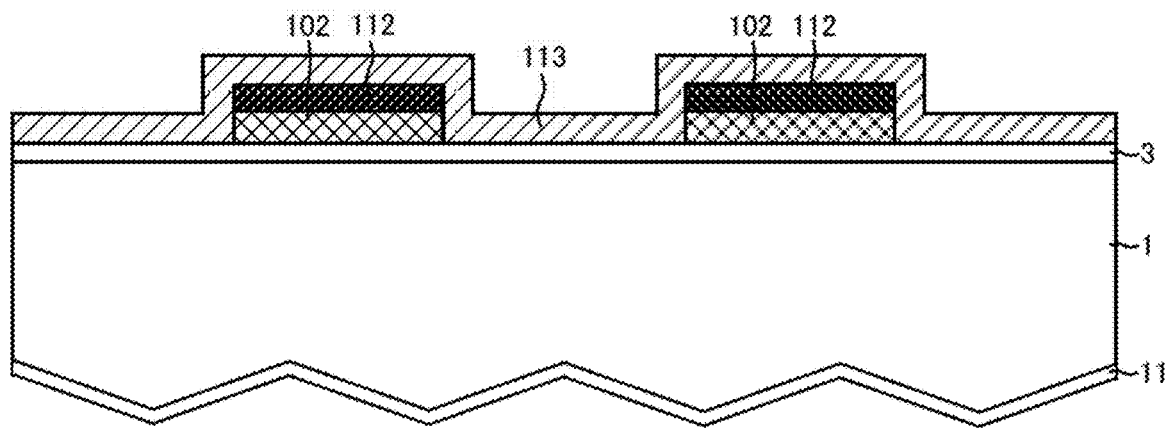
FIGS. 18H to 18J indicate a third process diagram illustrating the method of manufacturing the photovoltaic device illustrated in FIG. 14.

Then, the n-type amorphous semiconductor layer 113 is deposited on the passivation film 3 and the insulating film 112 by a plasma CVD method (see the process of FIG. 18H). In this case, conditions of forming the n-type amorphous semiconductor layer 113 are the same as the above-described conditions of forming the n-type amorphous semiconductor layer 4.

Figure 18I:
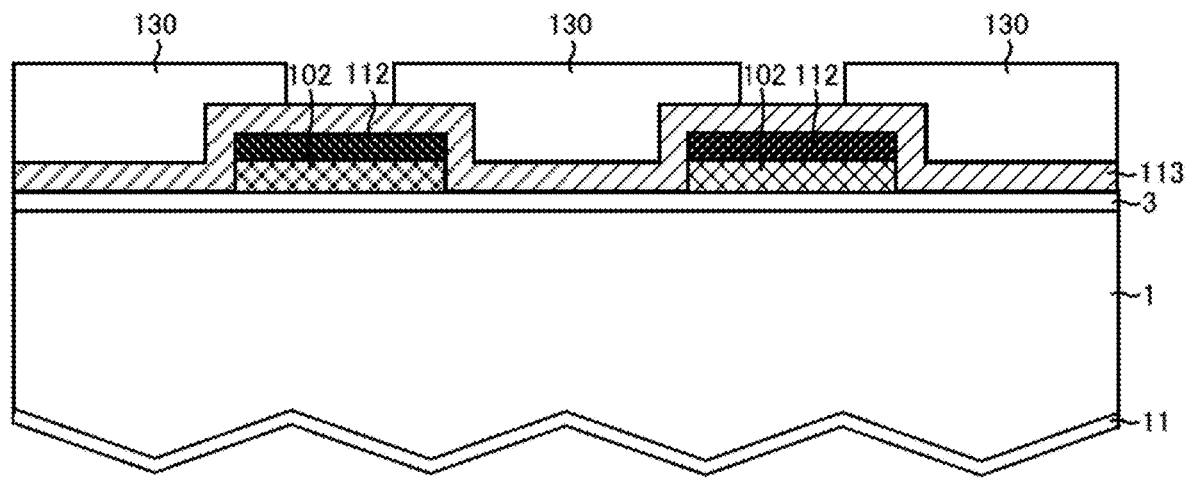
Figure 18J:
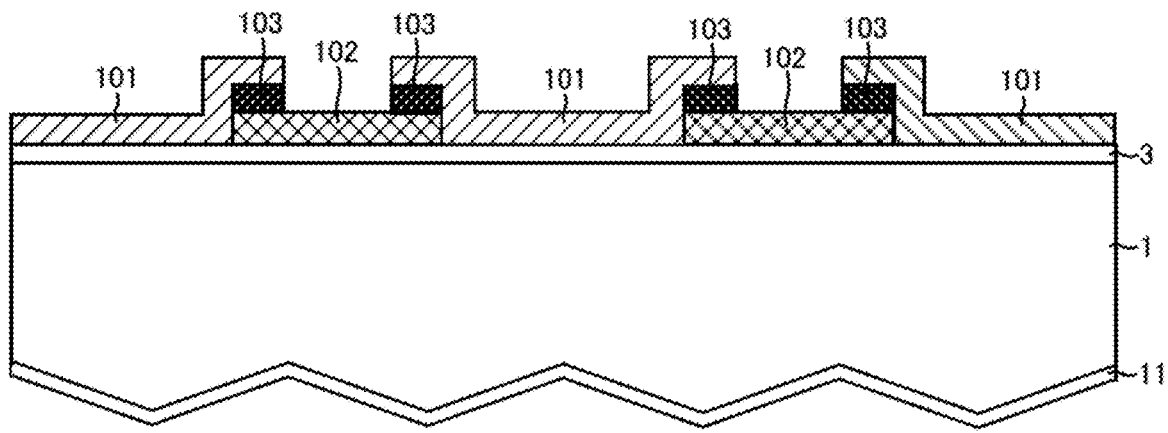

Then, a resist is applied onto the n-type amorphous semiconductor layer 113, and sputtering is performed on the applied resist by photolithography, and thus a resist pattern 130 is formed (see the process of FIG. 18I).

The insulating film 112 and the n-type amorphous semiconductor layer 113 are etched by using the resist pattern 130 as a mask. Thus, the n-type amorphous semiconductor layer 101 and the insulating film 103 are formed (see the process of FIG. 18J).

Figure 19K:
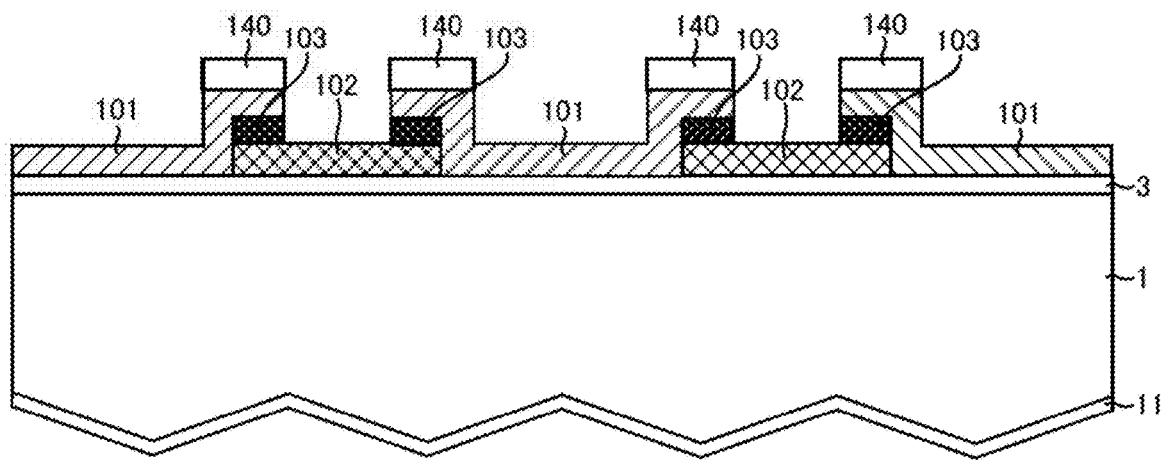
FIGS. 19K to 19M indicate a fourth process diagram illustrating the method of manufacturing the photovoltaic device illustrated in FIG. 14.
Figure 19L:
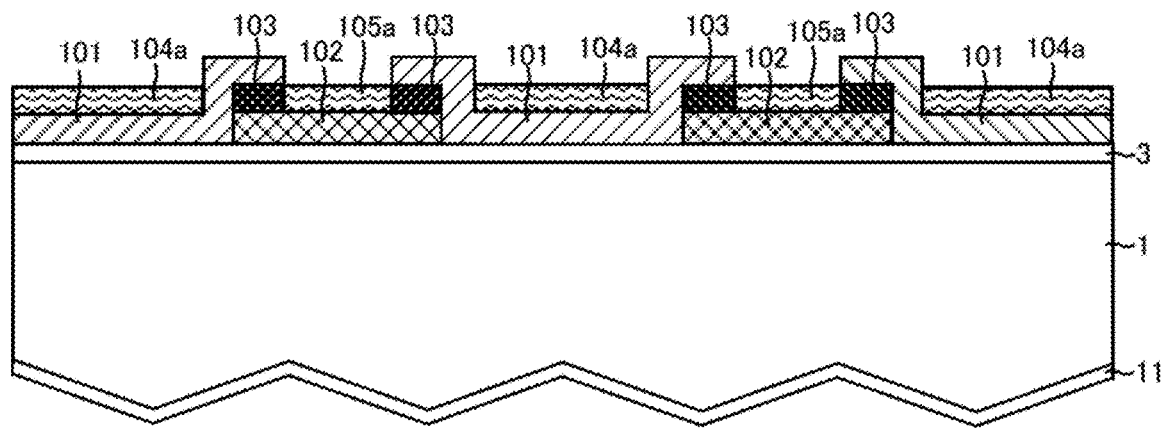
Figure 19M:
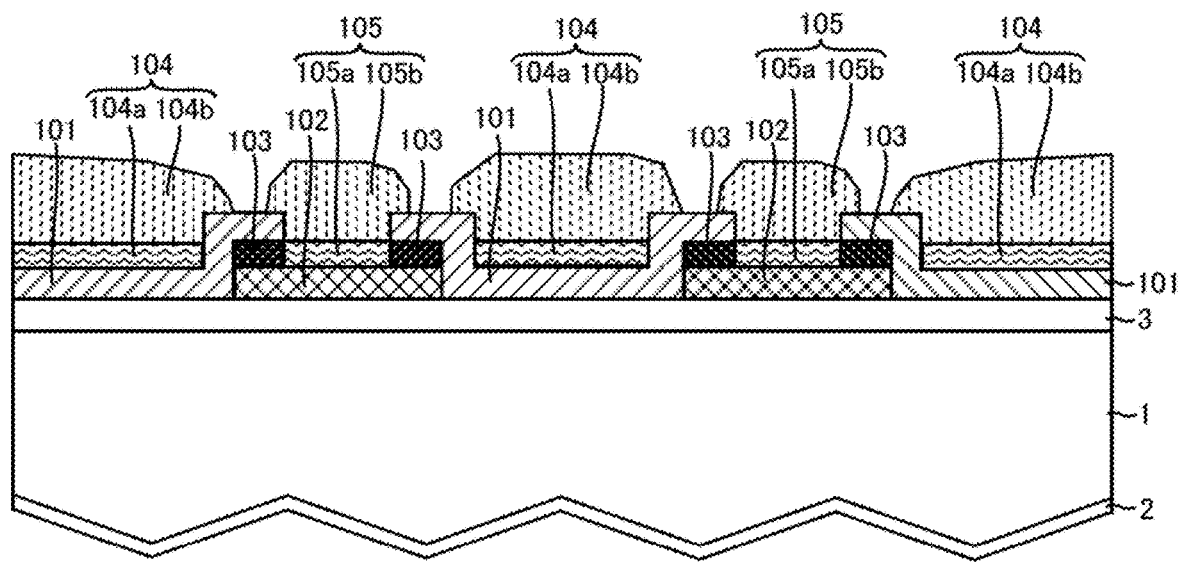

A mask 140 is disposed on a portion of the n-type amorphous semiconductor layer 101 (see the process of FIG. 19K), and the seed layers 104a and 105a are respectively formed on the n-type amorphous semiconductor layer 101 and the p-type amorphous semiconductor layer 102 through the mask 140 by a sputtering method (see the process of FIG. 19L). In this case, the seed layer 104a has a planar shape which is the same as that of the electrode 104 illustrated in FIG. 15A. The seed layer 105a has a planar shape which is the same as that of the electrode 105 illustrated in FIG. 15A.

Then, a current is applied to the bus bar portion of the seed layer 104a and the bus bar portion of the seed layer 105a, and thus the plated layers 104b and 105b are respectively formed on the seed layers 104a and 105a by an electric-field plating method. Thus, the electrodes 104 and 105 are formed on the n-type amorphous semiconductor layer 101 and the p-type amorphous semiconductor layer 102, respectively (see the process of FIG. 19M).

Figure 20N:
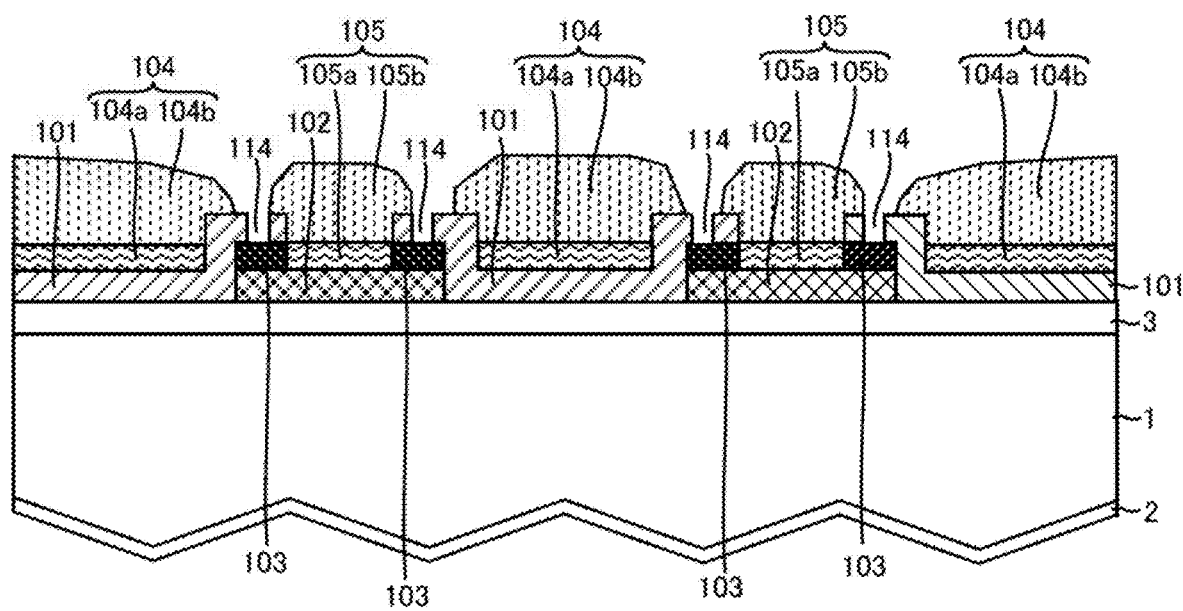
FIGS. 20N to 20O indicate a fifth process diagram illustrating the method of manufacturing the photovoltaic device illustrated in FIG. 14.
Figure 20O:
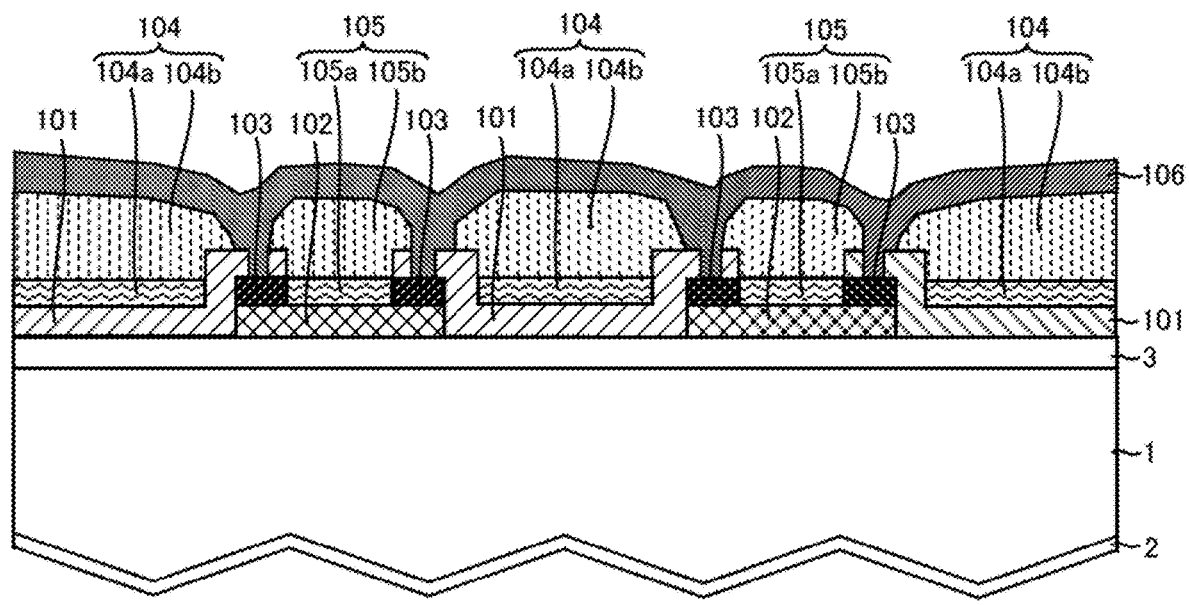

A portion of the n-type amorphous semiconductor layer 101 is etched by using an etching paste, so as to form the opening portion 114 (see the process of FIG. 20N).

Then, the protective film 106 is formed on the insulating film 103 and the electrodes 104 and 105 by using the same forming method as the forming method of the protective film 8. In this case, the protective film 106 is formed on a region other than a portion of the bus bar portions 1042 and 1052 of the electrodes 104 and 105 (portion at which the opening portions 106A and 106B are formed). Accordingly, the photovoltaic device 100 is completed (see the process of FIG. 20O).

As described above, in the photovoltaic device 100, the protective film 106 covers the region other than the portion of the bus bar portions 1042 and 1052 of the electrodes 104 and 105. Thus, it is possible to prevent the occurrence of a short circuit between the electrodes 104 and 105, and to improve reliability of the photovoltaic device 100.

Other descriptions in Embodiment 2 are the same as the descriptions in Embodiment 1.

Embodiment 3

Figure 21:
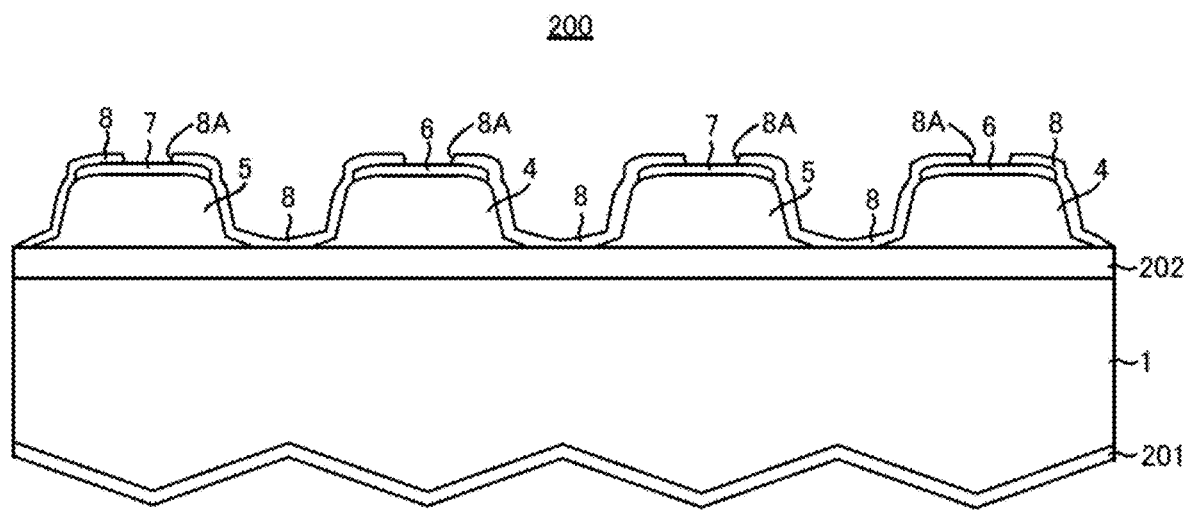
FIG. 21 is a sectional view illustrating a configuration of a photovoltaic device according to Embodiment 3.

FIG. 21 is a sectional view illustrating a configuration of a photovoltaic device according to Embodiment 3. With reference to FIG. 21, a photovoltaic device 200 according to Embodiment 3 includes an antireflection coat 201 instead of the antireflection coat 2 of the photovoltaic device 10 illustrated in FIG. 1, and includes a passivation film 202 instead of the passivation film 3 of the photovoltaic device 10. Other components are the same as those of the photovoltaic device 10.

The antireflection coat 201 is disposed to be in contact with the light-receiving surface (surface on which a textured structure is formed) of the semiconductor substrate 1.

The antireflection coat 201 has a three-layer structure of i-type amorphous silicon/n-type amorphous silicon/silicon nitride film. In this case, the film thickness of i-type amorphous silicon is, for example, 5 nm. The film thickness of n-type amorphous silicon is, for example, 8 nm. The film thickness of the silicon nitride film is, for example, 60 nm.

The passivation film 202 is disposed between the semiconductor substrate 1, and the n-type amorphous semiconductor layer 4 and the p-type amorphous semiconductor layer 5, so as to be in contact with the semiconductor substrate 1, the n-type amorphous semiconductor layer 4, the p-type amorphous semiconductor layer 5, and the protective film 8.

The passivation film 202 is formed from an i-type amorphous semiconductor layer. The i-type amorphous semiconductor layer is an amorphous semiconductor layer which is substantially intrinsic and contains hydrogen.

The i-type amorphous semiconductor layer is formed from, for example, i-type amorphous silicon, i-type amorphous silicon germanium, i-type amorphous germanium, i-type amorphous silicon carbide, i-type amorphous silicon nitride, i-type amorphous silicon oxide, i-type amorphous silicon oxynitride, i-type amorphous silicon carbon oxide, or the like.

The film thickness of the passivation film 202 is, for example, 1 to 10 nm.

As described above, the passivation film 202 is formed by i-type amorphous silicon oxynitride or i-type amorphous silicon nitride, and thus it is possible to suppress diffusion of dopants such as boron, which are contained in the p-type amorphous semiconductor layer 5 formed on the passivation film 202, into the semiconductor substrate 1.

The i-type amorphous semiconductor layer constituting the passivation film 202 causes an occurrence of defects to be reduced at an interface between the semiconductor substrate 1 and the n-type amorphous semiconductor layer 4, and an interface between the semiconductor substrate 1 and the p-type amorphous semiconductor layer 5.

The photovoltaic device 200 is manufactured in accordance with the process diagrams for a process of forming the antireflection coat 201, which is replaced from the process of FIG. 5D, and for a process of forming the passivation film 202, which is replaced from the process of FIG. 6E, in the processes illustrated in FIGS. 5A to 9N.

The antireflection coat 201 is formed by the following method. i-type amorphous silicon, n-type amorphous silicon, and a silicon nitride film are sequentially deposited on the light-receiving surface of the semiconductor substrate 1 by a plasma CVD method, so as to form the antireflection coat 201.

More specifically, i-type amorphous silicon is deposited under conditions of the substrate temperature: 130° C. to 180° C.; a flow rate of a hydrogen gas: 0 to 100 sccm; a flow rate of a silane gas: 40 sccm; pressure: 40 to 120 Pa; and RF power density: 5 to 15 mW/cm². The deposition is performed by a plasma CVD method.

A PH3 gas flows further, and thus the n-type amorphous silicon is formed under the above conditions, by a plasma CVD method. A NH₃ gas flows further, and thus the silicon nitride film is formed under the above conditions, by a plasma CVD method.

After the antireflection coat 201 is formed, the passivation film 202 is formed on the back surface of the semiconductor substrate 1.

More specifically, i-type amorphous silicon is deposited on the back surface of the semiconductor substrate 1 under the same conditions as those for i-type amorphous silicon of the antireflection coat 201, by a plasma CVD method, and thus the passivation film 202 is formed.

After the passivation film 202 is formed, the processes illustrated in FIGS. 6E to 9N are sequentially performed, and thus the photovoltaic device 200 is completed.

In this case, in the process of FIG. 8L, the electrodes 6 and 7 are formed at a ratio of Cr/Al=3 nm/500 nm.

In the process (o) in FIG. 9, the protective film 8 having a three-layer structure which is formed from i-type amorphous silicon of 4 nm, n-type amorphous silicon of 8 nm, and a silicon oxynitride film (SiON) of 60 nm is completed.

As described above, in Embodiment 3, i-type amorphous silicon which is the passivation film 202 is formed on the entire surface of the semiconductor substrate 1, by performing film formation once. Thus, it is possible to passivate the semiconductor substrate 1 by covering the surface of the semiconductor substrate 1 at a substantially uniform film thickness.

The n-type amorphous semiconductor layer 4 and the p-type amorphous semiconductor layer 5 which have a thickness reduction region on the uniform passivation film 202 are formed to be separated from each other. Thus, it is possible to achieve both of the passivation characteristics and low resistance.

The silicon nitride film is formed by a plasma CVD method, in a manner that a NH₃ gas additionally flows in a plasma device which is the same as the plasma device by which the i-type amorphous silicon has been formed. The n-type amorphous silicon is formed by a plasma CVD method, in a manner that a PH3 gas additionally flows in a plasma device which is the same as the plasma device by which the i-type amorphous silicon has been formed. Thus, the three-layer structure of i-type amorphous silicon/n-type amorphous silicon/the silicon nitride film constituting the antireflection coat 201 can be continuously formed in a vacuum atmosphere.

After the antireflection coat 201 is formed, the semiconductor substrate 1 is reversed by a manipulator in the plasma device. i-type amorphous silicon is deposited on the back surface of the semiconductor substrate 1 by a plasma CVD method, and thus the passivation film 202 is formed.

Further, a metal mask is aligned at an appropriate position. Then, the n-type amorphous semiconductor layer 4, the p-type amorphous semiconductor layer 5, and the conductive layers of the electrodes 6 and 7 are formed under the conditions described in Embodiment 1. Thus, it is possible to manufacture a structure of the light-receiving surface and the back surface of the photovoltaic device 200 in a vacuum atmosphere without being exposed to the air, and to manufacture the photovoltaic device 200.

In Embodiment 3, as described above, it is preferable that the three-layer structure of i-type amorphous silicon/n-type amorphous silicon/silicon nitride film is continuously formed so as to form the antireflection coat 201, then, the semiconductor substrate 1 is reversed so as to form the passivation film 202 on the back surface thereof, and the n-type amorphous semiconductor layer 4 and the p-type amorphous semiconductor layer 5 are formed by using the metal mask. In particular, if the silicon nitride film is formed on the amorphous silicon layer in the light-receiving surface before the i-type amorphous silicon (passivation film 202) is formed on the back surface thereof, heat history when the i-type amorphous silicon (passivation film 202) is formed on the back surface may cause the passivation characteristics of the light-receiving surface to be degraded. However, the silicon nitride film suppresses degradation of the passivation characteristics, and thus this is preferable.

As described above, the protective film 8 is formed from the three-layer structure. However, even in a case where the protective film 8 having the three-layer structure is formed, the protective film 8 formed on the electrodes 6 and 7 and on the gap region G causes the insulating properties and the moisture resistance to be improved. Thus, this is preferable. The protective film on the electrodes 6 and 7 and the protective film on the gap region G may be not continuous. However, the protective film is continuously formed, and thus man-hours of the process can be reduced, and the film thickness is also caused to be uniform. Thus, this is more preferable.

Further, regarding thermal resistance, it is understood that an effect similar to the effect in the Embodiment 1 is obtained in the photovoltaic device 200.

Since the passivation film 3 of the photovoltaic device 10 is formed from a thermal oxide film, in Embodiment 1, it is difficult that amorphous silicon is formed on the entirety of the light-receiving surface and the back surface in a vacuum atmosphere.

From such a viewpoint, Embodiment 3 is more preferable than Embodiment 1. The amorphous silicon is formed on the entirety of the light-receiving surface and the back surface in a vacuum atmosphere, and thus it is possible to suppress variation in production, and to improve the yield. Accordingly, this is preferable.

Forming the electrode and the protective film without being exposed to the air is more preferable, and can obtain effects of preventing oxidation of the surface of the electrode, improving adhesion to the protective film, and the like.

Other descriptions in Embodiment 3 are the same as the descriptions in Embodiment 1.

Embodiment 4

Figure 22:
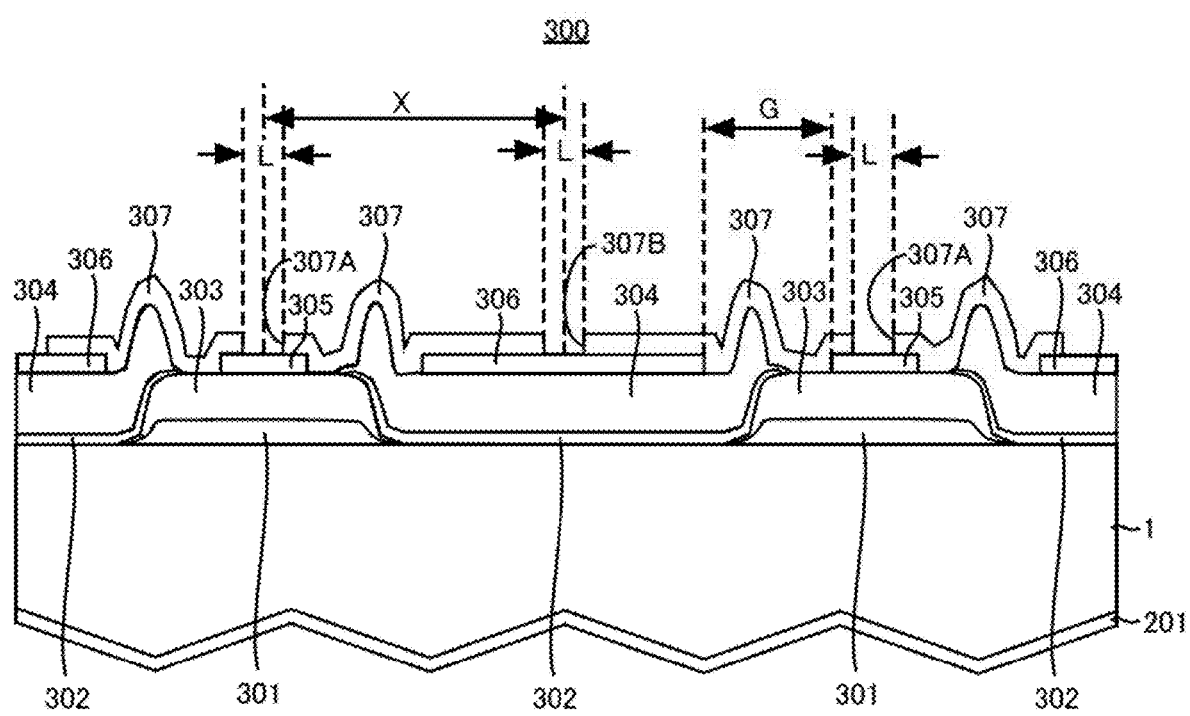
FIG. 22 is a sectional view illustrating a configuration of a photovoltaic device according to Embodiment 4.

FIG. 22 is a sectional view illustrating a configuration of a photovoltaic device according to Embodiment 4. With reference to FIG. 22, a photovoltaic device 300 according to Embodiment 4 includes passivation films 301 and 302, an n-type amorphous semiconductor layer 303, a p-type amorphous semiconductor layer 304, electrodes 305 and 306, and a protective film 307, instead of the passivation film 202, the n-type amorphous semiconductor layer 4, the p-type amorphous semiconductor layer 5, the electrodes 6 and 7, and the protective film 8 of the photovoltaic device 200 illustrated in FIG. 21. Other components are the same as those of the photovoltaic device 200.

The passivation film 301 is disposed on the back surface of the semiconductor substrate 1 so as to be in contact with the back surface of the semiconductor substrate 1.

The passivation film 302 is disposed on the back surface of the semiconductor substrate 1 so as to be adjacent to the passivation film 301 paralleled with the direction of the surface of the semiconductor substrate 1 and to be in contact with the back surface of the semiconductor substrate 1.

As a result, the passivation films 301 and 302 are alternately disposed to be paralleled with the direction of the surface of the semiconductor substrate 1.

Both end portions of the passivation film 302 paralleled with the direction of the surface of the semiconductor substrate 1 are disposed on the n-type amorphous semiconductor layer 303 to be in contact with the n-type amorphous semiconductor layer 303.

The n-type amorphous semiconductor layer 303 is disposed on the passivation film 301 to be in contact with the passivation film 301.

The p-type amorphous semiconductor layer 304 is disposed on the passivation film 302 to be in contact with the passivation film 302.

The n-type amorphous semiconductor layer 303 and the p-type amorphous semiconductor layer 304 are respectively disposed on the passivation films 301 and 302, as a result, the n-type amorphous semiconductor layer 303 and the p-type amorphous semiconductor layer 304 are alternately disposed paralleled with the direction of the surface of the semiconductor substrate 1.

The n-type amorphous semiconductor layer 303 and the p-type amorphous semiconductor layer 304 are disposed so that end portions thereof overlap each other paralleled with the direction of the surface of the semiconductor substrate 1 between the n-type amorphous semiconductor layer 303 and the p-type amorphous semiconductor layer 304 which are adjacent to each other.

The electrode 305 is disposed on the n-type amorphous semiconductor layer 303 to be in contact with the n-type amorphous semiconductor layer 303.

The electrode 306 is disposed on the p-type amorphous semiconductor layer 304 to be in contact with the p-type amorphous semiconductor layer 304.

The protective film 307 is disposed on the n-type amorphous semiconductor layer 303, the p-type amorphous semiconductor layer 304, and the electrodes 305 and 306, so as to be in contact with the n-type amorphous semiconductor layer 303, the p-type amorphous semiconductor layer 304, and the electrodes 305 and 306. The protective film 307 has opening portions 307A and 307B on the electrodes 305 and 306, respectively.

Each of the passivation films 301 and 302 is formed from an i-type amorphous semiconductor layer. The i-type amorphous semiconductor layer is formed from i-type amorphous silicon, i-type amorphous silicon germanium, i-type amorphous germanium, i-type amorphous silicon carbide, i-type amorphous silicon nitride, i-type amorphous silicon oxide, i-type amorphous silicon oxynitride, i-type amorphous silicon carbon oxide, or the like.

Each of the passivation films 301 and 302 has a film thickness of 1 to 10 nm. The film thickness of the passivation film 301 may be the same as or different from the film thickness of the passivation film 302.

The passivation films 301 and 302 are formed by i-type amorphous silicon nitride or i-type amorphous silicon oxynitride, and thus it is possible to suppress diffusion of dopants such as boron, which are contained in the p-type amorphous semiconductor layer 304 formed on the passivation film 302, into the semiconductor substrate 1.

The passivation film 301 has the above-described thickness reduction regions TD at both end portions thereof paralleled with the direction of the surface of the semiconductor substrate 1.

The n-type amorphous semiconductor layer 303 is formed from the same material as that of the above-described n-type amorphous semiconductor layer 4, and has the same film thickness as that of the n-type amorphous semiconductor layer 4.

The p-type amorphous semiconductor layer 304 is formed from the same material as that of the above-described p-type amorphous semiconductor layer 5, and has the same film thickness as that of the p-type amorphous semiconductor layer 5.

The n-type amorphous semiconductor layer 303 and the p-type amorphous semiconductor layer 304 have the above-described thickness reduction regions TD at both end portions thereof paralleled with the direction of the surface of the semiconductor substrate 1. The thickness reduction region TD of the n-type amorphous semiconductor layer 303 overlaps the thickness reduction region TD of the passivation film 301. The thickness reduction region TD of the p-type amorphous semiconductor layer 304 overlaps the thickness reduction region TD of the n-type amorphous semiconductor layer 303 which is adjacent to the p-type amorphous semiconductor layer 304.

Each of the electrodes 305 and 306 is formed from the same structure and the same material as those of the above-described electrodes 6 and 7. Each of the electrodes 305 and 306 has the same thickness as that of the electrodes 6 and 7.

The protective film 307 is formed from the same material as that of the above-described protective film 8, and has the same film thickness as that of the protective film 8.

In the photovoltaic device 300, a region from an end portion of the electrode 305 to an end portion of the electrode 306 between the electrodes 305 and 306 which are adjacent to each other paralleled with the direction of the surface of the semiconductor substrate 1 is referred to as a gap region G.

A distance from the center of the electrode 305 paralleled with the direction of the surface of the semiconductor substrate 1 to the center of the electrode 306 paralleled with the direction of the surface of the semiconductor substrate 1, between the electrodes 305 and 306 which are adjacent to each other is referred to as a pitch X. The pitch X is 1000 µm, for example.

The opening portions 307A and 307B have an opening width L. The opening width L is 50 µm, for example.

In the photovoltaic device 300, the n-type amorphous semiconductor layer 303 and the p-type amorphous semiconductor layer 304 overlap each other at a portion of the gap region G. However, even in a region in which the n-type amorphous semiconductor layer 303 and the p-type amorphous semiconductor layer 304 overlap each other, the region is covered by the protective film 307, and thus it is possible to improve the insulating properties and the moisture resistance.

The protective film formed on the electrodes 305 and 306 and the protective film formed on the gap region G are not required to be continuous. However, the protective films are formed as a continuous film, and thus it is possible to reduce man-hours of the process. Accordingly, this is preferable.

FIGS. 23A to 27L are first to fifth process diagrams illustrating a method of manufacturing the photovoltaic device 300 illustrated in FIG. 22, respectively.

Figure 23A:
FIGS. 23A to 23D indicate a first process diagram illustrating a method of manufacturing the photovoltaic device illustrated in FIG. 22.
Figure 23B:
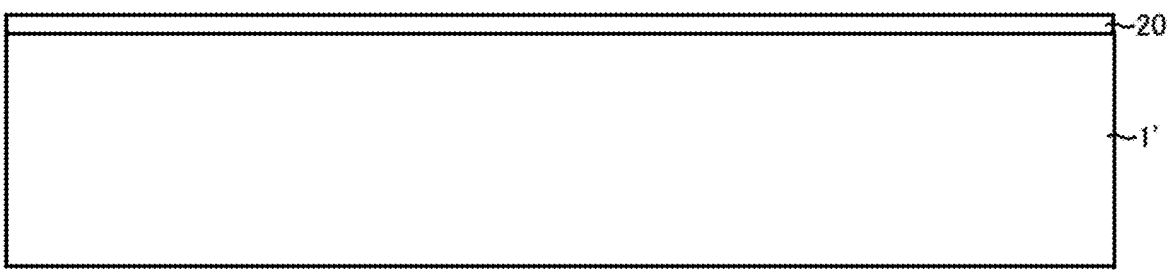
Figure 23C:
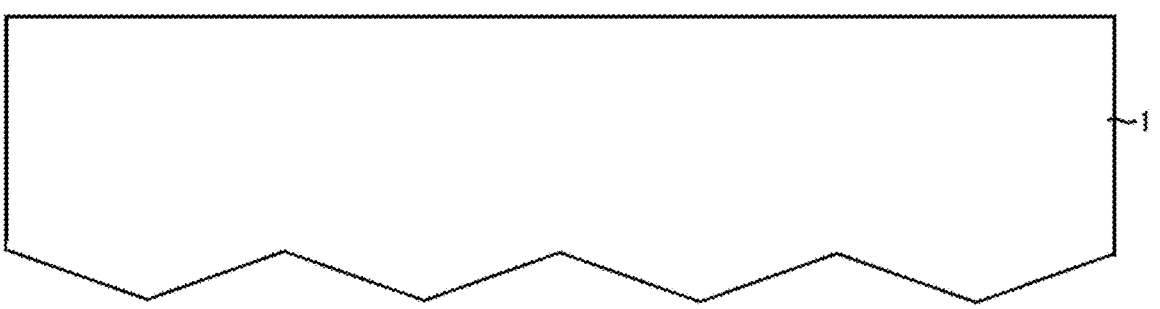
Figure 23D:
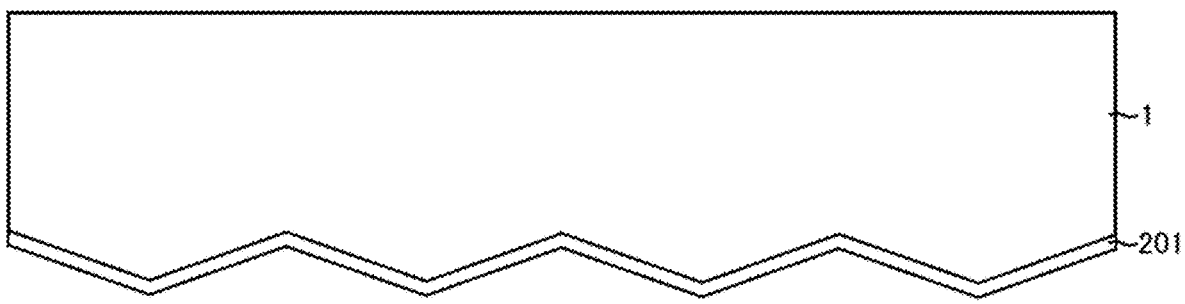

With reference to FIGS. 23A to 23D, if manufacturing of the photovoltaic device 300 is started, the same processes as the processes illustrated in FIGS. 5A to 5C are sequentially performed, thereby a semiconductor substrate 1 is manufactured (see the processes of FIGS. 23A to 23C).

After the process of FIG. 23C, i-type amorphous silicon, n-type amorphous silicon, and a silicon nitride film are sequentially stacked on the light-receiving surface of the semiconductor substrate 1 by a plasma CVD method. A antireflection coat 201 is formed on the light-receiving surface of the semiconductor substrate 1 (see the process of FIG. 23D).

In this case, the i-type amorphous silicon, the n-type amorphous silicon, and the silicon nitride film are formed by using the conditions which are described in Embodiment 3.

Figure 24E:
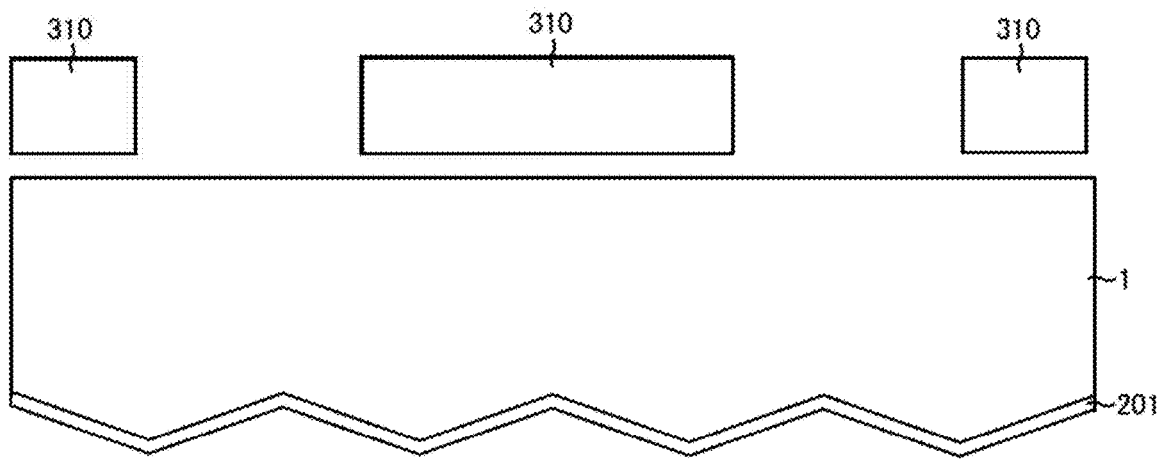
FIGS. 24E to 24G indicate a second process diagram illustrating the method of manufacturing the photovoltaic device illustrated in FIG. 22.

Then, a manipulator in the plasma device is operated to reverse the semiconductor substrate 1, and a mask 310 is disposed on the back surface of the semiconductor substrate 1 (see the process of FIG. 24E). The mask 310 is formed from the same material as that of the above-described mask 30.

Figure 24F:
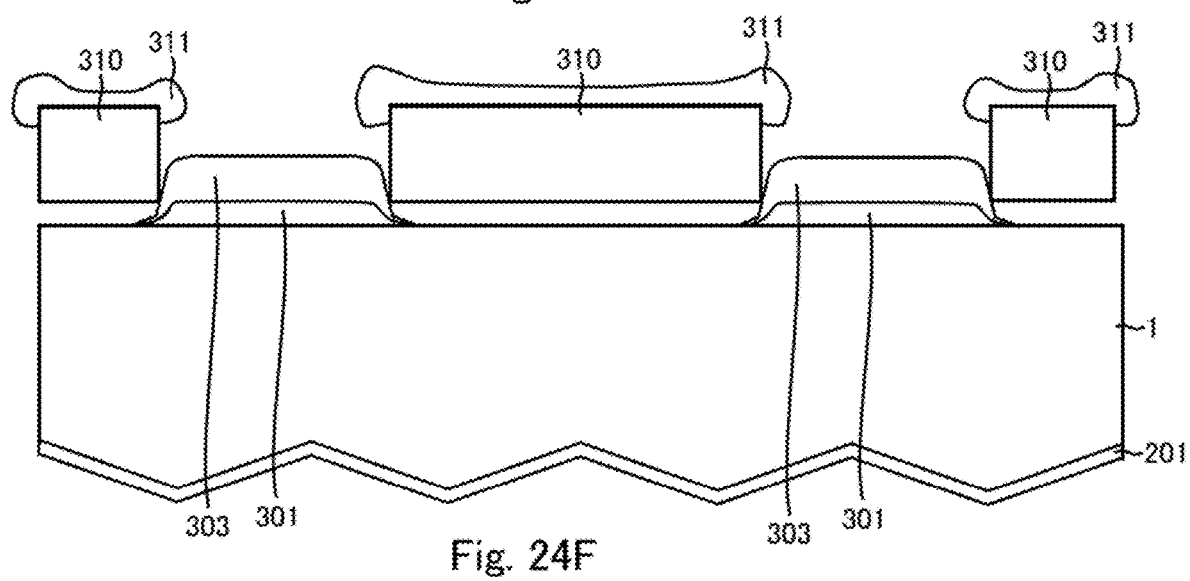

The passivation film 301 formed from i-type amorphous silicon, and the n-type amorphous semiconductor layer 303 formed from n-type amorphous silicon are sequentially deposited on the back surface of the semiconductor substrate 1 through the mask 310, by a plasma CVD method (see the process of FIG. 24F). Conditions of forming i-type amorphous silicon and n-type amorphous silicon are described in the Embodiment 1. When the passivation film 301 and the n-type amorphous semiconductor layer 303 are formed, a laminated film 311 of i-type amorphous silicon/n-type amorphous silicon is formed on the mask 310.

The width and the like of the thickness reduction region TD of the passivation film 301 and the n-type amorphous semiconductor layer 303 are controlled by the thickness of the mask 310, pressure during the reaction, and the like.

Figure 24G:
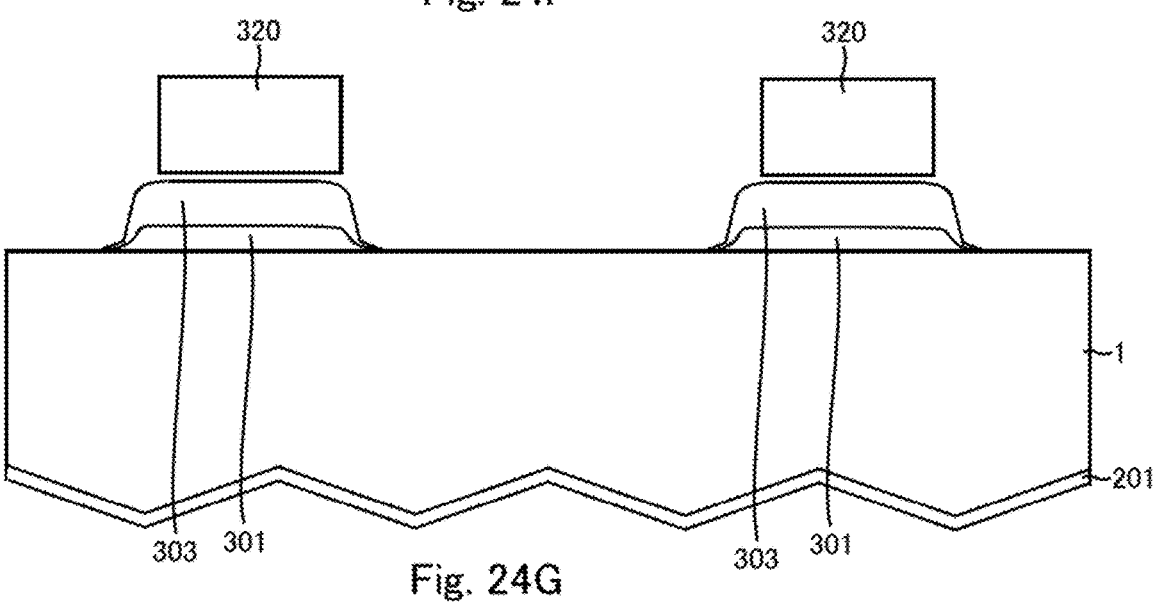

After the process of FIG. 24F, a mask 320 is disposed on the n-type amorphous semiconductor layer 303 (see the process of FIG. 24G). The mask 320 is also formed from the same material as that of the above-described mask 30.

Figure 25H:
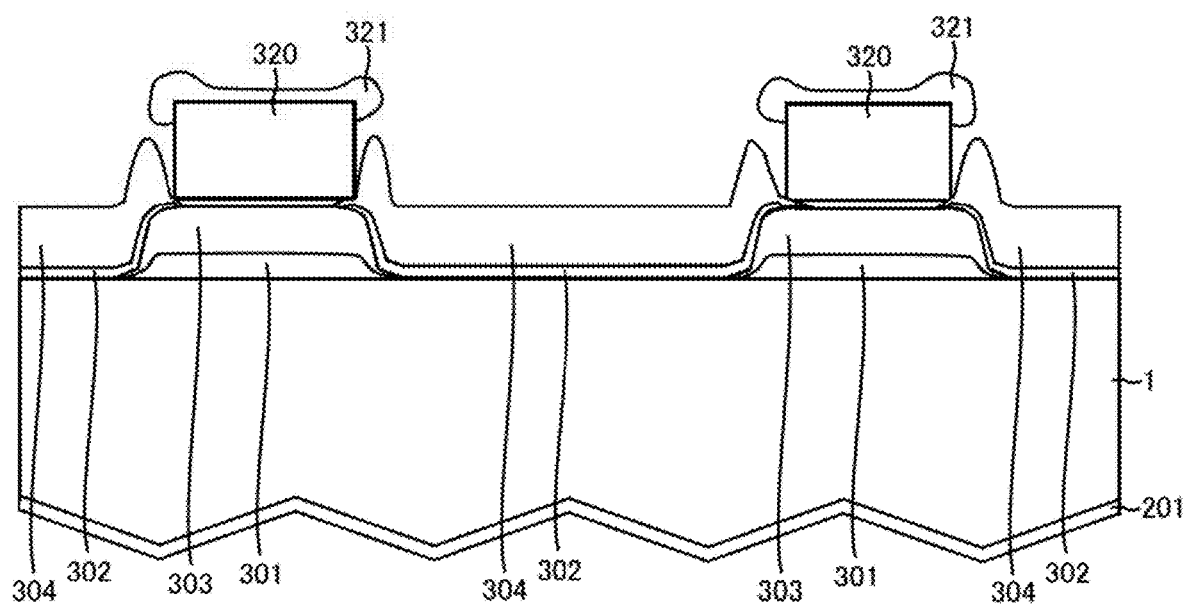
FIGS. 25H to 25I indicate a third process diagram illustrating the method of manufacturing the photovoltaic device illustrated in FIG. 22.

The passivation film 302 formed from i-type amorphous silicon and the p-type amorphous semiconductor layer 304 formed from p-type amorphous silicon are sequentially deposited on the back surface of the semiconductor substrate 1 through the mask 320, by a plasma CVD method (see the process of FIG. 25H). Conditions of forming i-type amorphous silicon and p-type amorphous silicon are described in the Embodiment 1. When the passivation film 302 and the p-type amorphous semiconductor layer 304 are formed, a laminated film 321 of i-type amorphous silicon/p-type amorphous silicon is formed on the mask 320.

Both end portions of the passivation film 302 paralleled with the direction of the surface of the semiconductor substrate 1 are deposited on the thickness reduction region TD of the adjacent n-type amorphous semiconductor layer 303. Both end portions of the p-type amorphous semiconductor layer 304 paralleled with the direction of the surface of the semiconductor substrate 1 are deposited on the thickness reduction region TD of the adjacent n-type amorphous semiconductor layer 303. That is, the passivation film 302 and the p-type amorphous semiconductor layer 304 are formed to cause both of the end portions of the passivation film 302 and the p-type amorphous semiconductor layer 304 to overlap the thickness reduction region TD of the adjacent n-type amorphous semiconductor layer 303.

Figure 25I:
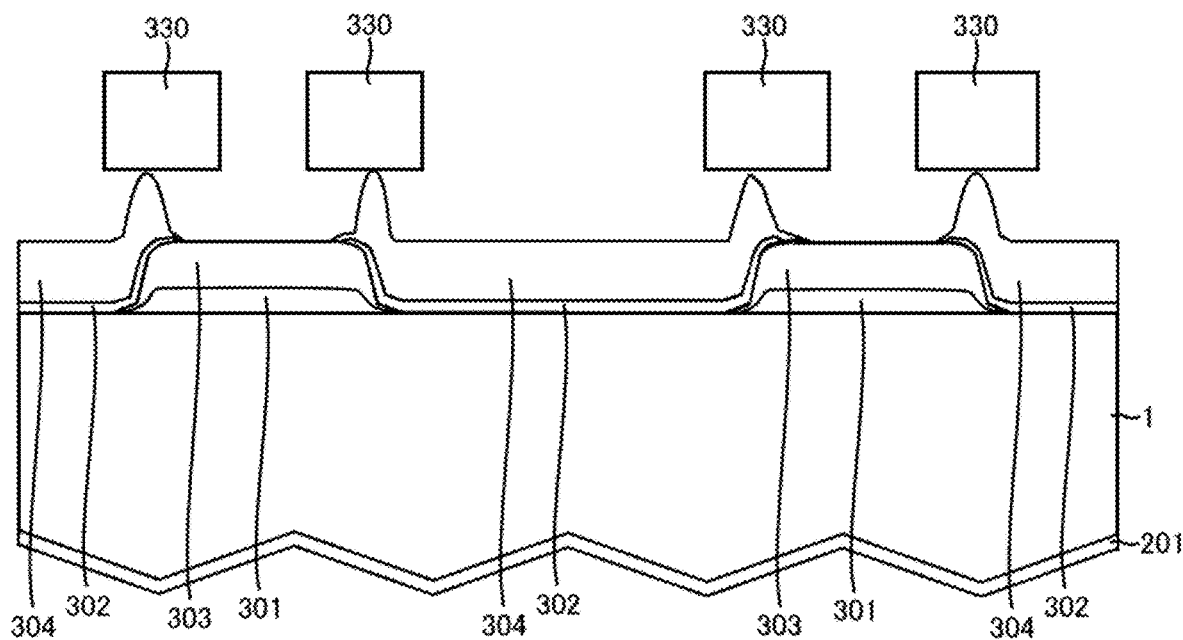

After the process of FIG. 25H, a mask 330 is disposed (see the process of FIG. 25I). The mask 330 is formed from the same material as that of the above-described mask 30.

Figure 26J:
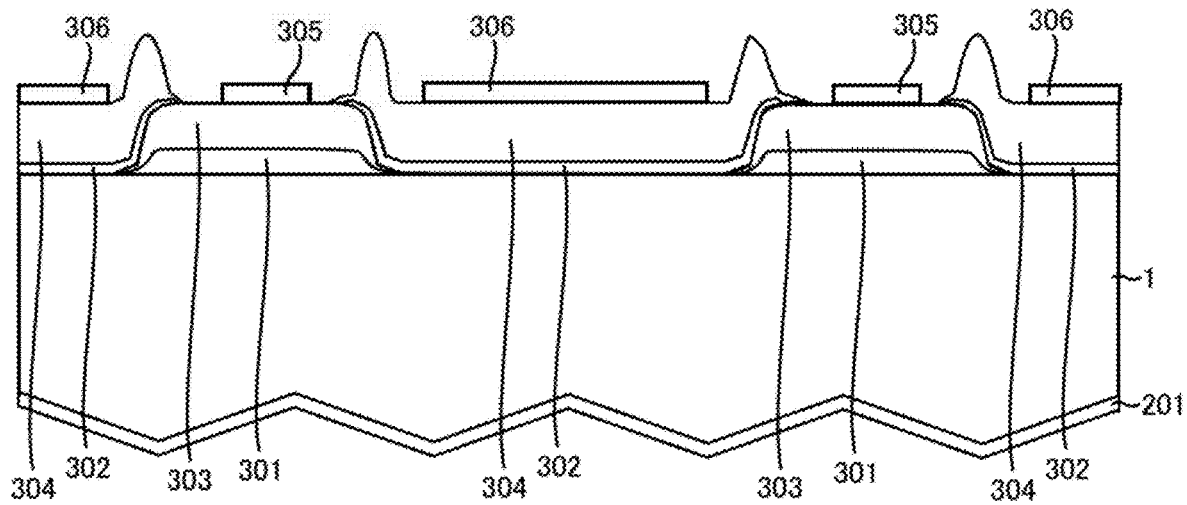
FIGS. 26J to 26K indicate a fourth process diagram illustrating the method of manufacturing the photovoltaic device illustrated in FIG. 22.

The electrodes 305 and 306 are formed on the n-type amorphous semiconductor layer 303 and the p-type amorphous semiconductor layer 304 through the mask 330, respectively (see the process of FIG. 26J).

Figure 26K:
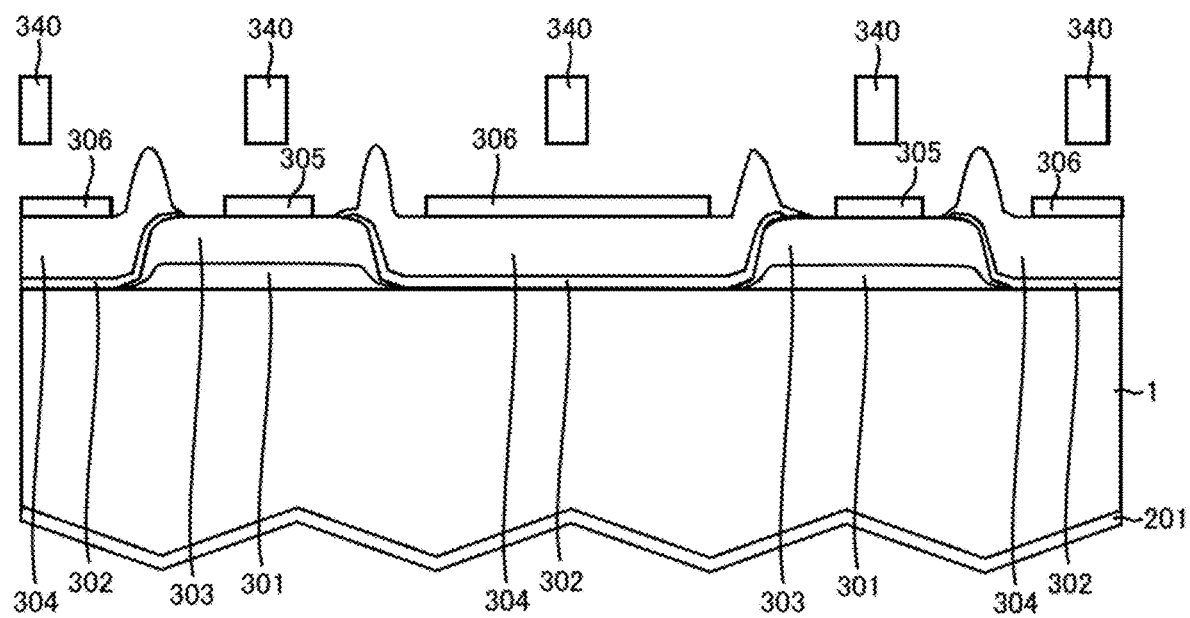
Figure 27L:
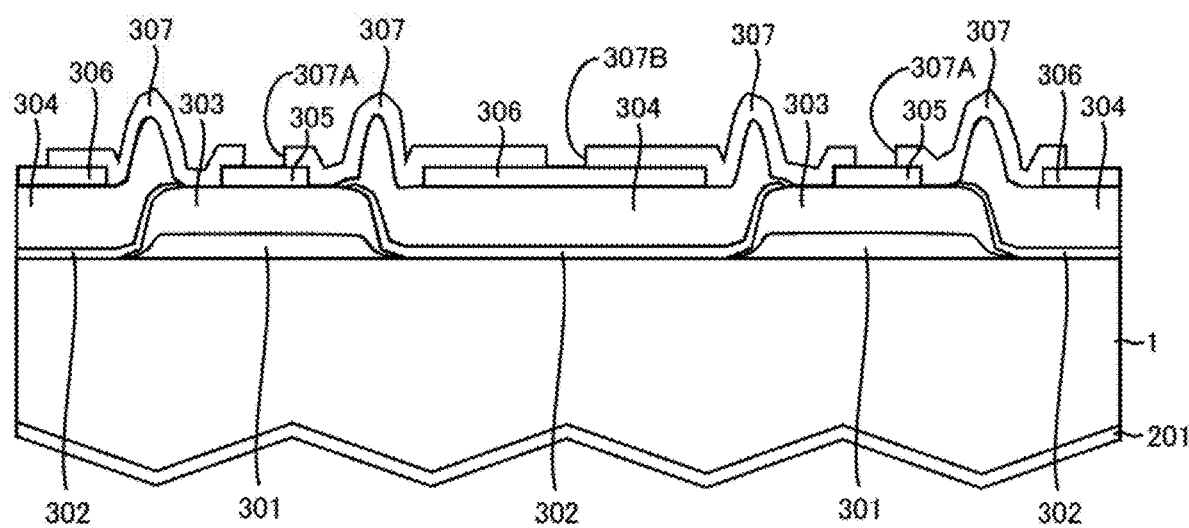
FIG. 27L indicates a fifth process diagram illustrating the method of manufacturing the photovoltaic device illustrated in FIG. 22.

Then, a mask 340 is disposed (see the process of FIG. 26K). The mask 340 is formed from the same material as that of the above-described mask 30.

The protective film (=SiN of 120 nm) 307 is formed on the n-type amorphous semiconductor layer 303, the p-type amorphous semiconductor layer 304, and the electrodes 305 and 306 through the mask 340. Thus, the photovoltaic device 300 is completed (see the process of FIG. 27L).

As described above, the photovoltaic device 300 is manufactured in a manner that i-type amorphous silicon, n-type amorphous silicon, p-type amorphous silicon, and a silicon nitride film are deposited on the light-receiving surface and the back surface of the semiconductor substrate 1 by using masks and by a plasma CVD method in a plasma device.

As a result, since the antireflection coat 201, the passivation films 301 and 302, the n-type amorphous semiconductor layer 303, and the p-type amorphous semiconductor layer 304 are formed without being exposed to the air, it is possible to reduce the occurrence of defects at an interface between the semiconductor substrate 1 and the passivation films 301 and 302, and to reduce the occurrence of defects at an interface between the passivation films 301 and 302, and the n-type amorphous semiconductor layer 303 and the p-type amorphous semiconductor layer 304.

In the above descriptions, an example in which the photovoltaic device 300 is manufactured by using a single-layer film of SiN as the protective film 307 is described. However, as described above, even in a case where the protective film 307 formed from a single-layer film of SiN is used, the effect of enabling improvement of the insulating properties and the moisture resistance is obtained.

In the photovoltaic device 300, regarding the insulating properties, the moisture resistance, and the thermal resistance, the same effect as that in Embodiment 1 is obtained.

Further, the photovoltaic device 300 is modularized by using the above-described circuit sheet 70.

Other descriptions in Embodiment 4 are the same as the descriptions in Embodiment 1.

Embodiment 5

Figure 28:
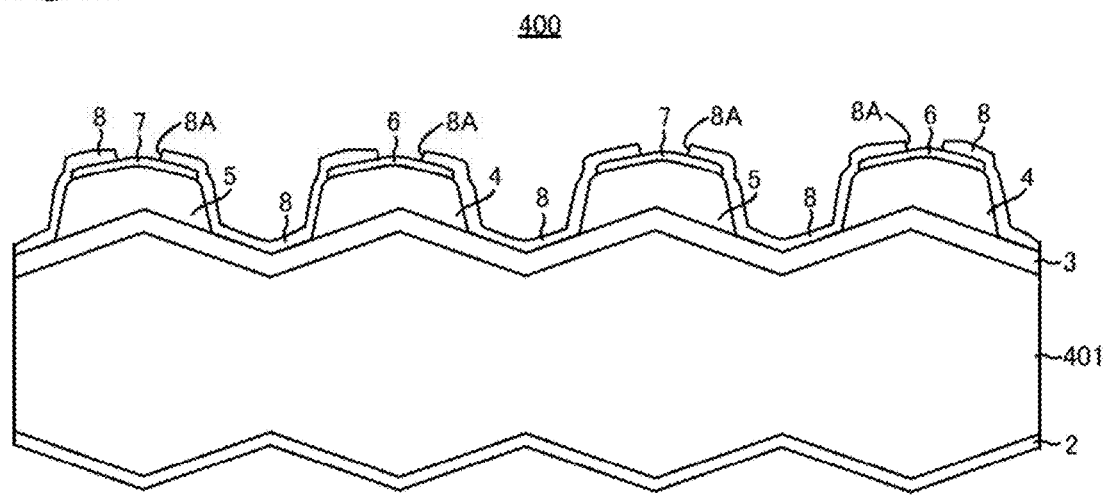
FIG. 28 is a sectional view illustrating a configuration of a photovoltaic device according to Embodiment 5.

FIG. 28 is a sectional view illustrating a configuration of a photovoltaic device according to Embodiment 5. With reference to FIG. 28, a photovoltaic device 400 according to Embodiment 5 includes a semiconductor substrate 401 instead of the semiconductor substrate 1 of the photovoltaic device 10 illustrated in FIG. 1. Other components are the same as those of the photovoltaic device 10.

The semiconductor substrate 401 is the same as the semiconductor substrate 1 except that a textured structure is formed on both surfaces.

In the photovoltaic device 400, the antireflection coat 2 is disposed on the light-receiving surface of the semiconductor substrate 401. The passivation film 3, the n-type amorphous semiconductor layer 4, the p-type amorphous semiconductor layer 5, the electrodes 6 and 7, and the protective film 8 are disposed on the back surface on which the textured structure is formed. Thus, in the photovoltaic device 400, in the semiconductor substrate 401, a surface on which the anti-reflection coat 2 is disposed is the light-receiving surface, and a surface on which the passivation film 3 and the like are disposed is the back surface.

Figure 29A:
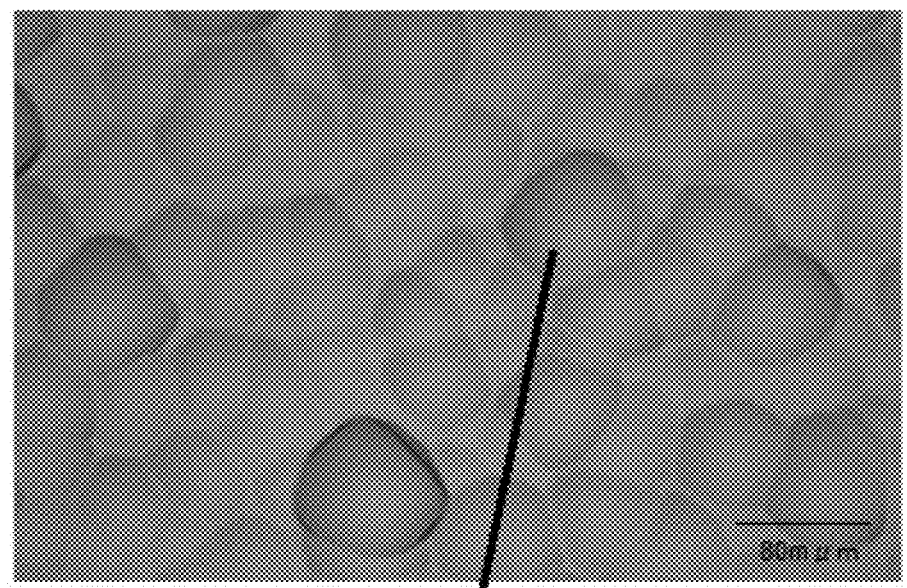
FIGS. 29A to 29B indicate a diagram illustrating a surface microscopic photograph of a silicon substrate.
Figure 29B:
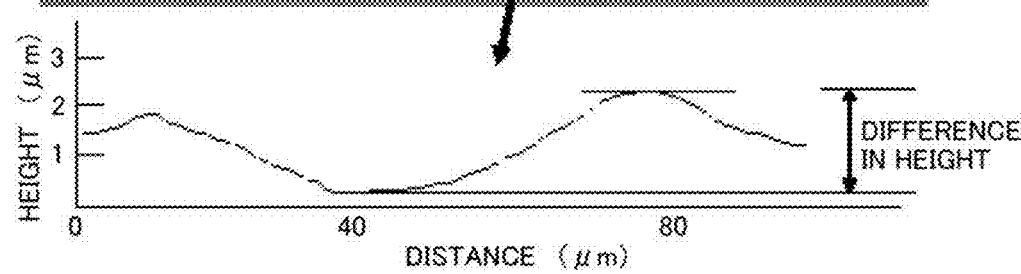

FIGS. 29A to 29B indicate a diagram illustrating a surface microscopic photograph of a silicon substrate. FIG. 29A is a diagram illustrating a scanning electron microscopy (SEM) picture of a surface of a silicon wafer, on which the textured structure is not formed. FIG. 29B is a diagram illustrating a profile of an unevenness in a part of a region of the silicon substrate illustrated in FIG. 29A.

In the semiconductor substrate 1, an influence and the like of etching which is performed for removing a damaged layer may cause an unevenness of about 1 μm to be also provided on the surface on which the texture structure layer is not formed. For easy descriptions, the drawings in this specification are described by using the diagrams of a flat substrate. However, in practice, the semiconductor substrate 1 has an unevenness shape as illustrated in FIGS. 29A to 29B.

Thus, the thickness reduction region and the like represents a layer thickness of a film, and indicates a case where an unevenness of the substrate is excluded.

In a case where an unevenness is provided on a substrate, how to practically determine whether or not the shape of the semiconductor layer in the thickness reduction region will be described by using FIG. 29B.

As illustrated in FIG. 29A, a semiconductor layer having a thickness reduction region is formed on a silicon substrate having a surface on which an unevenness is formed. A sectional picture of the substrate is taken in a SEM or a TEM. In this case, it is possible to easily determine an interface between a passivation film and a substrate surface. A film thickness (portion denoted by an arrow) from the interface to the surface of the semiconductor layer is measured at each location. If the film thickness is plotted and corrected, a state illustrated in FIG. 29A can be converted into a profile illustrated in FIG. 29B. The method as described above is used, and thus it is possible to determine the thickness reduction region even through a substrate having an unevenness shape is provided.

As will be described later, even in a case where a substrate in which a texture structure layer is formed on both surfaces of a silicon substrate is used, it is possible to determine a film thickness reduction region in a manner that the film thickness on the texture is measured, plotted, and corrected by the above methods.

As illustrated in FIGS. 29A to 29B, the surface of a silicon wafer, on which the textured structure is not formed has a difference of about 2 μm at the maximum in height. However, if being compared to a surface on which the textured structure is formed (having a difference of hundreds μm at the maximum in height), the difference in height is significantly small, and substantially flat.

Thus, if easiness of a circuit sheet and the like in contact with an external wiring, and difficulty in occurrence of a short circuit between electrodes are considered, it is preferable that the passivation film 3, the n-type amorphous semiconductor layer 4, the p-type amorphous semiconductor layer 5, and the like are formed on the back surface (surface on which the textured structure is not formed) which is originally and relatively flat.

However, in order to lock incident light in the semiconductor substrate with high efficiency, it is preferable that the textured structure is also formed on the back surface. Further, the textured structure is formed on the back surface, and thus the surface area is increased (about 1.7 times). Thus, it is possible to decrease contact resistance. Protecting the surface on which the textured structure is not formed, when anisotropic etching is performed is required for forming the textured structure only on a single surface. However, in a case where the textured structure is formed on both of the surfaces, protecting both of the surfaces of the semiconductor substrate is not required. Accordingly, it is possible to reduce man-hours of the process.

Even in a case where the textured structure is formed on the back surface, the protective film 8 is formed on the back surface of the semiconductor substrate. Thus, the effect of the insulating properties is large. That is, in a case where the textured structure is formed on both of the surfaces, and the protective film 8 is not formed on the back surface, when a photovoltaic device is modularized, a portion of silicon at a vertex portion of the textured structure on the back surface is easily cracked. The cracked silicon functions as conductive dust, and is the cause of the occurrence of a short circuit between the electrodes. However, in a case where the protective film 8 is formed on the back surface, such conductive dust is not generated. Thus, the effect of the insulating properties is increased.

With the above-described reasons, the photovoltaic device 400 is manufactured by using the semiconductor substrate 401 in which the textured structure is formed on both of the surfaces.

The photovoltaic device 400 is manufactured in accordance with the process diagrams obtained by deleting the process of FIG. 5B from the processes of the processes illustrated in FIGS. 5A to 9N. As a result, in the process of FIG. 5C, the semiconductor substrate 401 in which the textured structure is formed on both of the surfaces is manufactured.

Figure 30A:
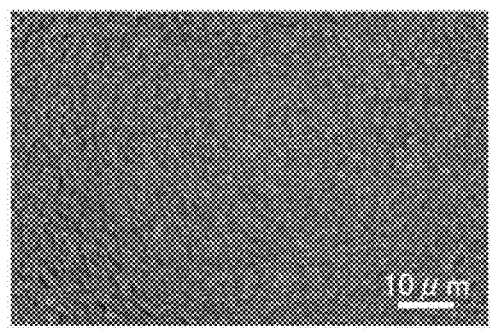
FIGS. 30A to 30C indicate a diagram illustrating a SEM picture of a surface on which a textured structure is formed.
Figure 30B:
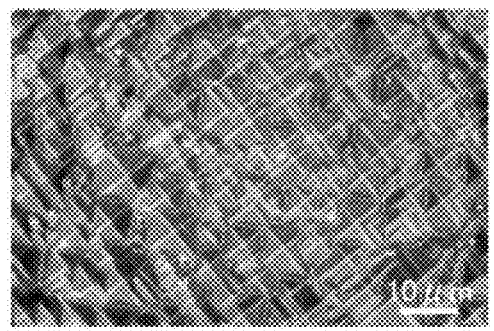
Figure 30C:
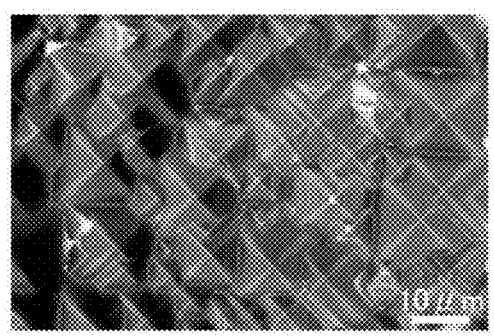

FIGS. 30A to 30C indicate a diagram illustrating a SEM picture of the surface on which the textured structure is formed. FIG. 30A illustrates a SEM picture in a case where the length of the bottom side of a pyramid constituting the textured structure is equal to or less than 2 μm. FIG. 30B illustrates a SEM picture in a case where the length of the bottom side of the pyramid is equal to or less than 10 μm. FIG. 30C illustrates a SEM picture in a case where the length of the bottom side of the pyramid is equal to or less than 15 μm.

In a case where the three types of textured structures illustrated in FIGS. 30A to 30C are formed on both of the surfaces, the protective film 8 is formed on the back surface, and thus it is possible to obtain an effect in that the insulating properties are improved. However, if the adhesion between the conductive adhesive and the circuit sheet is considered, it is more preferable that the textured structures (FIGS. 30A and 30B) in which the length of the bottom side of the pyramid is equal to or less than 10 μm are formed.

The photovoltaic device 400 is modularized by using the circuit sheet 70, similar to the photovoltaic device 10.

The photovoltaic device according to Embodiment 5 may be a photovoltaic device in which the semiconductor substrate 1 in the photovoltaic device 100, 200, and 300 is replaced with the semiconductor substrate 401.

Other descriptions in Embodiment 5 are the same as the descriptions in Embodiment 1.

In the above descriptions, a case where the semiconductor substrates 1 and 401 are formed from n-type monocrystalline silicon is described. However, in the embodiments of the invention, it is not limited thereto. The semiconductor substrates 1 and 401 may be formed from p-type monocrystalline silicon, and may be formed from n-type polycrystalline silicon or p-type polycrystalline silicon.

In a case where the semiconductor substrates 1 and 401 may be formed from p-type monocrystalline silicon or p-type polycrystalline silicon, a dielectric film (for example, oxide film of aluminum) having negative fixed charges is preferably used as the protective films 8 and 307. Thus, it is possible to apply an electric field to electrons which is the minority carriers, and to extend the lifetime of the minority carriers in the semiconductor substrates 1 and 401.

In a case where the semiconductor substrates 1 and 401 may be formed from n-type polycrystalline silicon or p-type polycrystalline silicon, in the semiconductor substrates 1 and 401, the light-receiving surface is processed to have a textured structure like a honeycomb texture, by using dry etching, or the light-receiving surface and the back surface are processed to have the textured structure by using the dry etching.

In the above-described photovoltaic devices 10, 100, 200, 300, and 400, the antireflection coats 2 and 201 may be not provided. Instead of the antireflection coats 2 and 201, an n+ layer in which n-type dopants having high concentration are diffused may be disposed on the light-receiving surface. The n+ layer may be disposed between the semiconductor substrates 1 and 401, and the antireflection coats 2 and 201.

In a case where the semiconductor substrates 1 and 401 have a p-type conductivity type, a p+ layer is used instead of the n+ layer.

Further, in the above descriptions, a case where the amorphous semiconductor layer is formed by a plasma CVD method is described. However, in the embodiments of the invention, it is not limited thereto. The amorphous semiconductor layer may be formed by a catalyst CVD (CatCVD) method.

In a case using a catalyst CVD (CatCVD) method, the film formation conditions are follows, for example: the substrate temperature: 100° C. to 300° C.; pressure: 10 to 500 Pa; a temperature of a catalyst medium (in a case using tungsten as the catalyst medium): 1500 to 2000° C.; and RF power density: 0.01 to 1 W/cm$^2$. Thus, it is possible to form an amorphous semiconductor layer having high quality, at a relative low temperature for a short period.

In Embodiment 1 to Embodiment 5 which are described above, the protective films 8, 106, and 307 including the insulating film are formed on both of the electrodes 6, 104, and 305 disposed on the n-type amorphous semiconductor layers 4, 101, and 303, and the electrodes 7, 105, and 306 disposed on the p-type amorphous semiconductor layers 5, 102, and 304, and on the gap region G, respectively. However, in the embodiments of the invention, it is not limited thereto. The protective film including the insulating film may be formed on at least one of the electrodes 6, 104, and 305, and the electrodes 7, 105, and 306, and on the gap region G. The reason is because, if the protective film including the insulating film is formed on at least one of the electrodes 6, 104, and 305, and the electrodes 7, 105, and 306, and on the gap region G, it is possible to obtain the effect described above, for example, the preventing for occurrence of an electrical short circuit and improvement of the moisture resistance. More preferably, the protective film is provided on both of the electrodes 6, 104, and 305, and the electrodes 7, 105, and 306, and on the gap region G.

Embodiment 6

Figure 31:
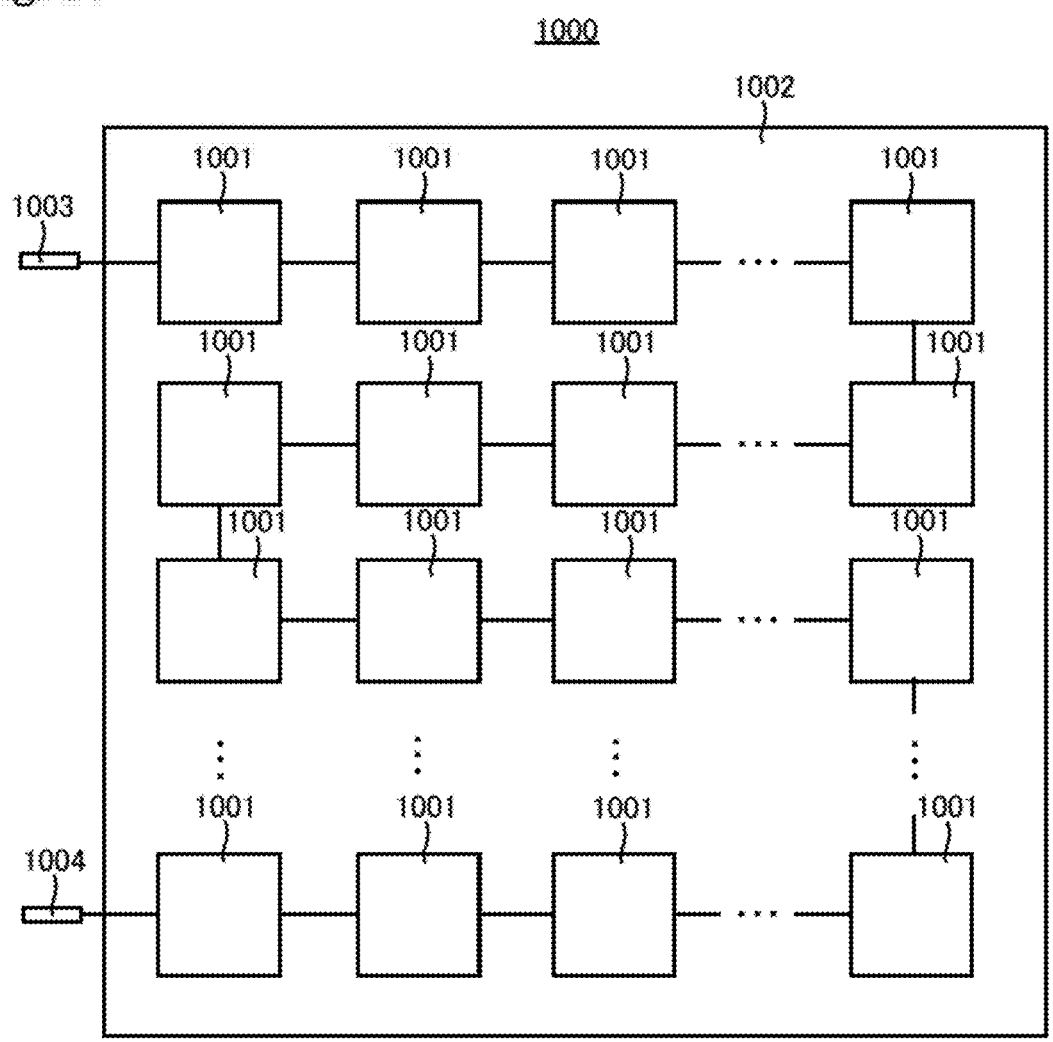
FIG. 31 is a schematic diagram illustrating a configuration of a photovoltaic module which includes the photovoltaic device according to the embodiment.

FIG. 31 is a schematic diagram illustrating a configuration of a photovoltaic module which includes the photovoltaic device according to the embodiment. With reference to FIG. 31, a photovoltaic module 1000 includes a plurality of photovoltaic devices 1001, a cover 1002, and output terminals 1003 and 1004.

The plurality of photovoltaic devices 1001 is disposed to have an array shape, and is connected in series. The plurality of photovoltaic devices 1001 may be connected in parallel, instead of being connected in series, and may be connected in combination of being in series and parallel.

Each of the plurality of photovoltaic devices 1001 is configured from any of the photovoltaic devices 10, 100, 200, 300, and 400.

The cover 1002 is formed from a cover having weather resistance, and covers the plurality of photovoltaic devices 1001. The cover 1002 includes, for example, a transparent substrate (for example, glass and the like) provided on the light-receiving surface side of the photovoltaic device 1001, a back surface substrate (for example, glass, resin sheet, and the like) provided on the back surface side which is opposite to the light-receiving surface side of the photovoltaic device 1001, and a sealing material (for example, EVA and the like) with which a gap between the transparent substrate and the back surface substrate is filled.

The output terminal 1003 is connected to the photovoltaic device 1001 disposed at one end of the plurality of photovoltaic devices 1001 which are connected in series.

The output terminal 1004 is connected to the photovoltaic device 1001 disposed at another end of the plurality of photovoltaic devices 1001 which are connected in series.

As described above, the photovoltaic devices 10, 100, 200, 300, and 400 are excellent in insulating properties, moisture resistance, and thermal resistance.

Thus, it is possible to improve the insulating properties, the moisture resistance, and the thermal resistance of the photovoltaic module 1000.

The number of photovoltaic devices 1001 included in the photovoltaic module 1000 is an integer of two or more.

The photovoltaic module according to Embodiment 6 is not limited to having the configuration illustrated in FIG. 31, and may have any configuration as long as any of the photovoltaic devices 10, 100, 200, 300, and 400 is used.

Embodiment 7

Figure 32:
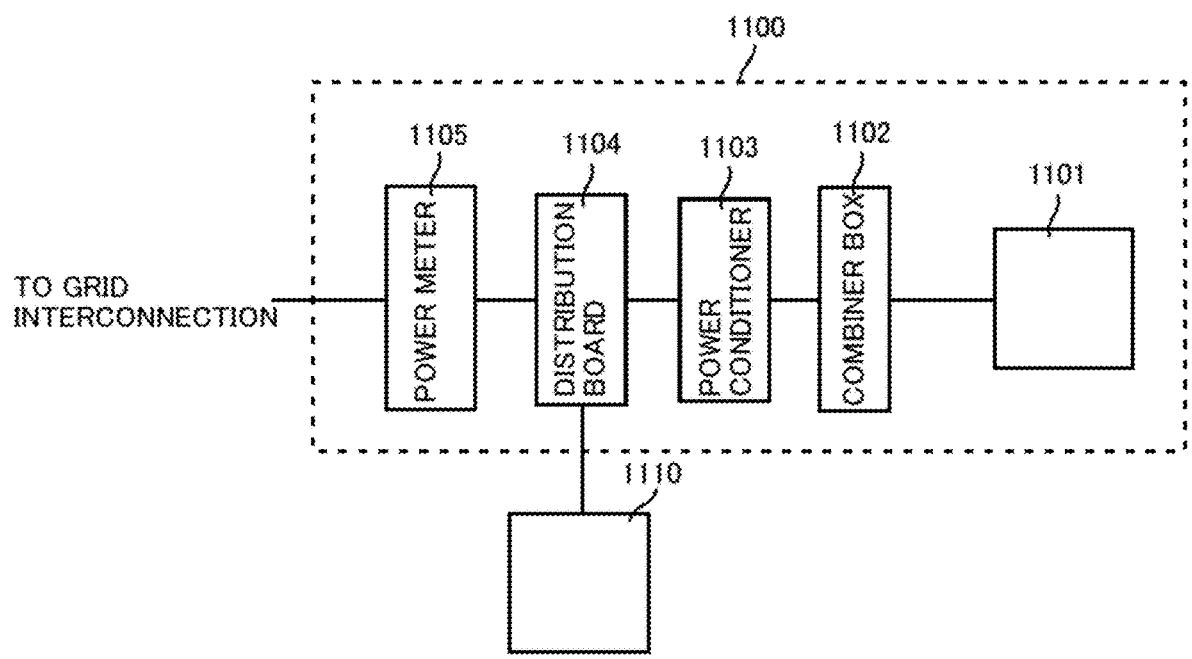
FIG. 32 is a schematic diagram illustrating a configuration of a solar power generation system which includes the photovoltaic device according to the embodiment.

FIG. 32 is a schematic diagram illustrating a configuration of a solar power generation system which includes the photovoltaic device according to the embodiment.

With reference to FIG. 32, a solar power generation system 1100 includes a photovoltaic module array 1101, a combiner box 1102, a power conditioner 1103, a distribution board 1104, and a power meter 1105.

The combiner box 1102 is connected to the photovoltaic module array 1101. The power conditioner 1103 is connected to the combiner box 1102. The distribution board 1104 is connected to the power conditioner 1103 and an electrical equipment 1110. The power meter 1105 is connected to the distribution board 1104 and grid interconnection.

The photovoltaic module array 1101 converts solar light into electricity so as to generate DC power, and supplies the generated DC power to the combiner box 1102.

The combiner box 1102 receives DC power generated by the photovoltaic module array 1101, and supplies the received DC power to the power conditioner 1103.

The power conditioner 1103 converts the DC power received from the combiner box 1102 into AC power, and supplies the converted AC power to the distribution board 1104.

The distribution board 1104 supplies AC power received from the power conditioner 1103 and/or commercial power received through the power meter 1105, to the electrical equipment 1110. The distribution board 1104 supplies extra AC power to the grid interconnection through the power meter 1105 when the AC power received from the power conditioner 1103 is larger than consumed power of the electrical equipment 1110.

The power meter 1105 measures power in a direction from the grid interconnection to the distribution board 1104, and measures power in a direction from the distribution board 1104 to the grid interconnection.

Figure 33:
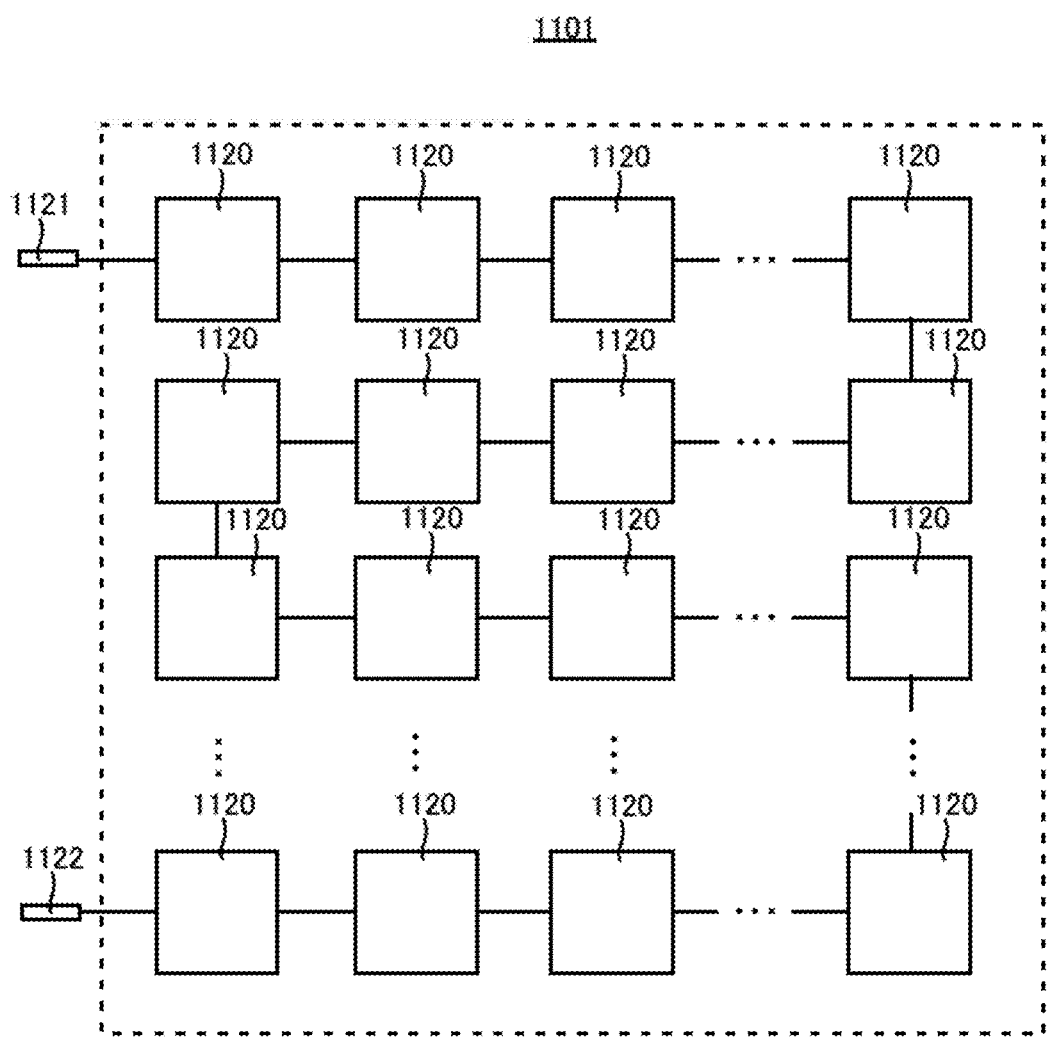
FIG. 33 is a schematic diagram illustrating a configuration of a photovoltaic module array illustrated in FIG. 32.

FIG. 33 is a schematic diagram illustrating a photovoltaic module array 1101 illustrated in FIG. 32.

With reference to FIG. 33, the photovoltaic module array 1101 includes a plurality of photovoltaic modules 1120, and output terminals 1121 and 1122.

The plurality of photovoltaic modules 1120 is arranged to have an array shape, and is connected in series. The plurality of photovoltaic modules 1120 may be connected in parallel, instead of being connected in series, and may be connected in combination of being in series and parallel. Each of the plurality of photovoltaic modules 1120 is configured from the photovoltaic module 1000 illustrated in FIG. 31.

The output terminal 1121 is connected to the photovoltaic module 1120 positioned at one end of the plurality of photovoltaic modules 1120 which are connected in series.

The output terminal 1122 is connected to the photovoltaic module 1120 positioned at another end of the plurality of photovoltaic modules 1120 which are connected in series.

The number of photovoltaic modules 1120 included in the photovoltaic module array 1101 is an integer of two or more.

An operation in the solar power generation system 1100 will be described. The photovoltaic module array 1101 converts solar light into electricity so as to generate DC power, and supplies the generated DC power to the power conditioner 1103 through the combiner box 1102.

The power conditioner 1103 converts the DC power received from the photovoltaic module array 1101 into AC power, and supplies the converted AC power to the distribution board 1104.

The distribution board 1104 supplies AC power received from the power conditioner 1103, to the electrical equipment 1110 when the AC power received from the power conditioner 1103 is equal to or larger than consumed power of the electrical equipment 1110. The distribution board 1104 supplies extra AC power to the grid interconnection through the power meter 1105.

When the AC power received from the power conditioner 1103 is smaller than consumed power of the electrical equipment 1110, the distribution board 1104 supplies AC power received from the grid interconnection and AC power received from the power conditioner 1103, to the electrical equipment 1110.

As described above, the solar power generation system 1100 includes any of the photovoltaic devices 10, 100, 200, 300, and 400 which are excellent in insulating properties, moisture resistance, and thermal resistance.

Thus, it is possible to improve the insulating properties, the moisture resistance, and the thermal resistance of the solar power generation system 1100.

Figure 34:
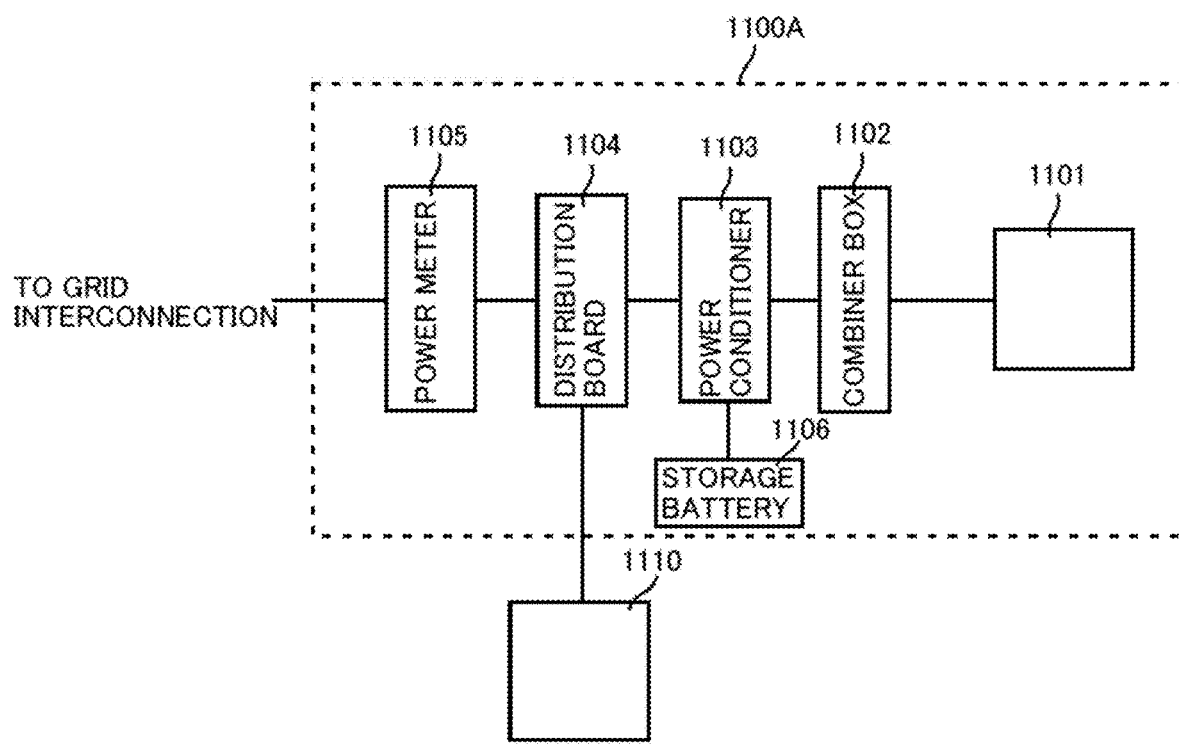
FIG. 34 is a schematic diagram illustrating a configuration of another solar power generation system which includes the photovoltaic device according to the embodiment.

FIG. 34 is a schematic diagram illustrating a configuration of another solar power generation system which includes the photovoltaic device according to the embodiment.

A solar power generation system including the photovoltaic device according to this embodiment may be a solar power generation system 1100A illustrated in FIG. 34.

With reference to FIG. 34, in the solar power generation system 1100A, a storage battery 1106 is added to the solar power generation system 1100 illustrated in FIG. 32. Other components are the same as those of the solar power generation system 1100.

The storage battery 1106 is connected to the power conditioner 1103.

In the solar power generation system 1100A, the power conditioner 1103 appropriately converts a portion or the entirety of DC power received from the combiner box 1102, and stores the converted power in the storage battery 1106.

Otherwise, the power conditioner 1103 performs the same operation as that in the solar power generation system 1100.

The storage battery 1106 stores DC power received from the power conditioner 1103. The storage battery 1106 appropriately supplies the stored power to the power conditioner 1103, in accordance with the status of the amount of generated power in the photovoltaic module array 1101 and/or the amount of consumed power in the electrical equipment 1110.

As described above, since the solar power generation system 1100A includes the storage battery 1106, it is possible to suppress output fluctuation occurring by changing the amount of sunshine. In addition, even in a time zone in which there is no sunshine, it is possible to supply power stored in the storage battery 1106, to the electrical equipment 1110.

The storage battery 1106 may be mounted in the power conditioner 1103.

The solar power generation system according to Embodiment 7 is not limited to having the configuration illustrated in FIGS. 32 and 33, or the configuration illustrated in FIGS. 33 and 34. The solar power generation system may have any configuration as long as any of the photovoltaic devices 10, 100, 200, 300, and 400 is used.

Embodiment 8

Figure 35:
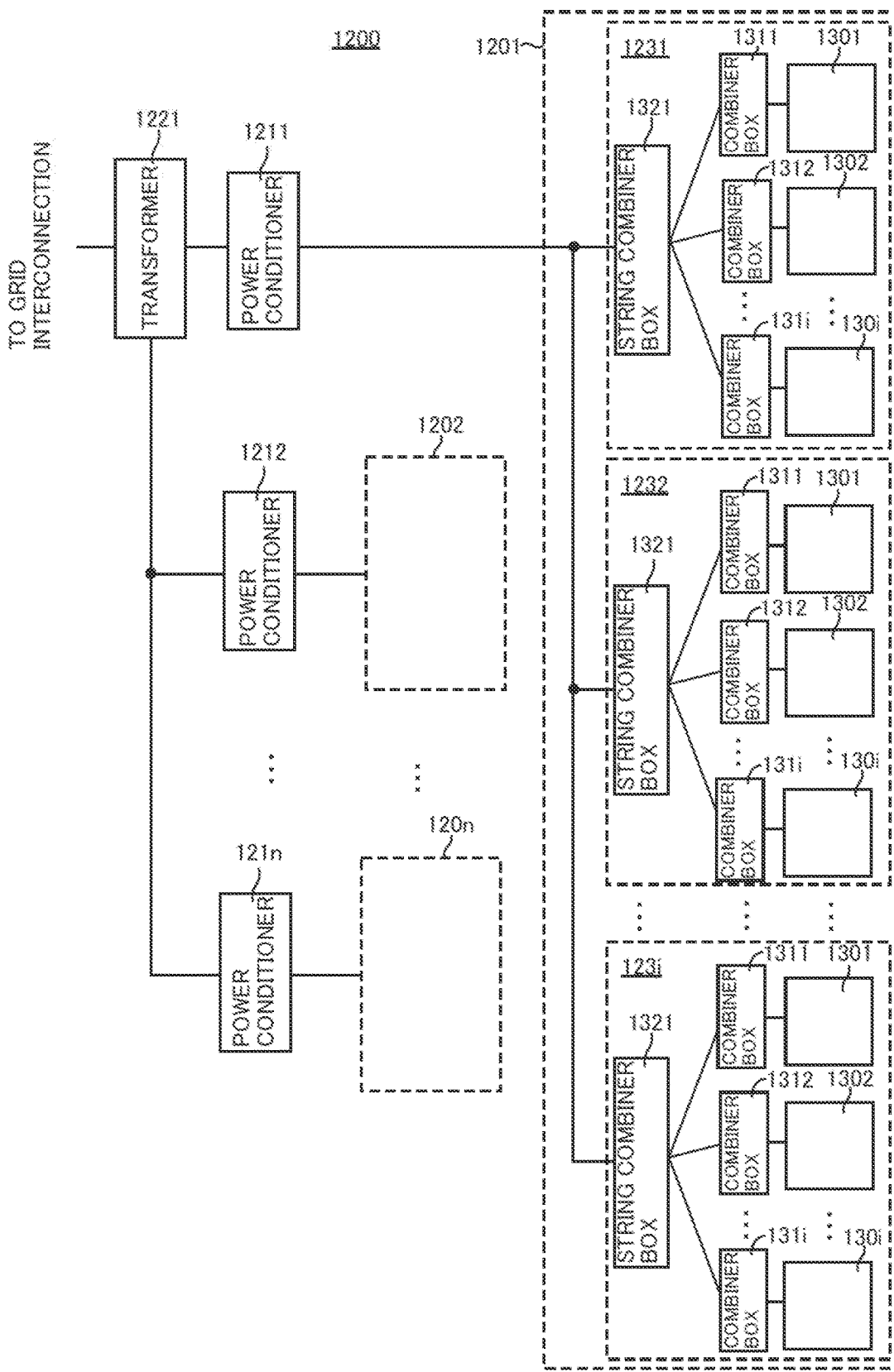
FIG. 35 is a schematic diagram illustrating a configuration of a solar power generation system which includes the photovoltaic device according to the embodiment.

FIG. 35 is a schematic diagram illustrating a configuration of a solar power generation system which includes the photovoltaic device according to the embodiment.

With reference to FIG. 35, a solar power generation system 1200 includes sub-systems 1201 to 120n (n is an integer of two or more), power conditioners 1211 to 121n, and a transformer 1221. The solar power generation system 1200 is a solar power generation system having a size larger than that of the solar power generation systems 1100 and 1100A illustrated in FIGS. 32 and 34.

The power conditioners 1211 to 121n are connected to the sub-systems 1201 to 120n, respectively.

The transformer 1221 is connected to the power conditioners 1211 to 121n and the grid interconnection.

Each of the sub-systems 1201 to 120n is configured from module systems 1231 to 123j (j is an integer of two or more).

Each of the module systems 1231 to 123j includes photovoltaic module arrays 1301 to 130i (i is an integer of two or more), combiner boxes 1311 to 131i, and a string combiner box 1321.

Each of the photovoltaic module arrays 1301 to 130i is configured from the same configuration as that of the photovoltaic module array 1101 illustrated in FIG. 33.

The combiner boxes 1311 to 131i are connected to the photovoltaic module arrays 1301 to 130i, respectively.

The string combiner box 1321 is connected to the combiner boxes 1311 to 131i. The j pieces of string combiner boxes 1321 in the sub-system 1201 are connected to the power conditioner 1211. The j pieces of string combiner boxes 1321 in the sub-system 1202 are connected to the power conditioner 1212. After that, the j pieces of string combiner box 1321 in the sub-system 120n are connected to the power conditioner 121n in a similar manner.

The i pieces of photovoltaic module arrays 1301 to 130i in the module system 1231 convert solar light into electricity so as to generate DC power, and respectively supply the generated DC power to the string combiner box 1321 through the combiner boxes 1311 to 131i. The i pieces of photovoltaic module arrays 1301 to 130i in the module system 1232 convert solar light into electricity so as to generate DC power, and respectively supply the generated DC power to the string combiner box 1321 through the combiner boxes 1311 to 131i. After that, the i pieces of photovoltaic module arrays 1301 to 130i in the module system 123j convert solar light into electricity so as to generate DC power, and respectively supply the generated DC power to the string combiner box 1321 through the combiner boxes 1311 to 131i, in a similar manner.

The j pieces of string combiner boxes 1321 in the sub-system 1201 supply DC power to the power conditioner 1211.

The j pieces of string combiner boxes 1321 in the sub-system 1202 supply DC power to the power conditioner 1212 in a similar manner.

After that, the j pieces of string combiner boxes 1321 in the sub-system 120n supply DC power to the power conditioner 121n.

The power conditioners 1211 to 121n convert DC power which has been respectively received from the sub-system 1201 to 120n, into AC power, and supply the converted AC power to the transformer 1221.

The transformer 1221 receives AC power from the power conditioner 1211 to 121n, converts a voltage level of the received AC power, and supplies power having the converted voltage level to the grid interconnection.

As described above, the solar power generation system 1200 includes any of the photovoltaic devices 10, 100, 200, 300, and 400 which are excellent in insulating properties, moisture resistance, and thermal resistance.

Thus, it is possible to improve the insulating properties, the moisture resistance, and the thermal resistance of the solar power generation system 1200.

Figure 36:
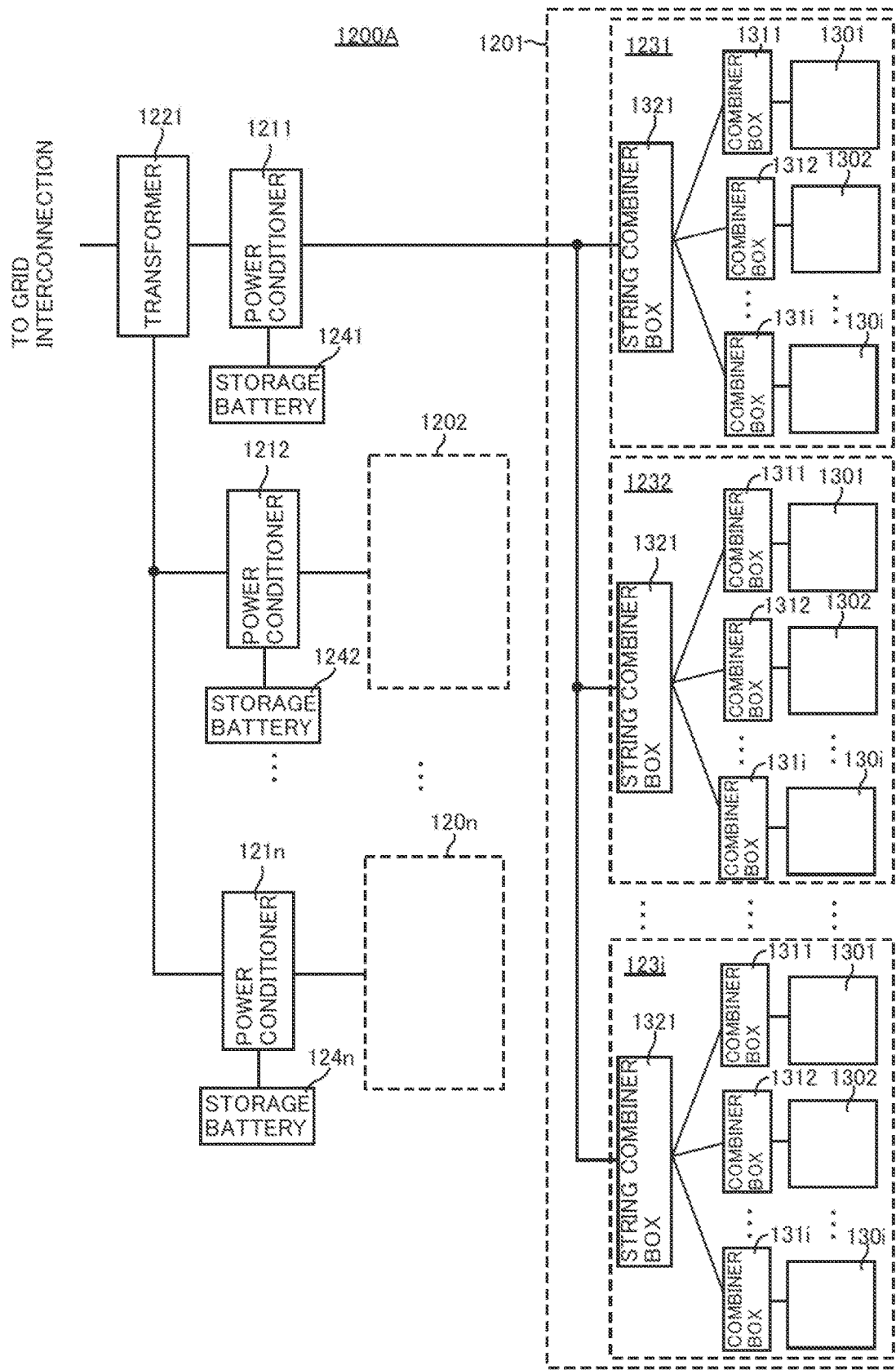
FIG. 36 is a schematic diagram illustrating a configuration of another solar power generation system which includes the photovoltaic device according to the embodiment.
Figure 37:
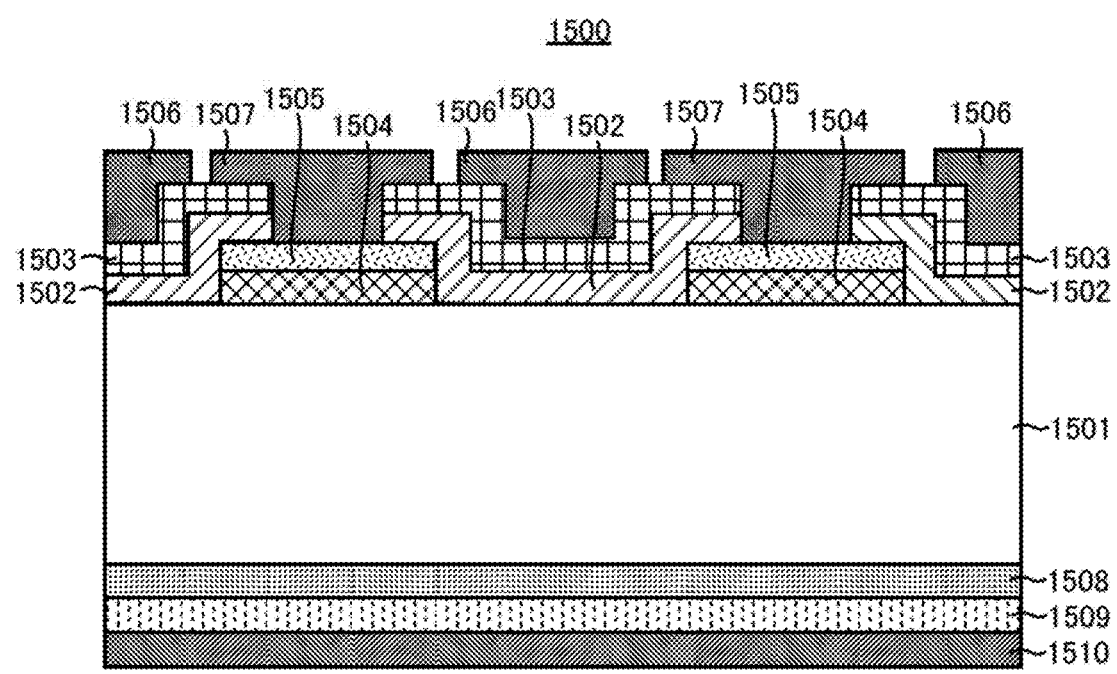
FIG. 37 is a sectional view illustrating a heterojunction solar cell described in the pamphlet of PCT international Publication No. WO2013/133005.

FIG. 36 is a schematic diagram illustrating a configuration of another solar power generation system which includes the photovoltaic device according to the embodiment.

A solar power generation system including the photovoltaic device according to this embodiment may be a solar power generation system 1200A illustrated in FIG. 36.

With reference to FIG. 36, in the solar power generation system 1200A, storage batteries 1241 to 124n are added to the solar power generation system 1200 illustrated in FIG. 35. Other components are the same as those of the solar power generation system 1200.

The storage batteries 1241 to 124n are connected to the power conditioners 1211 to 121n, respectively.

In the solar power generation system 1200A, the power conditioners 1211 to 121n convert DC power which has been respectively received from the sub-systems 1201 to 120n, into AC power, and supply the converted AC power to the transformer 1221. The power conditioners 1211 to 121n appropriately converts DC power received from the sub-systems 1201 to 120n, and store the converted DC power in the storage batteries 1241 to 124n, respectively.

The storage batteries 1241 to 124n respectively supply the stored power to the power conditioner 1211 to 121n, in accordance with the amount of DC power from the sub-system 1201 to 120n.

As describe above, since the solar power generation system 1200A includes the storage batteries 1241 to 124n, it is possible to suppress output fluctuation occurring by changing the amount of sunshine. In addition, even in a time zone in which there is no sunshine, it is possible to supply power stored in the storage batteries 1241 to 124n, to the transformer 1221.

The storage batteries 1241 to 124n may be mounted in the power conditioners 1211 to 121n, respectively.

The solar power generation system according to Embodiment 8 is not limited to having the configuration illustrated in FIGS. 35 and 36. The solar power generation system may have any configuration as long as any of the photovoltaic devices 10, 100, 200, 300, and 400 is used.

Further, in Embodiment 8, all photovoltaic devices included in the solar power generation system 1200 or 1200A are not necessarily the photovoltaic devices 10, 100, 200, 300, and 400 according to Embodiment 1 to Embodiment 5.

For example, it is assumed that all photovoltaic devices included in a certain sub-system (any of the sub-systems 1201 to 120n) may be any of the photovoltaic devices 10, 100, 200, 300, and 400 according to Embodiment 1 to Embodiment 5, and some or all of photovoltaic devices included in another sub-system (any of the sub-systems 1201 to 120n) may be a photovoltaic device other than the photovoltaic devices 10, 100, 200, 300, and 400.

It should be considered that the embodiments described in this specification are examples and are not limited in all points. The range of the invention is indicated by the scope of the claims, not the descriptions of the above embodiments, and it is intended that changes in the meanings and the scope which are equivalent to the scope of the claims are included.

INDUSTRIAL APPLICABILITY

The invention is applied to a photovoltaic device, a photovoltaic module, and a solar power generation system which use the photovoltaic device.

The invention claimed is:
1. A photovoltaic device comprising:
a monocrystalline silicon substrate;
a first amorphous semiconductor layer on a surface of the monocrystalline silicon substrate and having a first conductivity type;
a second amorphous semiconductor layer on the surface of the monocrystalline silicon substrate adjacent to and spaced apart from the first amorphous semiconductor layer and having a second conductivity type opposite to the first conductivity type;
a first electrode on the first amorphous semiconductor layer; and
a second electrode on the second amorphous semiconductor layer and spaced apart from the first electrode;
wherein the first amorphous semiconductor layer includes a first flat region and a first thickness decreasing region adjoining the first flat region in a first direction which is a width direction of the first amorphous semiconductor layer, the first flat region is a region which has the thickest film thickness in a direction perpendicular to the first direction of the first amorphous semiconductor layer, the first thickness decreasing region extending from the first flat region to a point of the first amorphous semiconductor layer at which a decrease rate of a thickness of the first amorphous semiconductor layer is changed from a first decrease rate to a second decrease rate greater than the first decrease rate,
wherein the first thickness decreasing region is, along the first direction, disposed on both sides of the first flat region, and
wherein the first electrode is disposed on the first flat region and on the first thickness decreasing region which is disposed on the both sides of the first flat region along the first direction.

2. The photovoltaic device according to claim 1, wherein dopant concentration of the first thickness decreasing region is higher than dopant concentration of the first flat region.

3. The photovoltaic device according to claim 2, wherein the monocrystalline silicon substrate has the second conductivity type.

4. The photovoltaic device according to claim 1, wherein the second amorphous semiconductor layer includes a second flat region and a second thickness decreasing region adjoining the second flat region in a second direction which is a width direction of the second amorphous semiconductor layer, the second flat region is a region which has the thickest film thickness in a direction perpendicular to the second direction of the second amorphous semiconductor layer, the second thickness decreasing region is a region which has a film thickness smaller than the thickest film thickness of the second flat region.

5. The photovoltaic device according to claim 4, wherein dopant concentration of the second thickness decreasing region is higher than dopant concentration of the second flat region.

6. The photovoltaic device according to claim 4, wherein the second electrode is disposed on the second thickness decreasing region and the second flat region.

\* \* \* \* \*

UNITED STATES PATENT AND TRADEMARK OFFICE
CERTIFICATE OF CORRECTION

Page 1 of 1

PATENT NO. : 11,316,061 B2
APPLICATION NO. : 17/071647
DATED : April 26, 2022
INVENTOR(S) : Takeshi Kamikawa et al.

It is certified that error appears in the above-identified patent and that said Letters Patent is hereby corrected as shown below:

On the Title Page

Insert:
--(30) Foreign Application Priority Data
Oct. 31, 2014(JP)............ 2014-222945--

Signed and Sealed this
Twenty-sixth Day of July, 2022

Katherine Kelly Vidal
*Director of the United States Patent and Trademark Office*